US011929365B2

United States Patent
Umeki

(10) Patent No.: US 11,929,365 B2
(45) Date of Patent: Mar. 12, 2024

(54) SEMICONDUCTOR DEVICE

(71) Applicant: ROHM CO., LTD., Kyoto (JP)

(72) Inventor: Shinya Umeki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 511 days.

(21) Appl. No.: 17/285,769

(22) PCT Filed: Oct. 17, 2019

(86) PCT No.: PCT/JP2019/040942
§ 371 (c)(1),
(2) Date: Apr. 15, 2021

(87) PCT Pub. No.: WO2020/080476
PCT Pub. Date: Apr. 23, 2020

(65) Prior Publication Data
US 2021/0384190 A1    Dec. 9, 2021

(30) Foreign Application Priority Data
Oct. 18, 2018    (JP) ................................. 2018-196511

(51) Int. Cl.
*H01L 27/06*    (2006.01)
*H01L 21/765*    (2006.01)
(Continued)

(52) U.S. Cl.
CPC ........ *H01L 27/0664* (2013.01); *H01L 21/765* (2013.01); *H01L 29/1095* (2013.01);
(Continued)

(58) Field of Classification Search
CPC ...... H01L 27/0647–067; H01L 29/0607–0638
See application file for complete search history.

(56) References Cited

U.S. PATENT DOCUMENTS

2010/0090248 A1    4/2010    Kouno
2016/0351561 A1   12/2016    Senoo
(Continued)

FOREIGN PATENT DOCUMENTS

| JP | 2010118642 | 5/2010 |
| JP | 2014090057 | 5/2014 |

(Continued)

OTHER PUBLICATIONS

International Preliminary Report on Patentability issued for International Patent Application No. PCT/JP2019/040942, dated Apr. 29, 2021, 15 pages including English translation.
(Continued)

*Primary Examiner* — Amar Movva
(74) *Attorney, Agent, or Firm* — XSENSUS LLP

(57) ABSTRACT

A semiconductor device includes a semiconductor layer that has a first main surface at one side and a second main surface at another side and includes an active region, a plurality of IGBT regions that are formed in the active region, and a plurality of diode regions that are formed in the active region such as to be adjacent to the plurality of IGBT regions, and where when a total extension of boundary lines between the plurality of IGBT regions and the plurality of diode regions is represented by L, a total area of the plurality of diode regions is represented by SD, and a dispersion degree of the plurality of diode regions with respect to the active region is defined by a formula $\log_e (L^2/SD)$, the dispersion degree is not less than 2 and not more than 15.

20 Claims, 44 Drawing Sheets

(51) Int. Cl.
    *H01L 29/10*     (2006.01)
    *H01L 29/40*     (2006.01)
    *H01L 29/66*     (2006.01)
    *H01L 29/739*     (2006.01)
    *H01L 29/861*     (2006.01)

(52) U.S. Cl.
    CPC ...... *H01L 29/407* (2013.01); *H01L 29/66136* (2013.01); *H01L 29/66348* (2013.01); *H01L 29/7397* (2013.01); *H01L 29/8613* (2013.01)

(56) References Cited

U.S. PATENT DOCUMENTS

| | | |
|---|---|---|
| 2018/0261594 A1 | 9/2018 | Yamano et al. |
| 2019/0252534 A1 | 8/2019 | Murakawa et al. |

FOREIGN PATENT DOCUMENTS

| | | |
|---|---|---|
| JP | 2016225345 | 12/2016 |
| JP | 2018073911 | 5/2018 |
| JP | 2018152426 | 9/2018 |
| JP | 2018157043 | 10/2018 |
| WO | 2019078166 | 4/2019 |

OTHER PUBLICATIONS

First Office Action issued for Chinese Patent Application No. 201980067998.8, dated Apr. 28, 2023, 9 pages including partial English machine translation.

Kamibaba, R. et al., "Low Injection Anode as Positive Spiral Improvement for 650V RC-IGBT," Proceedings of the 30th International Symposium on Power Semiconductor Devices & ICs, Chicago, USA, May 13-17, 2018, pp. 160-163.

International Search Report and Written Opinion issued for International Patent Application No. PCT/JP2019/040942, dated Dec. 3, 2019, 10 pages including English translation of Search Report.

Notice of Reasons for Refusal issued for Japanese Patent Application No. 2020-553299, Dispatch Date: Mar. 30, 2023, 5 pages including English machine translation.

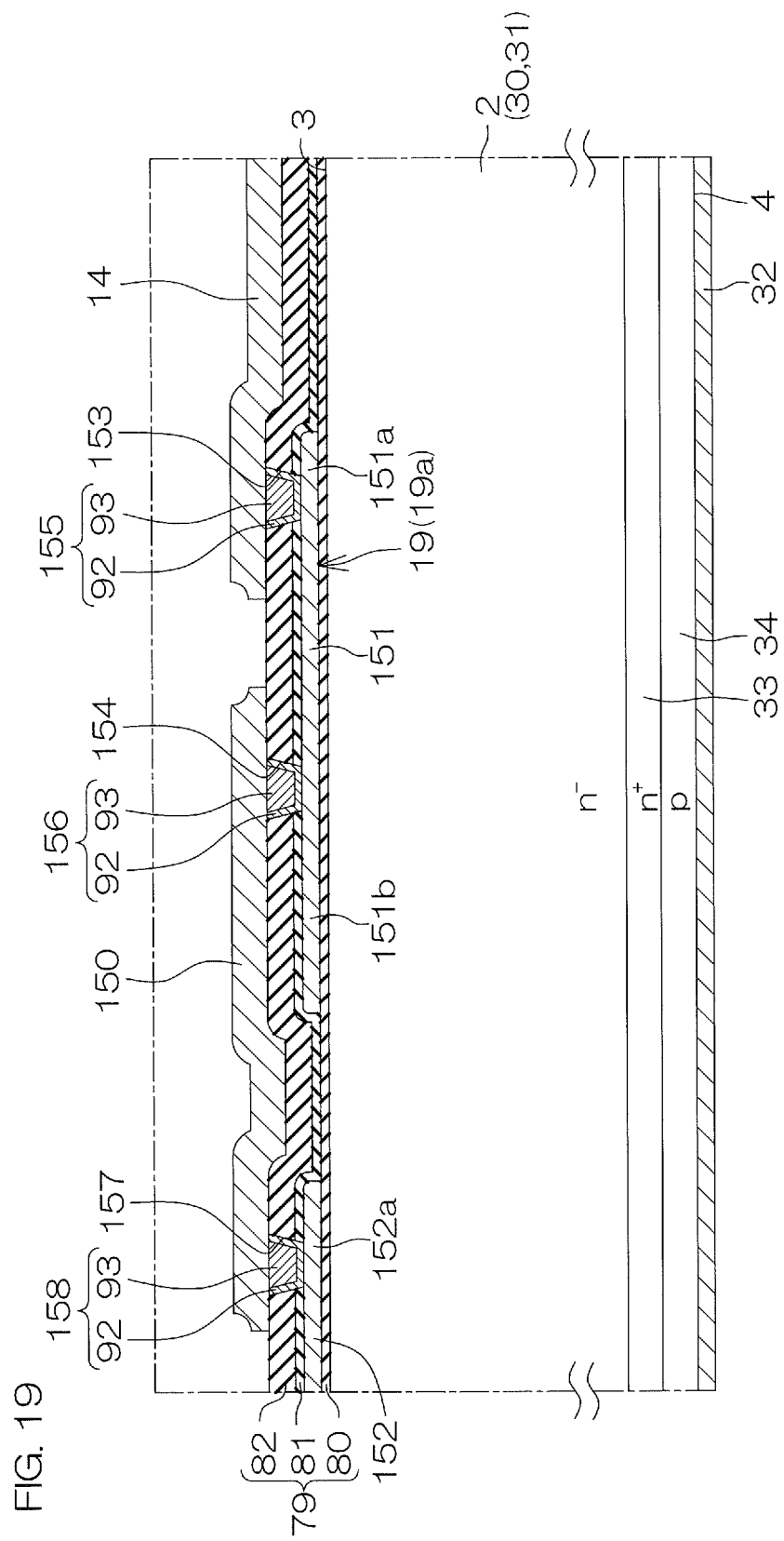

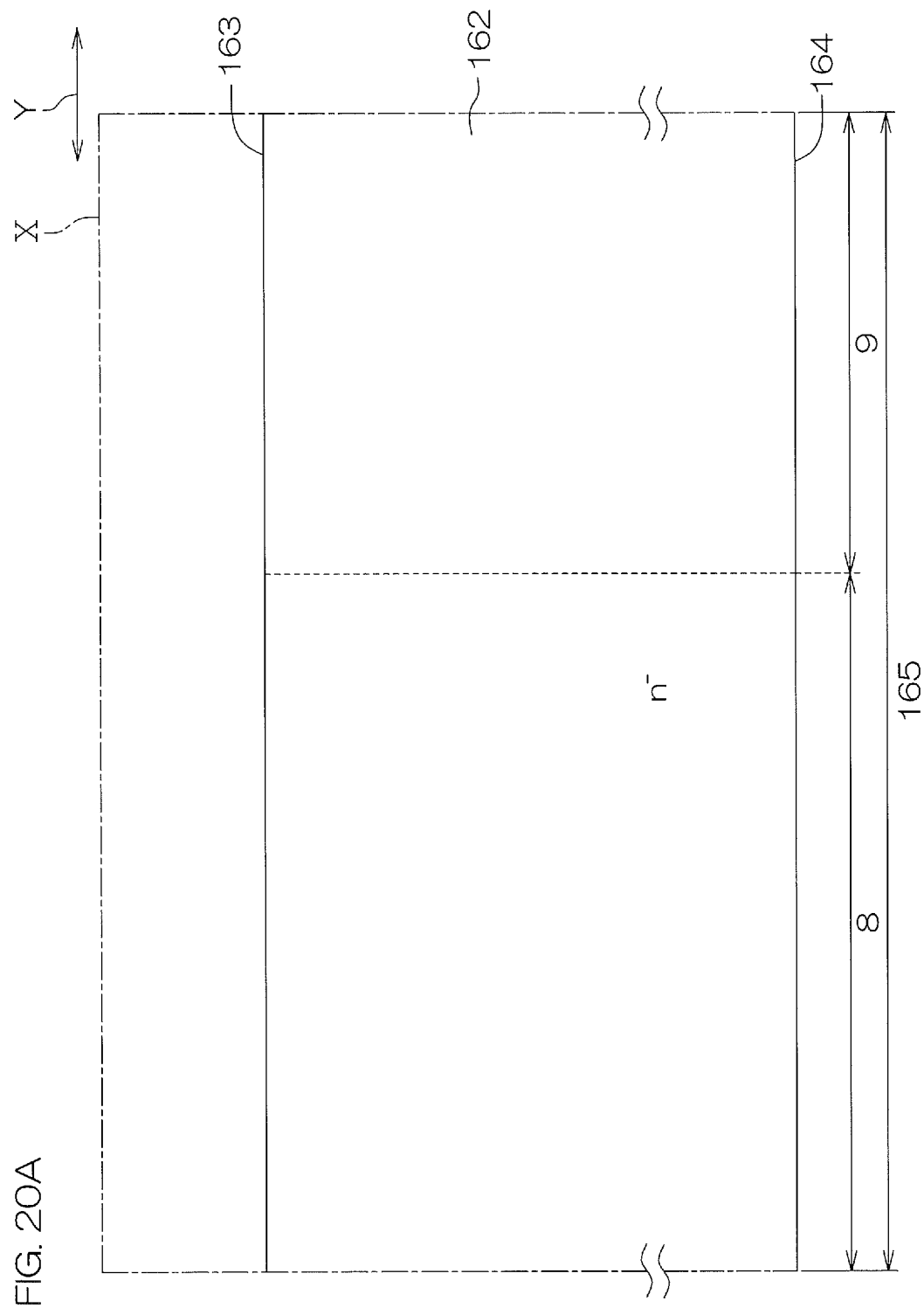

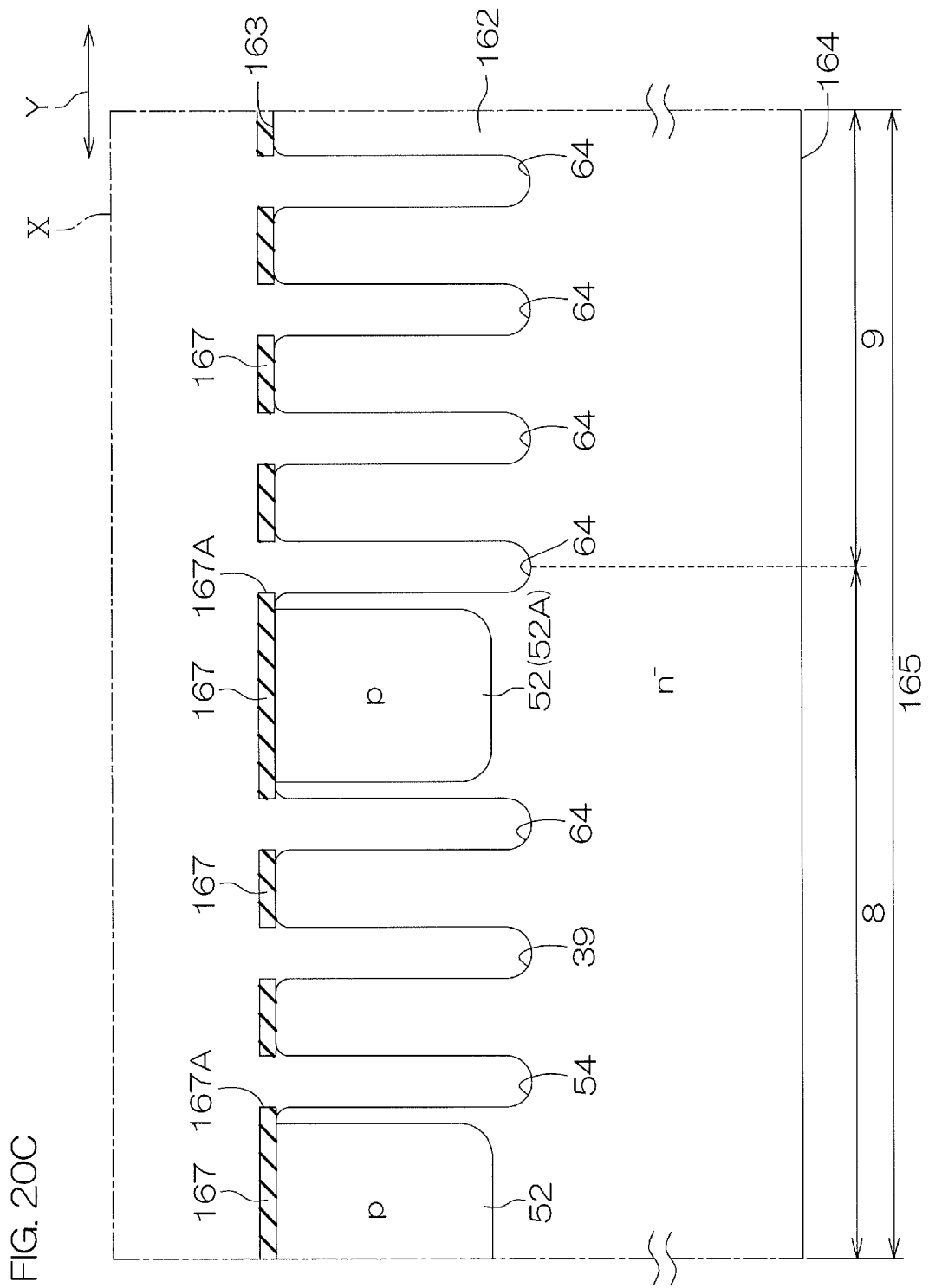

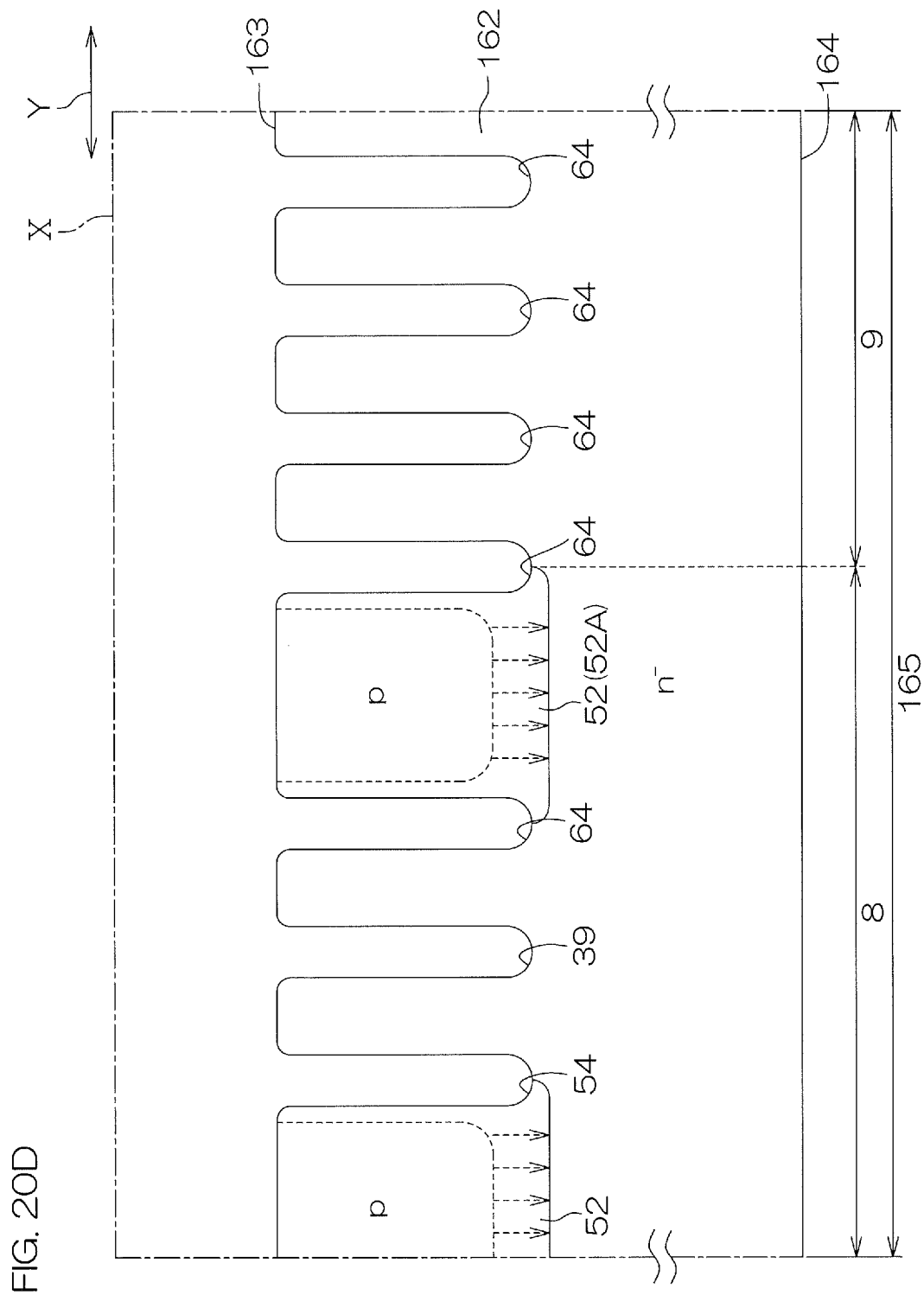

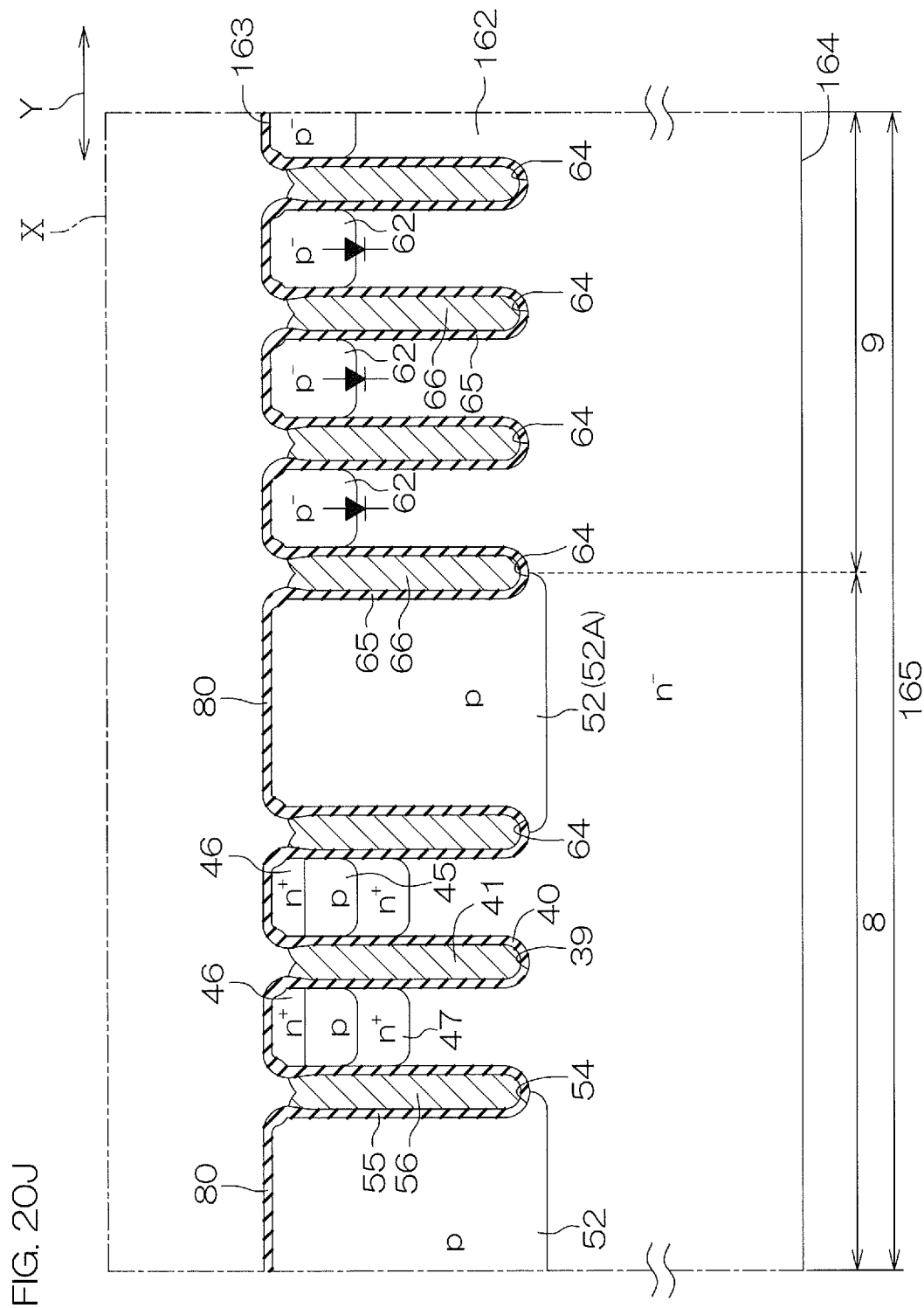

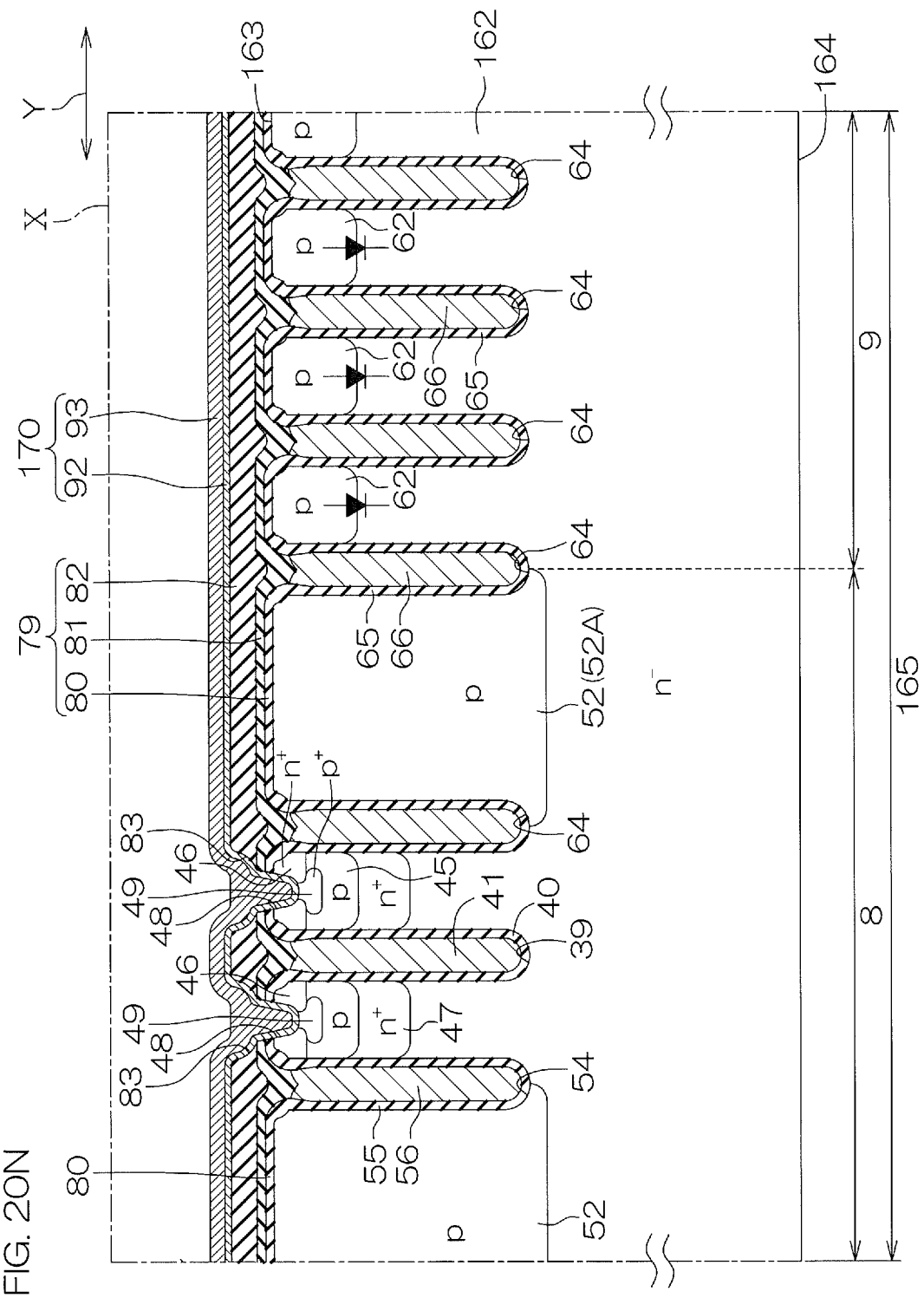

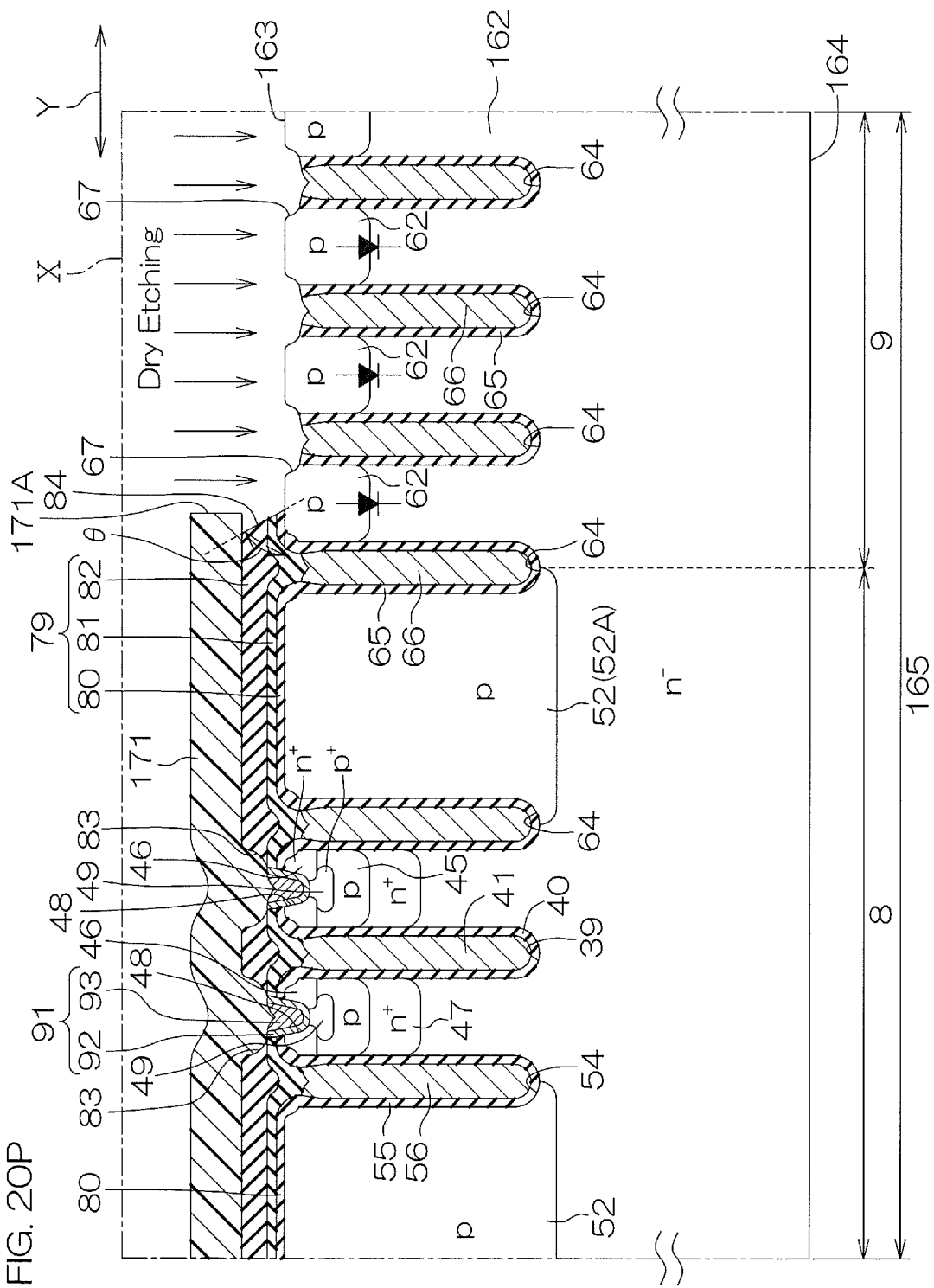

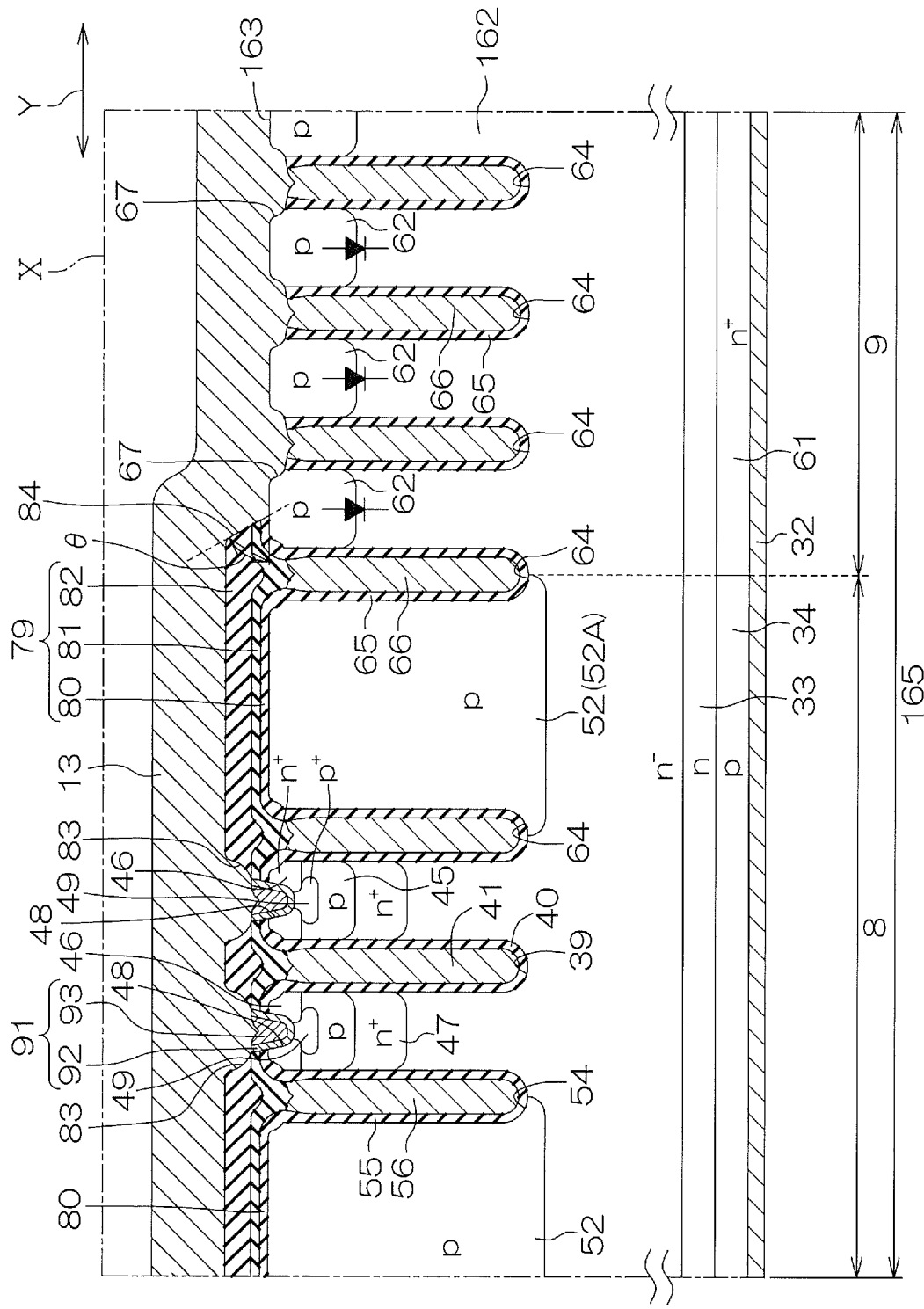

SEMICONDUCTOR DEVICE

TECHNICAL FIELD

The present invention relates to a semiconductor device that includes an IGBT region and a diode region.

BACKGROUND ART

Patent Literature 1 discloses an RC-IGBT (reverse conducting-insulated gate bipolar transistor) as an example of a semiconductor device. The RC-IGBT includes an IGBT region and a diode region formed in a semiconductor layer in common. The IGBT region includes an IGBT. The diode region includes a diode.

CITATION LIST

Patent Literature

Patent Literature 1: Japanese Patent Application Publication No. 2010-118642

SUMMARY OF INVENTION

Technical Problem

With the semiconductor device that includes the IGBT region and the diode region, there is a problem that a forward voltage VF of the diode changes before and after application of a bias voltage to the IGBT. This is due to an inflow amount of carriers from the IGBT region to the diode region changing before and after the application of the bias voltage to the IGBT.

Forming of the diode region at just one location can be considered to solve this problem. Inflow paths for carriers can thereby be restricted and therefore change in the forward voltage VF of the diode can be suppressed. However, in this case, breakdown tolerance decreases due to current concentration (overcurrent) at the diode region.

A preferred embodiment of the present invention provides a semiconductor device with which improvement of breakdown tolerance can be achieved while suppressing change in a forward voltage VF of a diode before and after application of a bias voltage to an IGBT.

Solution to Problem

A preferred embodiment of the present invention provides a semiconductor device including a semiconductor layer that has a first main surface at one side and a second main surface at another side and includes an active region, a plurality of IGBT regions that are formed in the active region, and a plurality of diode regions that are formed in the active region such as to be adjacent to the plurality of IGBT regions, and wherein when a total extension of boundary lines between the plurality of IGBT regions and the plurality of diode regions is represented by L, a total area of the plurality of diode regions is represented by SD, and a dispersion degree of the plurality of diode regions with respect to the active region is defined by a formula $\mathrm{Log}_e(L^2/SD)$, the dispersion degree is not less than 2 and not more than 15.

According to this semiconductor device, improvement of breakdown tolerance can be achieved while suppressing change in a forward voltage VF of a diode before and after application of a bias voltage to an IGBT.

The aforementioned as well as yet other objects, features, and effects of the present invention will be made clear by the following description of the preferred embodiments, with reference to the accompanying drawings.

BRIEF DESCRIPTION OF DRAWINGS

FIG. 19 is a sectional view taken along line XIX-XIX shown in FIG. 18.

FIG. 20A is a sectional view of a region corresponding to FIG. 10 and is a sectional view for describing an example of a manufacturing method for the semiconductor device shown in FIG. 1.

FIG. 20C is a sectional view of a step after that of FIG. 20B.

FIG. 20D is a sectional view of a step after that of FIG. 20C.

FIG. 20J is a sectional view of a step after that of FIG. 20I.

FIG. 20N is a sectional view of a step after that of FIG. 20M.

FIG. 20P is a sectional view of a step after that of FIG. 20O.

FIG. 20T is a sectional view of a step after that of FIG. 20S.

DESCRIPTION OF EMBODIMENTS

Figure 1:
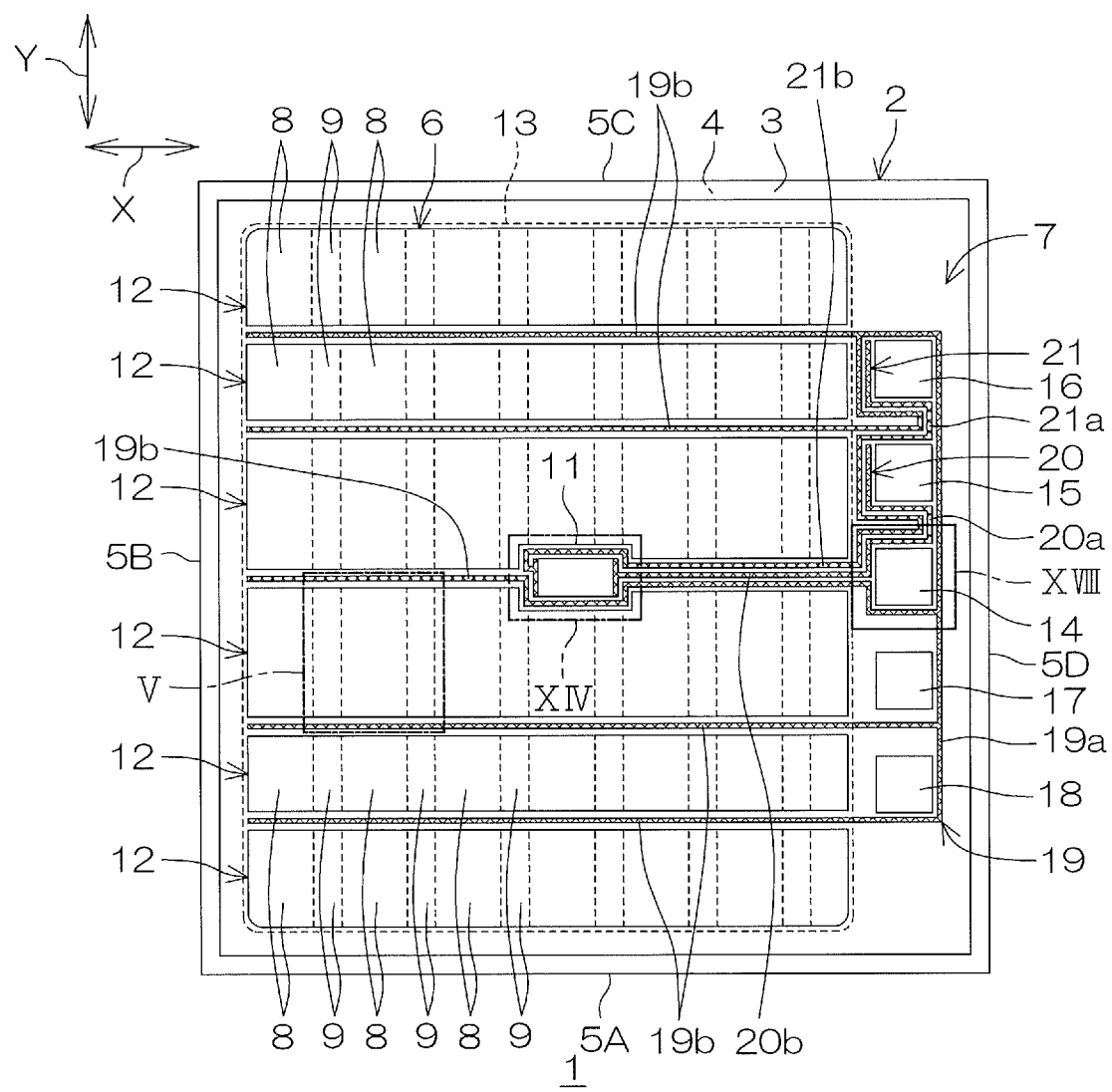
FIG. 1 is a plan view of a semiconductor device according to a first preferred embodiment of the present invention.
Figure 2:
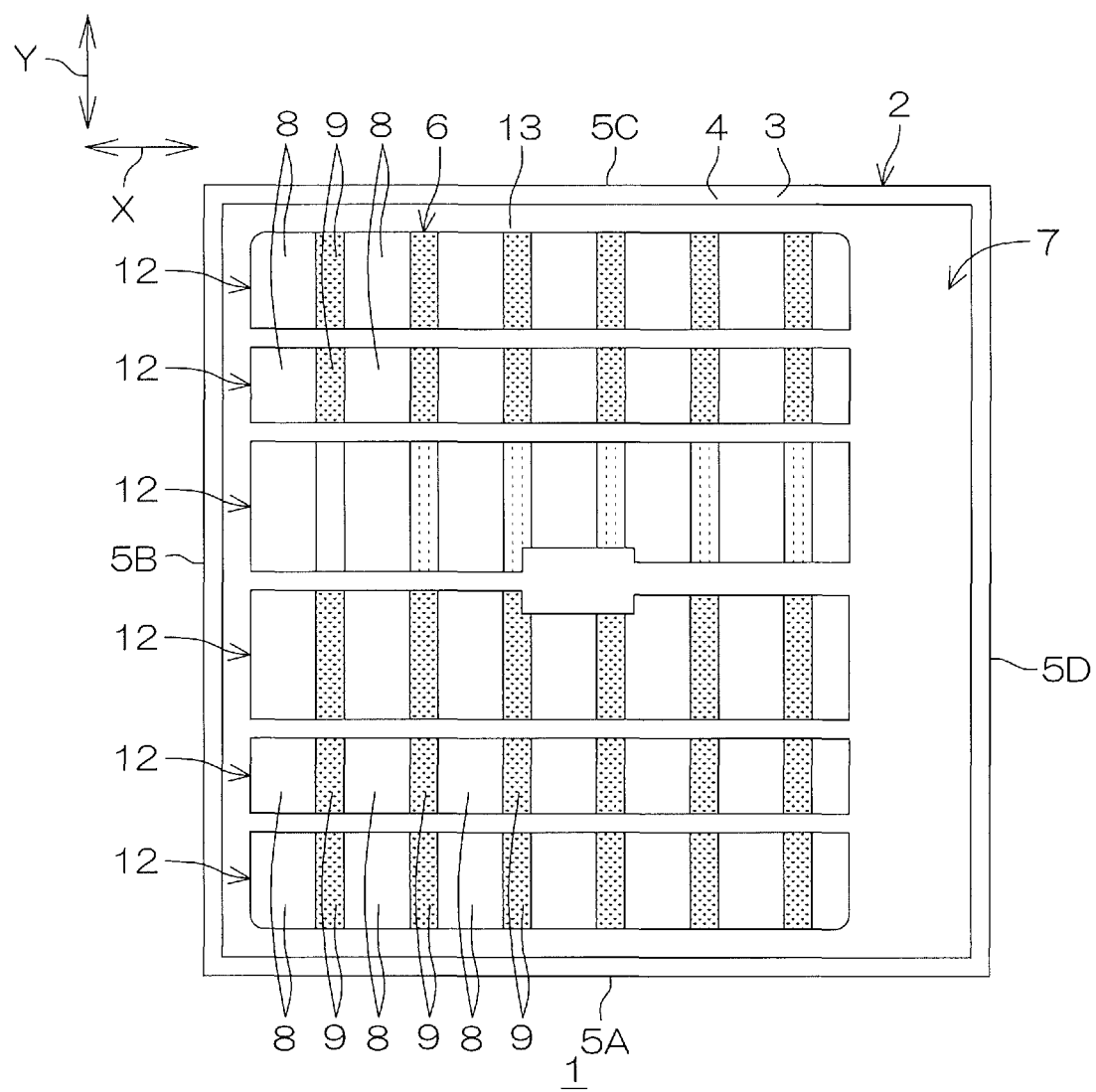
FIG. 2 is a plan view of a structure of a first main surface of a semiconductor layer.

FIG. 1 is a plan view of a semiconductor device 1 according to a first preferred embodiment of the present invention. FIG. 2 is a plan view of the structure of a first main surface 3 of a semiconductor layer 2.

The semiconductor device 1 is an electronic component that has an RC-IGBT (reverse conducting-insulated gate bipolar transistors) that integrally includes an IGBT and a diode.

Referring to FIG. 1 and FIG. 2, the semiconductor device 1 includes a semiconductor layer 2 of rectangular parallelepiped shape. The semiconductor layer 2 has a first main surface 3 at one side, a second main surface 4 at another side, and side surfaces 5A, 5B, 5C, and 5D connecting the first main surface 3 and the second main surface 4.

The first main surface 3 and the second main surface 4 are formed to quadrilateral shapes in a plan view as viewed from a normal direction Z thereof (hereinafter referred to simply as "plan view"). The side surface 5A and the side surface 5C extend along a first direction X and oppose each other in a second direction Y intersecting the first direction X. The side surface 5B and the side surface 5D extend along the second direction Y and oppose each other in the first direction X. The second direction Y is, specifically, orthogonal to the first direction X.

A thickness of the semiconductor layer 2 may be not less than 50 μm and not more than 200 μm the thickness of the semiconductor layer 2 may be not less than 50 μm and not more than 100 μm, not less than 100 μm and not more than 150 μm, or not less than 150 μm and not more than 200 μm. A resistance value of the semiconductor layer 2 can be reduced by making the thickness of the semiconductor layer 2 small.

The semiconductor layer 2 includes an active region 6 and an outer region 7. The active region 6 is a region in which the RC-IGBT is formed. The active region 6 is set in a central portion of the semiconductor layer 2 across intervals to an inner region from the side surfaces 5A to 5D in plan view. The active region 6 may be set to a quadrilateral shape having four sides parallel to the side surfaces 5A to 5D in plan view.

The outer region 7 is a region at an outer side of the active region 6. The outer region 7 extends as a band along peripheral edges of the active region 6 in plan view. Specifically, the outer region 7 is set to an endless shape (a quadrilateral annular shape) surrounding the active region 6 in plan view.

The active region 6 includes IGBT regions 8 and diode regions 9. In FIG. 2, the diode regions 9 are shown with hatching for clarification. The IGBT regions 8 are regions in which an IGBT is formed. The diode regions 9 are region in which a diode is formed. The diode regions 9 are adjacent to the IGBT regions 8.

Specifically, the active region 6 includes RC-IGBT arrays 12. A plurality (six in this embodiment) of the RC-IGBT arrays 12 are formed at intervals in the second direction Y. Each RC-IGBT array 12 has a first end portion at one side (the side surface 5B side) and a second end portion at another side (the side surface 5D side).

Each RC-IGBT array 12 has a loop array that repeatedly includes an IGBT region 8, a diode region 9, an IGBT region 8, a diode region 9 . . . that are arrayed in a single column along the first direction X from the first end portion toward the second end portion. In this embodiment, the first end portion of the RC-IGBT array 12 is formed of an IGBT region 8. In this embodiment, the second end portion of the RC-IGBT array 12 is formed of an IGBT region 8. The first end portion of the RC-IGBT array 12 may be formed of a diode region 9 instead. The second end portion of the RC-IGBT array 12 may be formed of a diode region 9 instead.

A plurality of the IGBT regions 8 are thus dispersedly arrayed in the active region 6. The plurality of IGBT regions 8 are formed at intervals along the first direction X and the second direction Y. In this embodiment, the plurality of IGBT regions 8 are arrayed in a matrix in plan view. The plurality of IGBT regions 8 oppose each other along the first direction X and oppose each other along the second direction Y.

In this embodiment, the plurality of IGBT regions 8 are each formed to a quadrilateral shape in plan view. Specifically, the plurality of IGBT regions 8 are each formed to a rectangular shape extending along the second direction Y.

A width WI of each IGBT region 8 may be not less than 10 μm and not more than 1000 μm. The width WI is a width of the IGBT region 8 in the first direction X. The width WI may be not less than 10 μm and not more than 100 μm, not less than 100 μm and not more than 200 μm, not less than 200 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm and not more than 1000 μm. The width WI is preferably not less than 100 μm. The width WI is even more preferably not less than 200 μm.

Also, a plurality of the diode regions 9 thus dispersedly arrayed in the active region 6. The plurality of diode regions 9 are formed at intervals along the first direction X and the second direction Y. In this embodiment, the plurality of diode regions 9 are arrayed in a matrix in plan view. The plurality of diode regions 9 oppose each other along the first direction X and oppose each other along the second direction Y.

Specifically, the plurality of diode regions 9 are respectively formed such as to be adjacent to the IGBT regions 8 in the first direction X. In this embodiment, the plurality of diode regions 9 are each formed to a quadrilateral shape in plan view. Specifically, the plurality of diode regions 9 are each formed to a rectangular shape extending along the second direction Y.

A planar area of each diode region 9 is preferably not more than a planar area of each IGBT region 8. The planar area of each diode region 9 is even more preferably less than the planar area of each IGBT region 8. A width WD of each diode region 9 is preferably not more than the width WI of each IGBT region 8. The width WD is a width of the diode region 9 in the first direction X. The width WD of each diode region 9 is even more preferably less than the width WI of each IGBT region 8.

The width WD may be not less than 5 μm and not more than 1000 μm. The width WD may be not less than 5 μm and not more than 100 μm, not less than 100 μm and not more than 200 μm, not less than 200 μm and not more than 300 μm, not less than 300 μm and not more than 400 μm, not less than 400 μm and not more than 500 μm, not less than 500 μm and not more than 600 μm, not less than 600 μm and not more than 700 μm, not less than 700 μm and not more than 800 μm, not less than 800 μm and not more than 900 μm, or not less than 900 μm but less than 1000 μm. The width WD is preferably not less than 100 μm. The width WD is even more preferably not less than 200 μm.

The plurality of IGBT regions 8 are formed at a first ratio RI in the active region 6. The first ratio RI is a ratio SI/SA that a total area SI of the plurality of IGBT regions 8 occupies in an area SA of the active region 6 in plan view.

The plurality of diode regions 9 are formed at a second ratio RD in the active region 6. The second ratio RD is a ratio SD/SA that a total area SD of the plurality of diode regions 9 occupies in the area SA of the active region 6 in plan view. The second ratio RD is preferably not more than the first ratio RI (RD≤RI). The second ratio RD is even more preferably less than the first ratio RI (RD<RI).

In this embodiment, the second ratio RD is less than the first ratio RI (RD<RI). That is, the first ratio RI is not less than 0.5 and the second ratio RD is less than 0.5. The first ratio RI may be not less than 0.5 and not more than 0.6, not less than 0.6 and not more than 0.7, not less than 0.7 and not more than 0.8, not less than 0.8 and not more than 0.9, or not less than 0.9 but less than 1. The second ratio R2 may exceed 0 and be not more than 0.1 or may be not less than 0.1 and not more than 0.2, not less than 0.2 and not more than 0.3, not less than 0.3 and not more than 0.4, or not less than 0.4 but less than 0.5.

Preferably, the first ratio RI is not less than 0.6 and not more than 0.9 and the second ratio RD is not less than 0.1 and not more than 0.4. In this embodiment, the first ratio RI is 0.7 and the second ratio RD is 0.3.

If a dispersion degree D of the plurality of diode regions 9 with respect to the active region 6 is defined by a formula $\mathrm{Log}_e(L^2/SD)$, the dispersion degree D is preferably not less than 2 and not more than 15. In the formula, "L" is a total extension of boundary lines between the plurality of IGBT regions 8 and the plurality of diode regions 9 in plan view. In the formula, SD is the total area of the plurality of diode regions 9 in plan view.

The total extension L of the boundary lines is also a total extension of portions of the diode regions 9 that oppose the IGBT regions 8. In this embodiment, the IGBT regions 8 and the diode regions 9 are both demarcated in quadrilateral shapes in plan view. Therefore, the total extension L of the boundary lines is a total extension of sides among the plurality of sides of the diode regions 9 that oppose the IGBT regions 8.

The dispersion degree D is adjusted by increasing or decreasing the total extension L or the total area SD or the total extension L and the total area SD under a condition that the second ratio RD is less than the first ratio RI (RD<RI). In other words, the dispersion degree D is adjusted by increasing or decreasing the numbers or the planar areas of the IGBT regions 8 and the diode regions 9 or the numbers and the planar areas of the IGBT regions 8 and the diode regions 9 respectively under the condition that the second ratio RD is less than the first ratio RI (RD<RI). The total extension L and/or the total area SD may be adjusted according to each of the plurality of RC-IGBT arrays 12.

Figure 3:
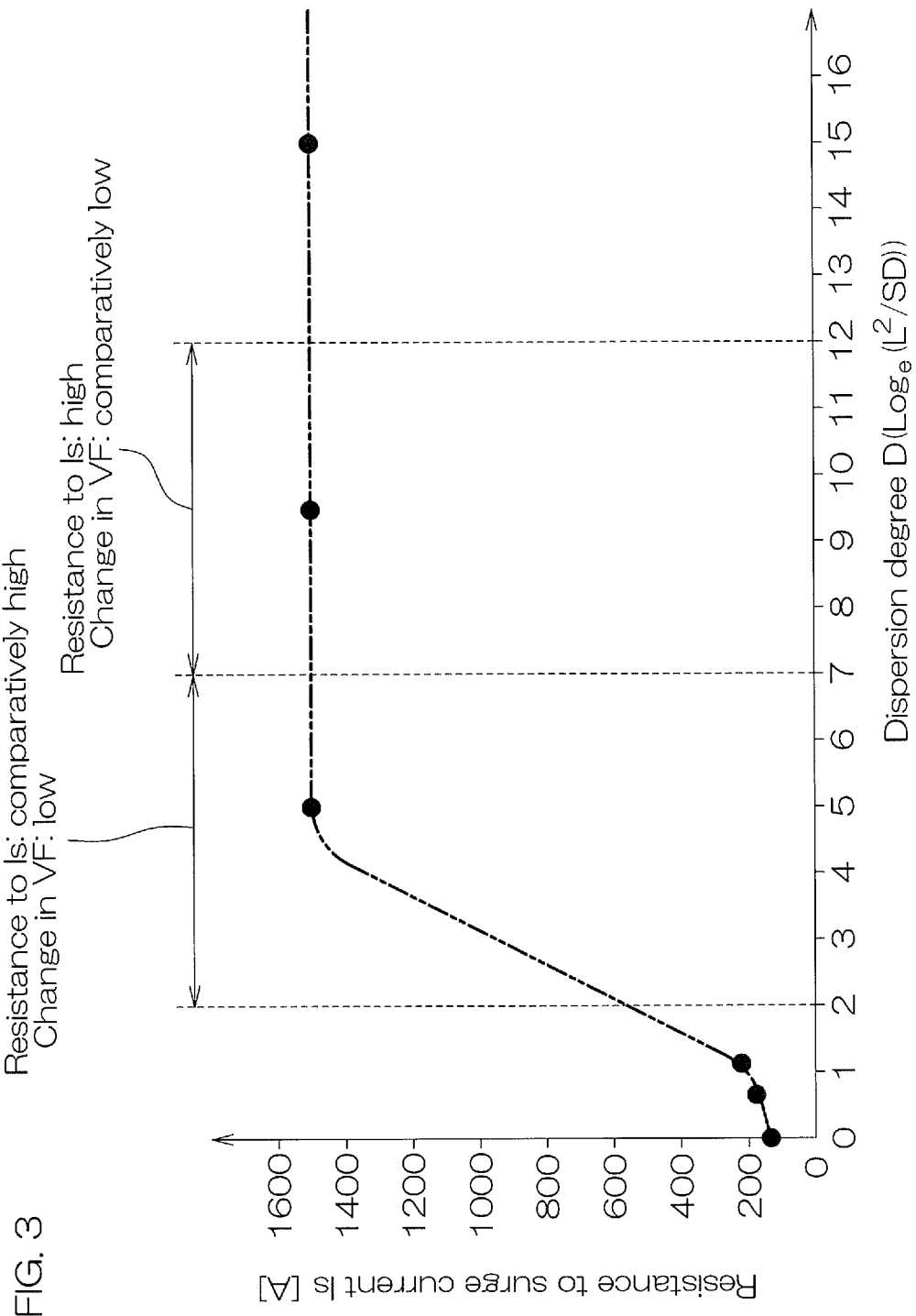
FIG. 3 is a graph of a result of examining a relationship between a tolerance to a surge current and a dispersion degree by a simulation.

FIG. 3 is a graph of a result of examining a relationship between a tolerance to a surge current Is and the dispersion degree D by a simulation. In FIG. 3, the ordinate indicates the tolerance to the surge current Is [A] and the abscissa indicates the dispersion degree D. The tolerance to the surge current Is is a maximum value of the surge current Is that the semiconductor device 1 can withstand.

Referring to FIG. 3, when the dispersion degree D was increased, the tolerance to the surge current Is increased. Specifically, the tolerance to the surge current Is increased monotonously in a range where the dispersion degree D exceeds 0 but is less than 5 and became saturated in a range where the dispersion degree D is not less than 5.

In a range where the dispersion degree D exceeds 0 but is less than 2, the tolerance to the surge current Is was less than 400 A. In a range where the dispersion degree D is not less than 2 but less than 5, the tolerance to the surge current Is was not less than 400 A but less than 1400 A. In a range where the dispersion degree D is not less than 5, the tolerance to the surge current Is was not less than 1400 A and not more than 1600 A. From these results, it was found that the larger the dispersion degree D is made, the higher the breakdown tolerance of the semiconductor device 1 can be made.

Figure 4:
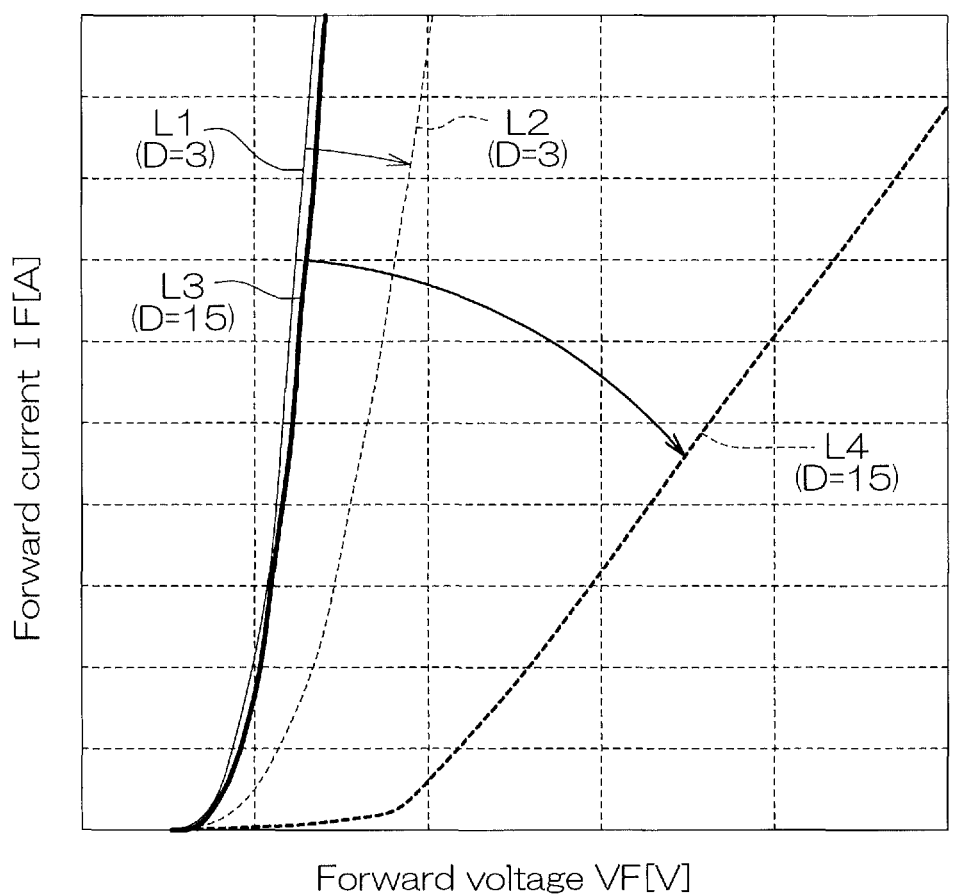
FIG. 4 is a graph of results of examining a relationship between a forward current and a forward voltage by a simulation.

FIG. 4 is a graph of a result of examining a relationship between a forward current IF and a forward voltage VF by a simulation. In FIG. 4, the ordinate indicates the forward current IF [A] and the abscissa indicates the forward voltage VF [V].

First characteristics L1 (see solid line) and second characteristics L2 (see broken line) in a case where the dispersion degree D is "3" are shown in FIG. 4. The first characteristics L1 represent characteristics in a case where the diode is made to operate in a forward direction in a state in which a bias voltage Vge is not applied to the IGBT. The second characteristics L2 represent characteristics in a case where the diode is made to operate in the forward direction in a state in which the bias voltage Vge is applied to the IGBT.

Third characteristics L3 (see solid line) and fourth characteristics L4 (see broken line) in a case where the dispersion degree D is "15" are shown in FIG. 4. The third characteristics L3 represent characteristics in a case where the diode is made to operate in the forward direction in a state in which the bias voltage Vge is not applied to the IGBT. The fourth characteristics L4 represent characteristics in a case where the diode is made to operate in the forward direction in a state in which the bias voltage Vge is applied to the IGBT.

Referring to the first characteristics L1 and the second characteristics L2, in the case where the dispersion degree D is "3," the forward voltage VF increased after application of the bias voltage Vge. Similarly, referring to the third characteristics L3 and the fourth characteristics L4, in the case where the dispersion degree D is "15," the forward voltage VF increased after application of the bias voltage Vge.

Referring to the first characteristics L1 to the fourth characteristics L4, a change amount of the forward voltage VF in the case where the dispersion degree D is "15" was greater than the change amount of the forward voltage VF in the case where the dispersion degree D is "3." When the dispersion degree D exceeds "15," the change amount of the forward voltage VF exceeds a practical range.

From the results of FIG. 4, it was found that as the value of the dispersion degree D increases, the change amount of the forward voltage VF before and after the application of the bias voltage Vge increases. Also, from the results of FIG. 3 and FIG. 4, it was found that as the value of the dispersion degree D increases, there is a tradeoff in that although the tolerance to the surge current Is increases, the change amount of the forward voltage VF also increases.

When the dispersion degree D is small, the plurality of diode regions 9 are concentrated in a certain specific location and therefore, current flowing into each diode region 9 increases. Consequently, the tolerance to the surge current Is decreases. On the other hand, when the dispersion degree D is large, the plurality of diode regions 9 are dispersed and therefore, the current flowing into each diode region 9 decreases. Consequently, the tolerance to the surge current Is increases.

On the other hand, when the diode is made to operate in the forward direction in the state where the bias voltage Vge is applied to the IGBT, an inflow amount of carriers (holes) from the IGBT regions 8 to the diode regions 9 decreases. Consequently, the forward voltage VF of the diode changes.

When the dispersion degree D is set to a comparatively large value, the total extension L of the boundary lines between the IGBT regions 8 and the diode regions 9 takes on a comparatively large value and therefore, inflow paths for the carriers (holes) from the IGBT regions 8 to the diode regions 9 increase. Consequently, the change amount of the forward voltage VF before and after the application of the bias voltage Vge increases. The dispersion degree D must be set in consideration of the tradeoff relationship that exists between the tolerance to the surge current Is and the change amount of the forward voltage VF.

From the results of FIG. 3 and FIG. 4, it was found that the dispersion degree D is preferably set in a range of not less than 2 and not more than 15. When the dispersion degree D is set in the range of not less than 2 and not more than 15, the tolerance to the surge current Is can be increased while suppressing the change in the forward voltage VF before and after the application of the bias voltage Vge.

The dispersion degree D may be not less than 2 and not more than 3, not less than 3 and not more than 4, not less than 4 and not more than 5, not less than 5 and not more than 6, not less than 6 and not more than 7, not less than 7 and not more than 8, not less than 8 and not more than 9, not less than 9 and not more than 10, not less than 10 and not more than 11, not less than 11 and not more than 12, not less than 12 and not more than 13, or not less than 14 and not more than 15. The dispersion degree D is preferably less than 15.

The dispersion degree D is especially preferably set in a range of not less than 2 and not more than 7 or a range of not less than 7 and not more than 12. When the dispersion degree D is set in the range of not less than 2 and not more than 7, the tolerance to the surge current Is can be increased while reliably suppressing the change in the forward voltage VF. When the dispersion degree D is set in the range of not less than 7 and not more than 12, the tolerance to the surge current Is can be increased reliably while suppressing the change in the forward voltage VF.

The area SA of the active region 6 is adjusted in accordance with a size of the semiconductor layer 2 and is not restricted to a specific numerical value. The area SA may, for example, be not less than 1 mm$^2$ and not more than 250 mm$^2$. The area SA may be not less than 1 mm$^2$ and not more than 50 mm$^2$, not less than 50 mm$^2$ and not more than 100 mm$^2$, not less than 100 mm$^2$ and not more than 150 mm$^2$, not less than 150 mm$^2$ and not more than 200 mm$^2$, or not less than 200 mm$^2$ and not more than 250 mm$^2$.

The total area SI of the plurality of IGBT regions 8, the total area SD of the plurality of diode regions 9, and the total extension L of the boundary lines are adjusted in accordance with the area SA of the active region 6 and are not restricted to specific numerical values.

The total area SI may, for example, be not less than 0.5 mm$^2$ and not more than 225 mm$^2$. The total area SI may be not less than 0.5 mm$^2$ and not more than 50 mm$^2$, not less than 50 mm$^2$ and not more than 100 mm$^2$, not less than 100 mm$^2$ and not more than 150 mm$^2$, not less than 150 mm$^2$ and not more than 200 mm$^2$, or not less than 200 mm$^2$ and not more than 225 mm$^2$.

The total area SD may, for example, be not less than 0.1 mm$^2$ and not more than 100 mm$^2$. The total area SD may be not less than 0.1 mm$^2$ and not more than 25 mm$^2$, not less than 25 mm$^2$ and not more than 50 mm$^2$, not less than 50 mm$^2$ and not more than 75 mm$^2$, or not less than 75 mm$^2$ and not more than 100 mm$^2$.

The total extension L may, for example, be not less than 100 μm and not more than 3500 μm. The total extension L may be not less than 100 μm and not more than 500 μm, not less than 500 μm and not more than 1000 μm, not less than 1000 μm and not more than 1500 μm, not less than 1500 μm and not more than 2000 μm, not less than 2000 μm and not more than 2500 μm, not less than 2500 μm and not more than 3000 μm, or not less than 3000 μm and not more than 3500 μm.

Referring again to FIG. 1 and FIG. 2, the active region 6 further includes a sensor region 11. The sensor region 11 is a region in which a temperature sensor is formed. The sensor region 11 is formed in a region between two RC-IGBT arrays 12 that are mutually adjacent in the second direction Y. In this embodiment, the sensor region 11 is formed in a central portion of the active region 6. At the central portion of the active region 6, it tends to become hot easily. Therefore, by arranging the temperature sensor at the central portion of the active region 6, the temperature of the semiconductor layer 2 can be detected appropriately.

The semiconductor device 1 includes an emitter terminal electrode 13 (see broken line portion in FIG. 1) as a first main surface electrode formed on the first main surface 3 of the semiconductor layer 2 in the active region 6. The emitter terminal electrode 13 transmits an emitter signal to the active region 6 (IGBT regions 8). The emitter signal may be of a reference potential or a ground potential.

The semiconductor device 1 includes a plurality (five in this embodiment) of terminal electrodes 14, 15, 16, 17, and 18 formed on the first main surface 3 of the semiconductor layer 2 in the outer region 7. The plurality of terminal electrodes 14 to 18 are arranged at intervals from each other along the side surface 5D. The plurality of terminal electrodes 14 to 18 are formed to quadrilateral shapes in plan view.

In this embodiment, the plurality of terminal electrodes 14 to 18 include a gate terminal electrode 14, a first sense terminal electrode 15, a second sense terminal electrode 16, a current detection terminal electrode 17, and an open terminal electrode 18. The gate terminal electrode 14 transmits a gate signal to the active region 6 (IGBT regions 8). The first sense terminal electrode 15 and the second sense terminal electrode 16 transmit control signals that control the sensor region 11 (the temperature sensor). Although specific description shall be omitted, the current detection terminal electrode 17 is an electrode for detecting and taking out a current flowing through the active region 6 to the exterior. The open terminal electrode 18 is provided as an electrically floating state.

Arrangements of the gate terminal electrode 14, the first sense terminal electrode 15, the second sense terminal electrode 16, the current detection terminal electrode 17, and the open terminal electrode 18 are arbitrary. In this embodiment, the open terminal electrode 18, the current detection terminal electrode 17, the gate terminal electrode 14, the first sense terminal electrode 15, and the second sense terminal electrode 16 are arranged in that order from the side surface 5A side toward the side surface 5C side.

The semiconductor device 1 includes a gate wiring 19 electrically connected to the gate terminal electrode 14. The gate wiring 19 is also called a gate finger. The gate wiring 19 extends from the outer region 7 toward the active region 6. The gate wiring 19 transmits the gate signal applied to the gate terminal electrode 14 to the active region 6 (IGBT regions 8).

Specifically, the gate wiring 19 includes a first region 19a positioned in the outer region 7 and second regions 19b positioned in the active region 6. The first region 19a is electrically connected to the gate terminal electrode 14. In this embodiment, the first region 19a is selectively routed in a region of the outer region 7 at the side surface 5D side.

A plurality (five in this embodiment) of the second regions 19b are formed in the active region 6. The plurality of second regions 19b are formed at intervals along the second direction Y. The plurality of second regions 19b are each formed in a region between two RC-IGBT arrays 12 that are mutually adjacent. The plurality of second regions 19b extend as bands along the first direction X.

The plurality of second regions 19b respectively extend from regions of the outer region 7 at the side surface 5D side to regions at the side surface 5B side. The plurality of second regions 19b may cross the active region 6. The plurality of second regions 19b are continuous to the first region 19a in the outer region 7. The plurality of second regions 19b each transmit the gate signal to one of either or both of two RC-IGBT arrays 12 that are mutually adjacent.

The gate signal applied to the gate terminal electrode 14 is transmitted via the first region 19a to the second regions 19b. The gate signal is thereby transmitted via the second regions 19b to the active region 6 (IGBT regions 8).

The semiconductor device 1 includes a first sense wiring 20 electrically connected to the first sense terminal electrode 15. The first sense wiring 20 extends from the outer region 7 toward the sensor region 11. The first sense wiring 20 transmits a control signal for the temperature sensor.

Specifically, the first sense wiring 20 includes a first region 20a positioned in the outer region 7 and a second region 20b positioned in the active region 6. The first region 20a is electrically connected to the first sense terminal electrode 15. In this embodiment, the first region 20a is selectively routed in a region of the outer region 7 at the side surface 5D side.

The second region 20b is formed in the region in which the sensor region 11 is formed between the plurality of RC-IGBT arrays 12 that are mutually adjacent. The second region 20b extends as a band along the first direction X from the outer region 7 toward the sensor region 11.

The second region 20b is electrically connected to the temperature sensor in the sensor region 11. The second region 20b is continuous to the first region 20a in the outer region 7. An electric signal applied to the first sense terminal electrode 15 is transmitted to the second region 21b via the first region 20a. The electric signal is thereby transmitted to the temperature sensor via the second region 21b.

A second sense wiring 21 is electrically connected to the second sense terminal electrode 16. The second sense wiring 21 extends from the outer region 7 toward the sensor region 11. The second sense wiring 21 transmits a control signal for the temperature sensor.

Specifically, the second sense wiring 21 includes a first region 21a positioned in the outer region 7 and a second region 21b positioned in the active region 6. The first region 21a is electrically connected to the second sense terminal electrode 16. In this embodiment, the first region 21a is selectively routed in a region of the outer region 7 at the side surface 5D side.

The second region 21b is formed in the region in which the sensor region 11 is formed between the plurality of RC-IGBT arrays 12 that are mutually adjacent. The second region 21b extends as a band along the first direction X from the outer region 7 toward the sensor region 11. The second region 21b is electrically connected to the temperature sensor in the sensor region 11.

The second region 21b is continuous to the first region 21a in the outer region 7. An electric signal applied to the second sense terminal electrode 16 is transmitted to the second region 21b via the first region 21a. The electric signal is thereby transmitted to the temperature sensor via the second region 21b.

The gate wiring 19, the first sense wiring 20, and the second sense wiring 21 are formed in the region in which the sensor region 11 is formed between the plurality of RC-IGBT arrays 12 that are mutually adjacent. The gate wiring 19, the first sense wiring 20, and the second sense wiring 21 run in parallel in the region between two RC-IGBT arrays 12 that are mutually adjacent.

With such a structure, reduction of wiring forming area can be achieved while increasing temperature detection precision by the temperature sensor. That is, reduction of the active region 6 due to the temperature sensor formed inside the active region 6 can be suppressed. Reduction of a formable area for the RC-IGBT arrays 12 can thereby be suppressed while increasing the temperature detection precision by the temperature sensor.

Figure 5:
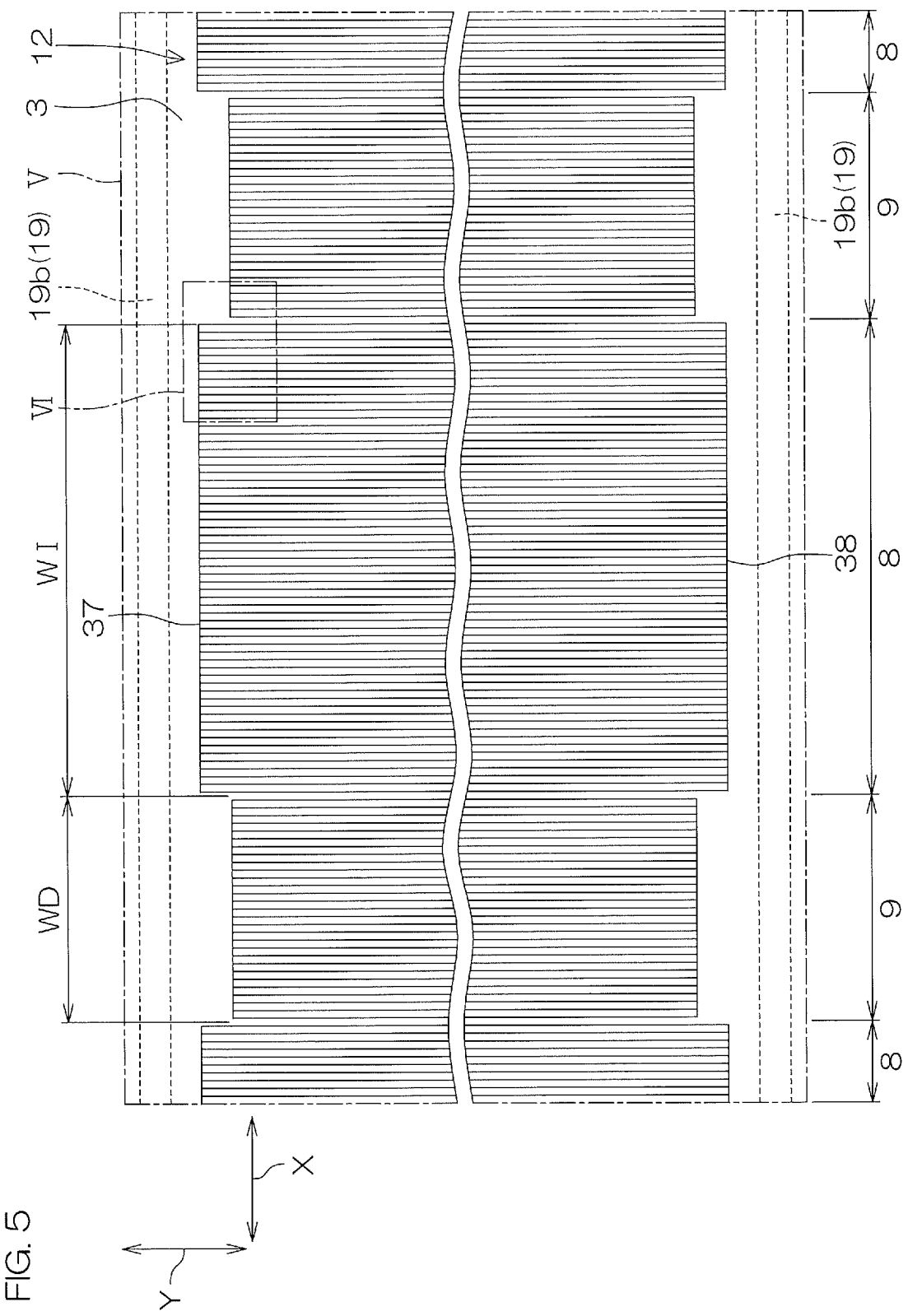
FIG. 5 is an enlarged view of a region V shown in FIG. 1.
Figure 6:
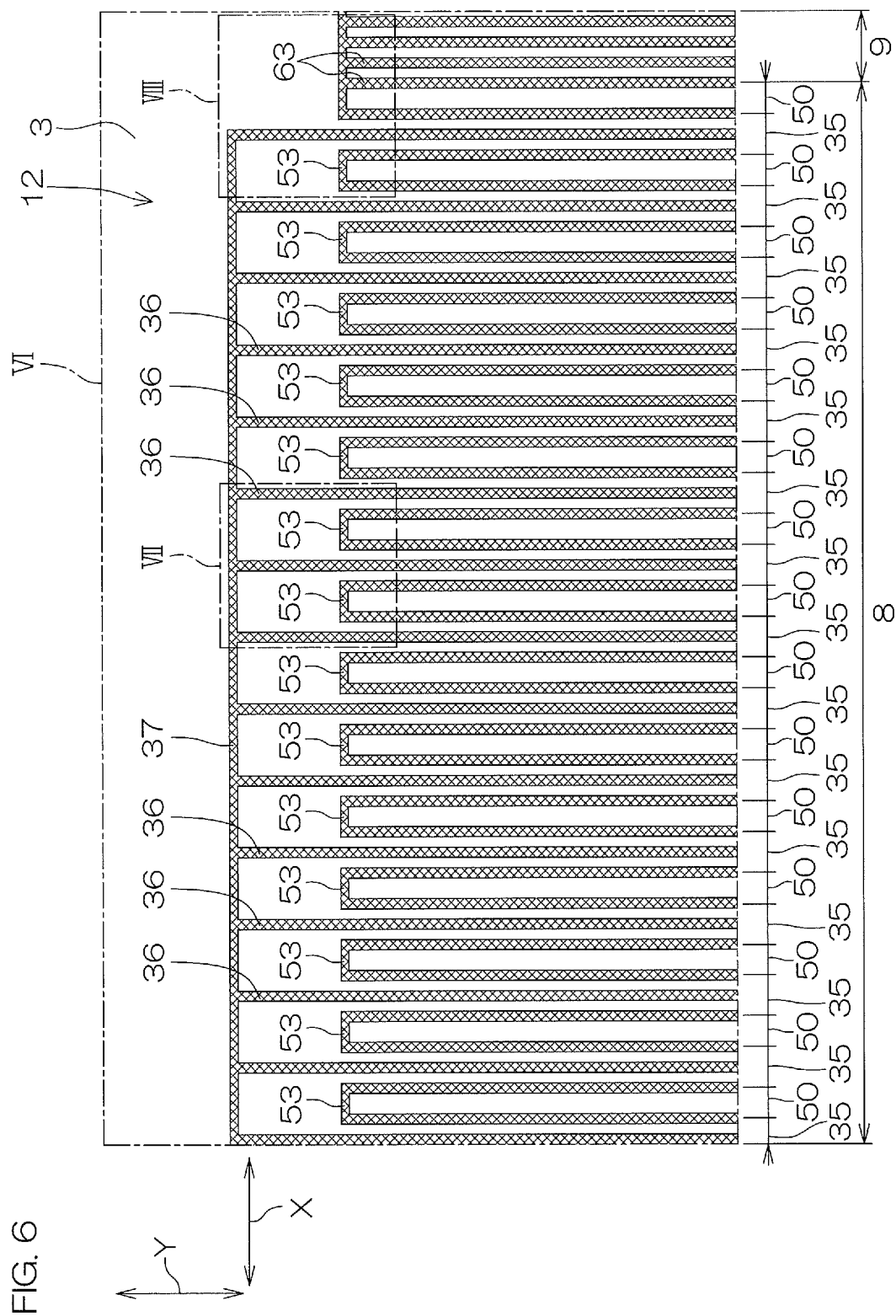
FIG. 6 is an enlarged view of a region VI shown in FIG. 5.
Figure 7:
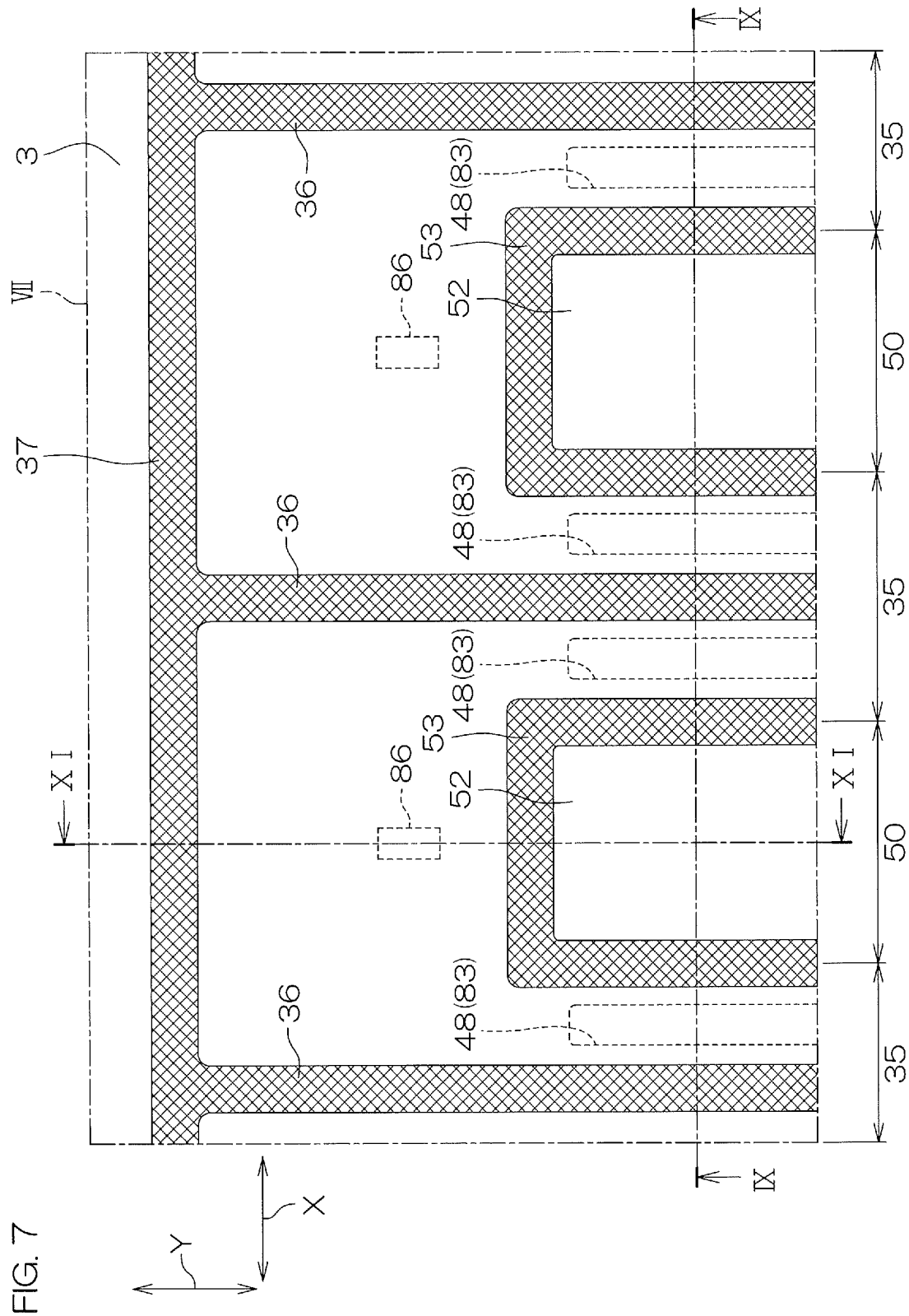
FIG. 7 is an enlarged view of a region VII shown in FIG. 6.
Figure 8:
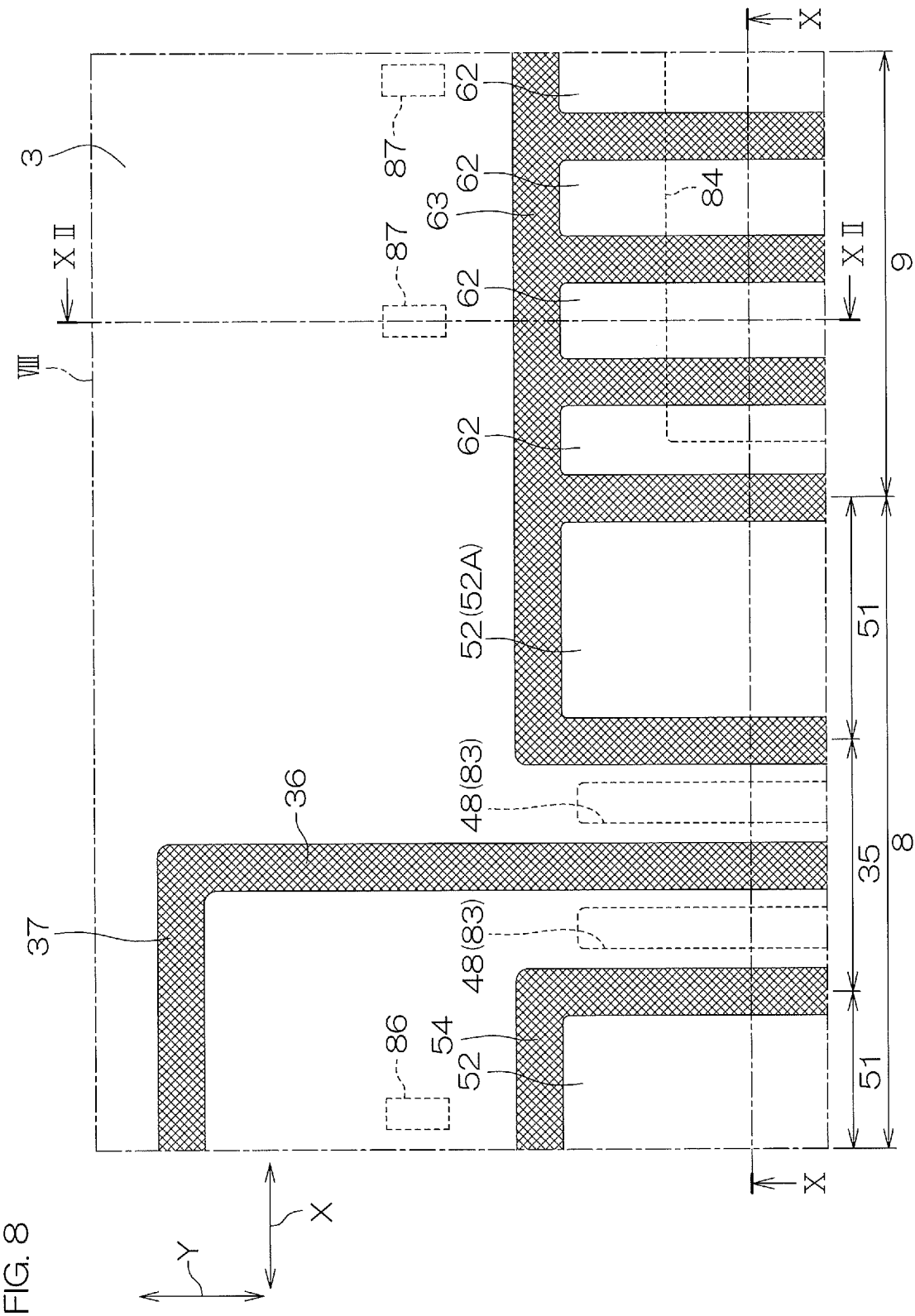
FIG. 8 is an enlarged view of a region VIII shown in FIG. 6.
Figure 9:
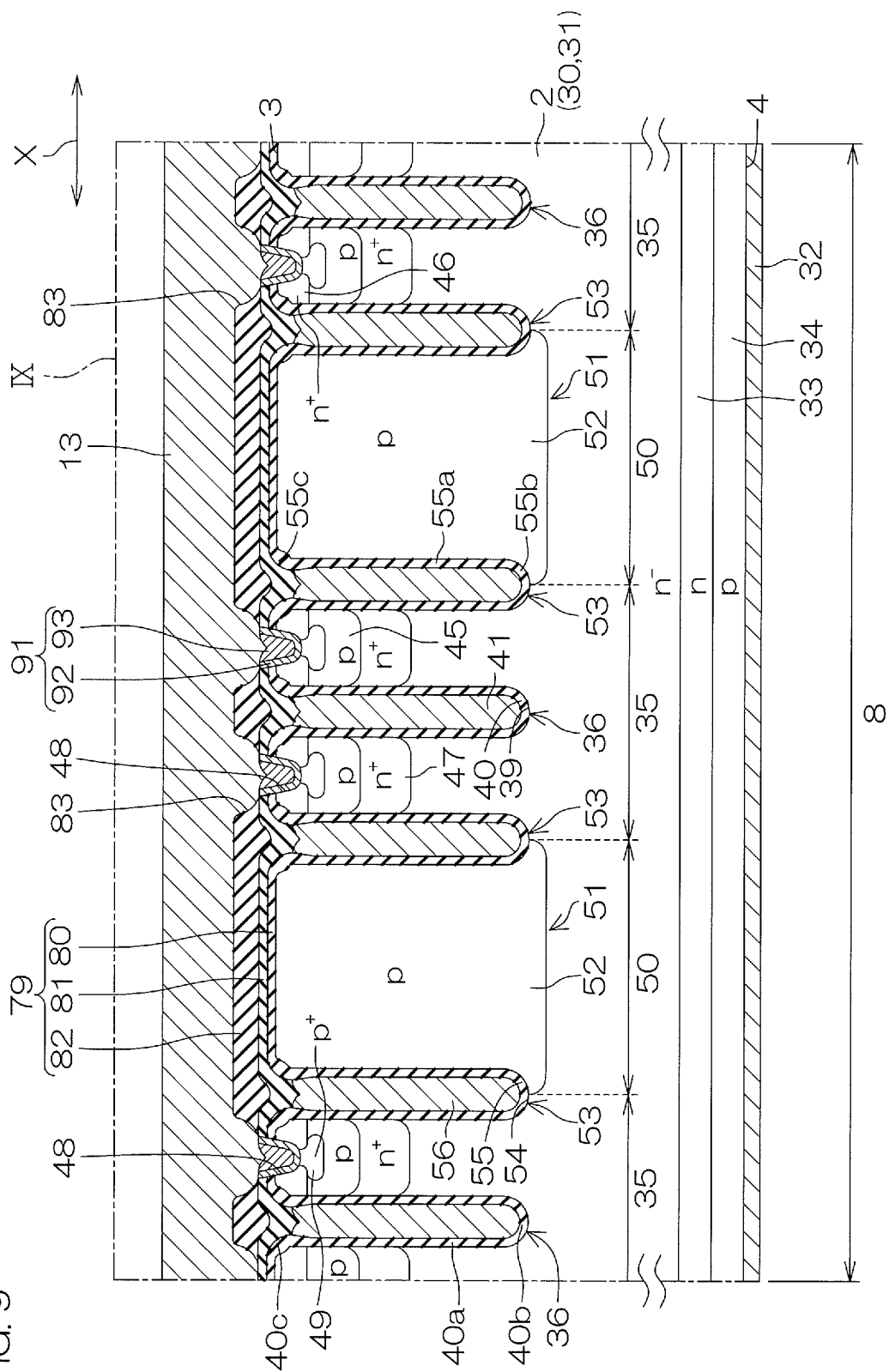
FIG. 9 is a sectional view taken along line IX-IX shown in FIG. 7.
Figure 10:
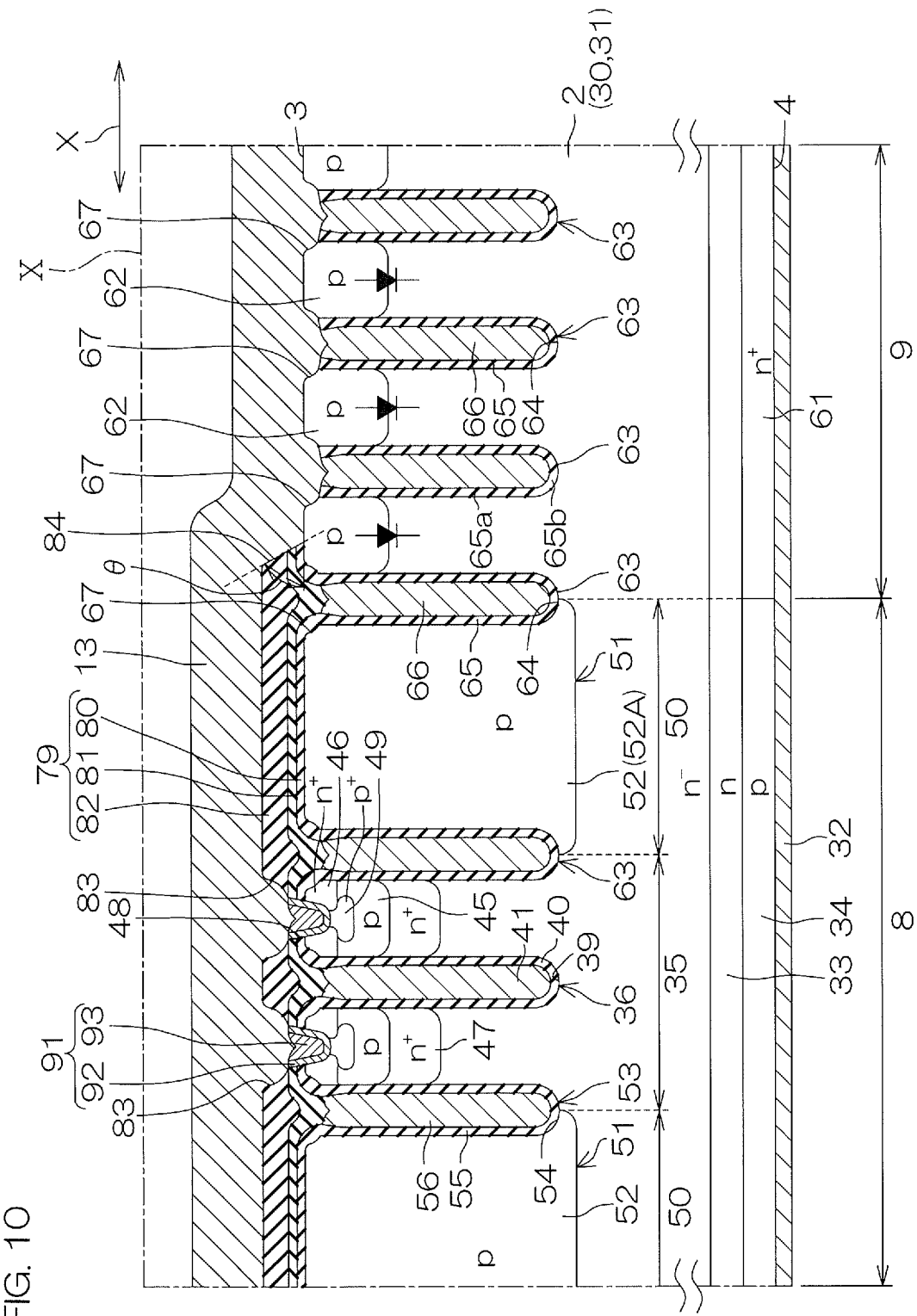
FIG. 10 is a sectional view taken along line X-X shown in FIG. 8.
Figure 11:
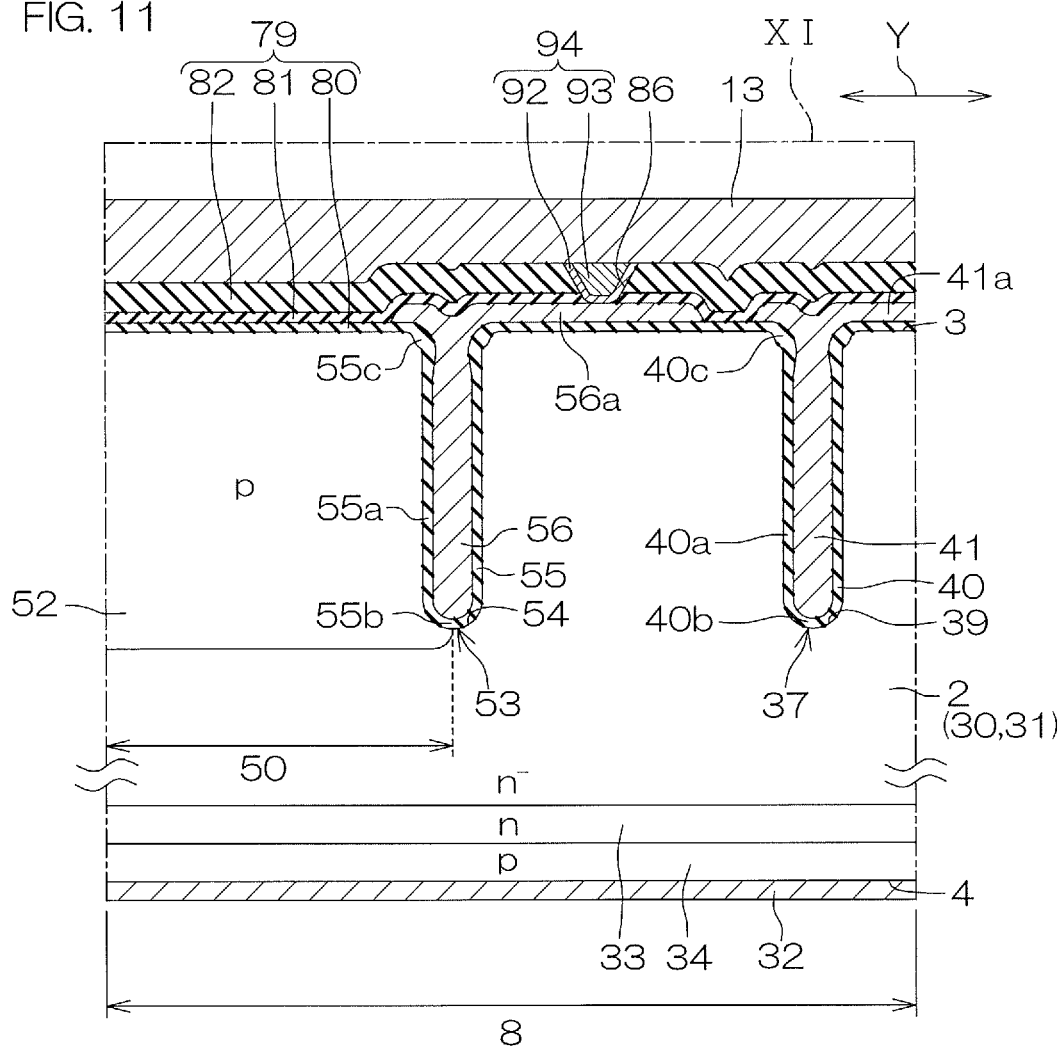
FIG. 11 is a sectional view taken along line XI-XI shown in FIG. 7.
Figure 12:
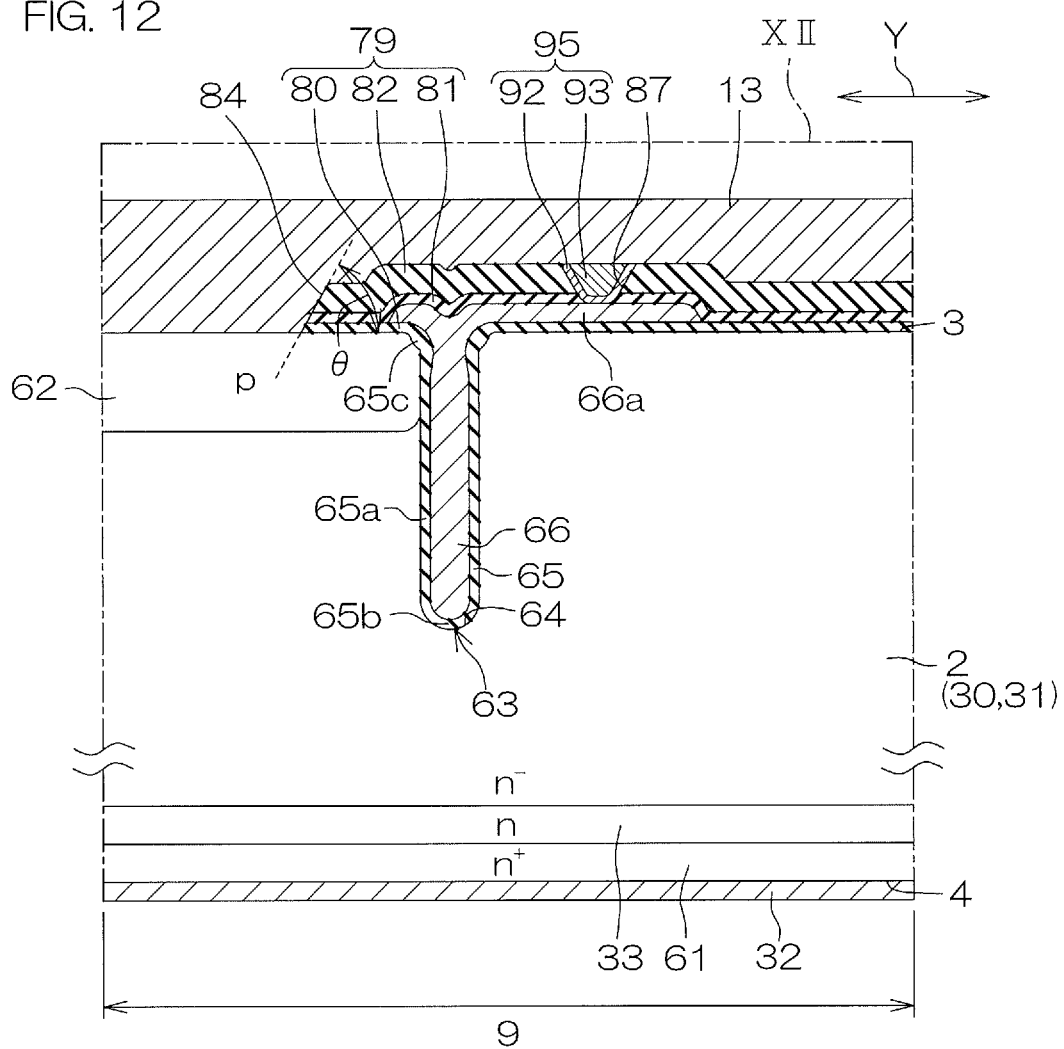
FIG. 12 is a sectional view taken along line XII-XII shown in FIG. 8.

FIG. 5 is an enlarged view of a region V shown in FIG. 1. FIG. 6 is an enlarged view of a region VI shown in FIG. 5. FIG. 7 is an enlarged view of a region VII shown in FIG. 6. FIG. 8 is an enlarged view of a region VIII shown in FIG. 6. FIG. 9 is a sectional view taken along line IX-IX shown in FIG. 7. FIG. 10 is a sectional view taken along line X-X shown in FIG. 8. FIG. 11 is a sectional view taken along line XI-XI shown in FIG. 7. FIG. 12 is a sectional view taken along line XII-XII shown in FIG. 8.

Referring to FIG. 5 to FIG. 12, the semiconductor device 1 includes an n⁻-type drift region 30 formed in an interior of the semiconductor layer 2. Specifically, the drift region 30 is formed across an entirety of the semiconductor layer 2. An n-type impurity concentration of the drift region 30 may be not less than $1.0 \times 10^{13}$ cm$^{-3}$ and not more than $1.0 \times 10^{15}$ cm$^{-3}$.

In this embodiment, the semiconductor layer 2 has a single layer structure that includes an n⁻-type semiconductor substrate 31. The semiconductor substrate 31 may be an FZ substrate made of silicon that is formed through an FZ (floating zone) method. The drift region 30 is formed by the semiconductor substrate 31.

The semiconductor device 1 includes a collector terminal electrode 32 as a second main surface electrode formed on the second main surface 4 of the semiconductor layer 2. The collector terminal electrode 32 is electrically connected to the second main surface 4. Specifically, the collector terminal electrode 32 is electrically connected to the IGBT regions 8 (a collector region 34 to be described later) and the diode regions 9 (cathode regions 61 to be described later). The collector terminal electrode 32 forms an ohmic contact with the second main surface 4. The collector terminal electrode 32 transmits a collector signal to the IGBT regions 8 and the diode regions 9.

The collector terminal electrode 32 may include at least one among a Ti layer, an Ni layer, an Au layer, an Ag layer, and an Al layer. The collector terminal electrode 32 may have a single layer structure that includes a Ti layer, an Ni layer, an Au layer, an Ag layer, or an Al layer. The collector terminal electrode 32 may have a laminated structure in which at least two among a Ti layer, an Ni layer, an Au layer, an Ag layer, and an Al layer are laminated in any mode.

The semiconductor device 1 includes an n-type buffer layer 33 formed in a surface layer portion of the second main surface 4 of the semiconductor layer 2. The buffer layer 33 may be formed across an entirety of the surface layer portion of the second main surface 4. An n-type impurity concentration of the buffer layer 33 is greater than the n-type impurity concentration of the drift region 30. The n-type impurity concentration of the buffer layer 33 may be not less than $1.0 \times 10^{15}$ cm$^{-3}$ and not more than $1.0 \times 10^{17}$ cm$^{-3}$.

A thickness of the buffer layer 33 may be not less than 0.5 µm and not more than 30 µm. The thickness of the buffer layer 33 may be not less than 0.5 µm and not more than 5 µm, not less than 5 µm and not more than 10 µm, not less than 10 µm and not more than 15 µm, not less than 15 µm and not more than 20 µm, not less than 20 µm and not more than 25 µm, or not less than 25 µm and not more than 30 µm.

Referring to FIG. 9 to FIG. 12, each IGBT region 8 includes the p-type collector region 34 formed in a surface layer portion of the second main surface 4 of the semiconductor layer 2. The collector region 34 is exposed from the second main surface 4. The collector region 34 may be formed across an entirety of a region of the surface layer portion of the second main surface 4 other than the diode regions 9. A p-type impurity concentration of the collector region 34 may be not less than $1.0 \times 10^{15}$ cm$^{-3}$ and not more than $1.0 \times 10^{18}$ cm$^{-3}$. The collector region 34 forms an ohmic contact with the collector terminal electrode 32.

Each IGBT region 8 includes FET structures 35 formed in the first main surface 3 of the semiconductor layer 2. In this embodiment, each IGBT region 8 includes the FET structures 35 of a trench gate type. Specifically, the FET structures 35 include trench gate structures 36 formed in the first main surface 3. In FIG. 6 to FIG. 8, the trench gate structures 36 are shown with hatching.

A plurality of the trench gate structures 36 are formed at intervals along the first direction X in each IGBT region 8. A distance between two trench gate structures 36 that are mutually adjacent in the first direction X may be not less than 1 µm and not more than 8 µm. The distance between the two trench gate structures 36 may be not less than 1 µm and not more than 2 µm, not less than 2 µm and not more than 3 µm, not less than 3 µm and not more than 4 µm, not less than 4 µm and not more than 5 µm, not less than 5 µm and not more than 6 µm, not less than 6 µm and not more than 7 µm, or not less than 7 µm and not more than 8 µm.

The plurality of trench gate structures 36 are formed as bands extending along the second direction Y in plan view. The plurality of trench gate structures 36 are formed in stripes as a whole. The plurality of trench gate structures 36 each have one end portion at one side in the second direction Y and another end portion at another side in the second direction Y.

The FET structures 35 include a first outer trench gate structure 37 and a second outer trench gate structure 38. The first outer trench gate structure 37 extends along the first direction X and connects the one end portions of the plurality of trench gate structures 36. The second outer trench gate structure 38 extends along the first direction X and connects the other end portions of the plurality of trench gate structures 36.

The first outer trench gate structure 37 and the second outer trench gate structure 38 have the same structure as the trench gate structures 36 with the exception being different in the direction of extension. In the following description, the structure of the trench gate structures 36 shall be described and descriptions of the structure of the first outer trench gate structure 37 and the structure of the second outer trench gate structure 38 shall be omitted.

Each trench gate structure 36 includes a gate trench 39, a gate insulating layer 40, and a gate electrode layer 41. The gate trench 39 is formed in the first main surface 3. The gate trench 39 includes side walls and a bottom wall. The side walls of the gate trench 39 may be formed perpendicular to the first main surface 3.

The side walls of the gate trench 39 may be downwardly inclined from the first main surface 3 toward the bottom wall. The gate trench 39 may be formed to a tapered shape with which an opening area at an opening side is greater than a bottom area. The bottom wall of the gate trench 39 may be formed parallel to the first main surface 3. The bottom wall of the gate trench 39 may be formed to a shape curved toward the second main surface 4.

The gate trench 39 includes an opening edge portion. The opening edge portion connects the first main surface 3 and the side walls of the gate trench 39. The opening edge portion has an inclined portion that is downwardly inclined from the first main surface 3 toward the side walls of the gate trench 39. The inclined portion is formed to a curved shape that is depressed toward the second main surface 4. A wide portion having an opening width wider than an opening width at the bottom wall side is thereby formed at the opening side of the gate trench 39. The inclined portion may be formed to a curved shape that projects toward the second main surface 4.

The gate trench 39 includes a bottom wall edge portion. The bottom wall edge portion connects the side walls and the bottom wall of the gate trench 39. The bottom wall edge portion may be formed to a shape curved toward the second main surface 4.

A depth of the gate trench 39 may be not less than 2 μm and not more than 10 μm. The depth of the gate trench 39 may be not less than 2 μm and not more than 3 μm, not less than 3 μm and not more than 4 μm, not less than 4 μm and not more than 5 μm, not less than 5 μm and not more than 6 μm, not less than 6 μm and not more than 7 μm, not less than 8 μm and not more than 9 μm, or not less than 9 μm and not more than 10 μm.

A width of the gate trench 39 may be not less than 0.5 μm and not more than 3 μm. The width of the gate trench 39 is a width of the gate trench 39 in the first direction X. The width of the gate trench 39 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm.

The gate insulating layer 40 is formed as a film along the inner walls of the gate trench 39. The gate insulating layer 40 demarcates a recess space inside the gate trench 39. In this embodiment, the gate insulating layer 40 includes a silicon oxide film. The gate insulating layer 40 may also include a silicon nitride film in place of or in addition to the silicon oxide film.

The gate insulating layer 40 includes a first region 40a, a second region 40b, and a third region 40c. The first region 40a covers the side walls of the gate trench 39. The second region 40b covers the bottom wall of the gate trench 39. The third region 40c covers the opening edge portion of the gate trench 39.

A thickness of the second region 20b may be not less than a thickness of the first region 40a. The thickness of the second region 40b may be greater than the thickness of the first region 40a. A thickness of the third region 40c may be not less than the thickness of the first region 40a. The thickness of the third region 40c may be greater than the thickness of the first region 40a.

The third region 40c includes a bulging portion bulging into the gate trench 39 at the opening edge portion of the gate trench 39. The third region 40c protrudes curvingly toward the inside of the gate trench 39. The third region 40c narrows an opening of the gate trench 39 at the opening edge portion of the gate trench 39. Obviously, a gate insulating layer 40 having a uniform thickness may be formed instead.

The gate electrode layer 41 is embedded across the gate insulating layer 40 in the gate trench 39. Specifically, the gate electrode layer 41 is embedded in the recess space demarcated by the gate insulating layer 40 in the gate trench 39. The gate electrode layer 41 is controlled by the gate signal. The gate electrode layer 41 may contain a conductive polysilicon.

The gate electrode layer 41 is formed to a wall shape extending along the normal direction Z in sectional view. The gate electrode layer 41 has an upper end portion positioned at the opening side of the gate trench 39. The upper end portion of the gate electrode layer 41 is positioned at the bottom wall side of the gate trench 39 with respect to the first main surface 3.

A depression depressed toward the bottom wall of the gate trench 39 is formed at the upper end portion of the gate electrode layer 41. The depression at the upper end portion of the gate electrode layer 41 is formed to a convergent shape directed toward the bottom wall of the gate trench 39. The upper end portion of the gate electrode layer 41 has a constricted portion constricted along the third region 40c of the gate insulating layer 40.

Each FET structure 35 includes p-type body regions 45 formed in a surface layer portion of the first main surface 3 of the semiconductor layer 2. A p-type impurity concentration of the body regions 45 may be not less than $1.0 \times 10^{17}$ cm$^{-3}$ and not more than $1.0 \times 10^{18}$ cm$^{-3}$.

The body regions 45 are respectively formed at both sides of each trench gate structure 36. The body regions 45 are formed as bands extending along the trench gate structures 36 in plan view. The body regions 45 are exposed from the side walls of the gate trenches 39. Bottom portions of the body regions 45 are formed in regions between the first main surface 3 and the bottom walls of the gate trenches 39 in regard to the normal direction Z.

Each FET structure 35 includes n$^+$-type emitter regions 46 formed in surface layer portions of the body regions 45. An n-type impurity concentration of the emitter regions 46 is greater than the n-type impurity concentration of the drift region 30. The n-type impurity concentration of the emitter regions 46 may be not less than $1.0 \times 10^{19}$ cm$^{-3}$ and not more than $1.0 \times 10^{20}$ cm$^{-3}$.

In this embodiment, each FET structure 35 includes a plurality of the emitter regions 46 formed at both sides of each trench gate structure 36. The emitter regions 46 are formed as bands extending along the trench gate structures 36 in plan view. The emitter regions 46 are exposed from the first main surface 3 and the side walls of the gate trenches 39. Bottom portions of the emitter regions 46 are formed in regions between the upper end portions of the gate electrode layers 41 and the bottom portions of the body regions 45 in regard to the normal direction Z.

In this embodiment, each FET structure 35 includes n$^+$-type carrier storage regions 47 formed in regions of the semiconductor layer 2 at the second main surface 4 side with respect to the body region 45. An n-type impurity concentration of the carrier storage regions 47 is greater than the n-type impurity concentration of the drift region 30. The n-type impurity concentration of the carrier storage regions 47 may be not less than $1.0 \times 10^{15}$ cm$^{-3}$ and not more than $1.0 \times 10^{17}$ cm$^{-3}$.

In this embodiment, each FET structure 35 includes a plurality of the carrier storage regions 47 that are formed at both sides of each trench gate structure 36. The carrier storage regions 47 are formed as bands extending along the trench gate structures 36 in plan view. The carrier storage regions 47 are exposed from the side walls of the gate trenches 39. Bottom portions of the carrier storage regions 47 are formed in regions between the bottom portions of the body regions 45 and the bottom walls of the gate trenches 39 in regard to the normal direction Z.

The carrier storage regions 47 suppress carriers (holes) supplied to the semiconductor layer 2 from being drawn back (drained) to the body regions 45. Holes thereby accumulate in a region of the semiconductor layer 2 directly below the FET structure 35. Consequently, reduction of ON resistance and reduction of ON voltage are achieved.

Each FET structure 35 includes emitter trenches 48 formed in the first main surface 3 of the semiconductor layer 2. In this embodiment, the FET structure 35 includes a plurality of the emitter trenches 48 that are formed at both sides of each trench gate structure 36. The emitter trenches 48 expose the emitter regions 46. In this embodiment, the emitter trenches 48 penetrate through the emitter regions 46.

The emitter trenches 48 are formed at intervals in the first direction X from the trench gate structures 36. The emitter trenches 48 extend as bands along the trench gate structures 36 in plan view. In regard to the second direction Y, a length of the emitter trenches 48 is not more than a length of the trench gate structures 36. Specifically, the length of the emitter trenches 48 is less than the length of the trench gate structures 36.

Each FET structure 35 includes p+-type contact regions 49 that are formed in regions of the body regions 45 along bottom walls of the emitter trenches 48. A p-type impurity concentration of the contact regions 49 is greater than the p-type impurity concentration of the body regions 45. The p-type impurity concentration of the contact regions 49 may be not less than $1.0 \times 10^{19}$ cm$^{-3}$ and not more than $1.0 \times 10^{20}$ cm-3.

The contact regions 49 are exposed from the bottom walls of the emitter trenches 48. The contact regions 49 extend as bands along the emitter trenches 48 in plan view. Bottom portions of the contact regions 49 are formed in regions between the bottom walls of the emitter trenches 48 and the bottom portions of the body regions 45 in regard to the normal direction Z.

Thus, with each FET structure 35, the gate electrode layer 41 opposes the body regions 45 and the emitter regions 46 across the gate insulating layer 40. In this embodiment, the gate electrode layer 41 also opposes the carrier storage regions 47 across the gate insulating layer 40. Channels of IGBTs are formed in regions of each body region 45 between the emitter region 46 and the drift region 30 (carrier storage region 47). ON/OFF of the channels is controlled by the gate signal.

Each IGBT region 8 includes region separating structures 50 that demarcate the FET structures 35 from other regions in the first main surface 3 of the semiconductor layer 2. Specifically, each IGBT region 8 includes a plurality of the region separating structures 50 that are formed at both sides of each FET structure 35. The region separating structures 50 are formed in regions of the surface layer portion of the first main surface 3 that are adjacent to the FET structures 35. The region separating structures 50 are respectively formed in regions between a plurality of the FET structures 35 that are mutually adjacent. The plurality of FET structures 35 are thereby separated respectively by the region separating structures 50.

In each IGBT region 8, IE (injection enhanced; carrier injection enhanced) structures 51 are formed by the FET structures 35 and the region separating structures 50. In each IE structure 51, the plurality of the FET structures 35 are arranged in a mode of being separated by a region separating structure 50.

The region separating structures 50 restrict movement of holes injected into the semiconductor layer 2. That is, the holes bypass the region separating structures 50 and flow into the FET structures 35. Thereby, the holes are accumulated in regions of the semiconductor layer 2 directly below the FET structure 35 and density of holes is increased. Consequently, the reduction of the ON resistance and the reduction of the ON voltage are achieved.

The region separating structures 50 include p+-type floating regions 52 formed in the regions of the surface layer portion of the first main surface 3 of the semiconductor layer 2 that are adjacent to the FET structures 35. The floating regions 52 are formed to electrically floated states. A p-type impurity concentration of the floating regions 52 may be not less than the p-type impurity concentration of the body regions 45. The p-type impurity concentration of the floating regions 52 may be greater than the p-type impurity concentration of the body regions 45. The p-type impurity concentration of the floating regions 52 may be not less than $1.0 \times 10^{16}$ cm$^{-3}$ and not more than $1.0 \times 10^{20}$ cm$^{-3}$. The p-type impurity concentration of the floating regions 52 is preferably not less than $1.0 \times 10^{18}$ cm$^{-3}$ and not more than $1.0 \times 10^{20}$ cm$^{-3}$.

Bottom portions of the floating regions 52 are formed in regions between the bottom portions of the carrier storage regions 47 and the second main surface 4 in regard to the normal direction Z. In this embodiment, the bottom portions of the floating regions 52 are formed in regions between the bottom walls of the gate trenches 39 and the second main surface 4 in regard to the normal direction Z. The floating regions 52 are formed as bands extending along the FET structures 35 in plan view. In regard to the second direction Y, a length of the floating regions 52 is less than a length of the gate trenches 39.

The region separating structures 50 include region separating trench structures 53 that demarcate the floating regions 52 from the FET structures 35. The region separating trench structures 53 are formed to annular shapes (quadrilateral annular shapes in this embodiment) surrounding the floating regions 52 in plan view.

Each region separating trench structure 53 includes a region separating trench 54, a region separating insulating layer 55, and a region separating electrode layer 56. The region separating trench 54 is formed in the first main surface 3 of the semiconductor layer 2. The region separating trench 54 includes side walls and a bottom wall. The side walls of the region separating trench 54 may be formed perpendicular to the first main surface 3.

The side walls of the region separating trench 54 may be downwardly inclined from the first main surface 3 toward the bottom wall. The region separating trench 54 may be formed to a tapered shape with which an opening area at an opening side is greater than a bottom area. The emitter regions 46, the body regions 45, and the carrier storage regions 47 are exposed from the side walls (outer side walls) of the region separating trenches 54 facing the FET structures 35. The floating regions 52 are exposed from the side walls (inner side walls) of the region separating trenches 54 facing the floating regions 52.

The bottom wall of each region separating trench 54 may be formed parallel to the first main surface 3. The bottom wall of the region separating trench 54 may be formed to a shape curved toward the second main surface 4. The bottom wall of the region separating trench 54 is covered by the bottom portion of the floating region 52. That is, the floating region 52 has a covering portion that covers the bottom wall of the region separating trench 54.

The region separating trench 54 includes an opening edge portion. The opening edge portion connects the first main surface 3 and the side walls of the region separating trench 54. The opening edge portion has an inclined portion that is downwardly inclined from the first main surface 3 toward the side walls of the region separating trench 54. The inclined portion is formed to a curved shape that is depressed toward the second main surface 4. A wide portion having an opening width wider than an opening width at the bottom wall side is thereby formed at the opening side of the region separating trench 54. The inclined portion may be formed to a curved shape that projects toward the second main surface 4.

The region separating trench 54 includes a bottom wall edge portion. The bottom wall edge portion connects the side walls and the bottom wall of the region separating trench 54. The bottom wall edge portion may be formed to a shape curved toward the second main surface 4 of the semiconductor layer 2.

A depth of the region separating trench 54 may be not less than 2 μm and not more than 10 μm. The depth of the region separating trench 54 may be not less than 2 μm and not more than 3 μm, not less than 3 μm and not more than 4 μm, not less than 4 μm and not more than 5 μm, not less than 5 μm and not more than 6 μm, not less than 6 μm and not more than 7 μm, not less than 8 μm and not more than 9 μm, or not less than 9 μm and not more than 10 μm. The depth of the region separating trenches 54 may be equal to the depth of the gate trenches 39.

A width of each region separating trench 54 may be not less than 0.5 μm and not more than 3 μm. The width of the region separating trench 54 is a width of the region separating trench 54 in the first direction X. The width of the region separating trench 54 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm. The width of the region separating trenches 54 may be equal to the width of the gate trenches 39.

The region separating insulating layers 55 are formed as films along the inner walls of the region separating trenches 54. The region separating insulating layers 55 demarcate recess spaces inside the region separating trenches 54. In this embodiment, each region separating insulating layer 55 includes a silicon oxide film. The region separating insulating layer 55 may also include a silicon nitride film in place of or in addition to the silicon oxide film.

Each region separating insulating layer 55 includes a first region 55a, a second region 55b, and a third region 55c. The first region 55a covers the side walls of the corresponding region separating trench 54. The second region 55b covers the bottom wall of the region separating trench 54. The third region 55c covers the opening edge portion of the region separating trench 54.

A thickness of the second region 20b may be not less than a thickness of the first region 55a. The thickness of the second region 55b may be greater than the thickness of the first region 55a. A thickness of the third region 55c may be not less than the thickness of the first region 55a. The thickness of the third region 55c may be greater than the thickness of the first region 55a.

The third region 55c includes a bulging portion bulging into the region separating trench 54 at the opening edge portion. The third region 55c protrudes curvingly toward the inside of the region separating trench 54. The third region 55c narrows an opening of the region separating trench 54 at the opening edge portion. Obviously, a region separating insulating layer 55 having a uniform thickness may be formed instead.

The region separating electrode layer 56 is embedded across the region separating insulating layer 55 in the region separating trench 54. Specifically, the region separating electrode layer 56 is embedded in the recess space demarcated by the region separating insulating layer 55 in the region separating trench 54. The region separating electrode layer 56 may contain a conductive polysilicon. The region separating electrode layer 56 is controlled by the emitter signal.

The region separating electrode layer 56 is formed to a wall shape extending along the normal direction Z in sectional view. The region separating electrode layer 56 has an upper end portion positioned at the opening side of the region separating trench 54. The upper end portion of the region separating electrode layer 56 is positioned at the bottom wall side of the region separating trench 54 with respect to the first main surface 3.

A depression depressed toward the bottom wall of the region separating trench 54 is formed at the upper end portion of the region separating electrode layer 56. The depression at the upper end portion of the region separating electrode layer 56 is formed to a convergent shape directed toward the bottom wall of the region separating trench 54. The upper end portion of the region separating electrode layer 56 has a constricted portion constricted along the third region 55c of the region separating insulating layer 55.

Referring to FIG. 9 to FIG. 12, each diode region 9 includes an n$^+$-type cathode region 61 (second impurity region) formed in a surface layer portion of the second main surface 4 of the semiconductor layer 2. An n-type impurity concentration of the cathode region 61 is greater than the n-type impurity concentration of the drift region 30. The n-type impurity concentration of the cathode region 61 may be not less than $1.0\times10^{19}$ cm$^{-3}$ and not more than $1.0\times10^{20}$ cm$^{-3}$.

The cathode regions 61 are exposed from the second main surface 4. The cathode regions 61 form ohmic contacts with the collector terminal electrode 32. At sides along the second direction Y, the cathode regions 61 are electrically connected to the collector region 34. In this embodiment, the cathode regions 61 are surrounded by the collector region 34 of the IGBT regions 8. That is, the cathode regions 61 are electrically connected to the collector region 34 at the sides along the first direction X and the sides along the second direction Y.

Each diode region 9 includes p$^-$-type anode regions 62 (first impurity regions) formed in surface layer portions of the first main surface 3 of the semiconductor layer 2. A p-type impurity concentration of the anode regions 62 may be not more than the p-type impurity concentration of the body regions 45. The p-type impurity concentration of the anode regions 62 is preferably less than the p-type impurity concentration of the body regions 45. The p-type impurity concentration of the anode regions 62 may be not less than $1.0\times10^{15}$ cm$^{-3}$ and not more than $1.0\times10^{18}$ cm$^{-3}$.

Each anode region 62 forms a pn-junction with the semiconductor layer 2. A pn-junction diode having the anode region 62 as an anode and the semiconductor layer 2 (cathode region 61) as a cathode is thereby formed. In this embodiment, a plurality of the anode regions 62 are formed at intervals along the first direction X in plan view. The plurality of anode regions 62 are respectively formed as bands extending along the second direction Y in plan view. The plurality of anode regions 62 are formed in stripes as a whole.

The anode regions 62 overlap with the cathode regions 61 in the normal direction Z. In this embodiment, all of the plurality of anode regions 62 overlap with the cathode regions 61 in the normal direction Z. Bottom portions of the anode regions 62 are formed in regions between the first main surface 3 and the bottom walls of the gate trenches 39 in regard to the normal direction Z.

A distance between two anode regions 62 that are mutually adjacent in the first direction X may be not less than 0.5 μm and not more than 3 μm. The distance between two anode regions 62 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm.

In regard to the second direction Y, the length of the anode regions 62 may be not more than the length of the trench gate structures 36. The length of the anode regions 62 may be less than the length of the trench gate structures 36.

Each diode region 9 includes anode separating structures 63 that demarcate the anode regions 62 from other regions. In FIG. 6 and FIG. 8, the anode separating structures 63 are shown with hatching. Specifically, each diode region 9 includes a plurality of the anode separating structures 63 that respectively demarcate the plurality of anode regions 62.

The plurality of anode separating structures 63 are respectively formed in regions between a plurality of the anode regions 62 that are mutually adjacent. Specifically, the plurality of anode separating structures 63 are each formed to an annular shape (quadrilateral annular shape in this embodiment) that surrounds an anode region 62 in plan view. An anode separating structure 63 that demarcates an anode region 62 at one side and an anode separating structure 63 that demarcates an anode region 62 at another side are formed integrally in a region between the plurality of anode regions 62 that are mutually adjacent.

Each anode separating structure 63 includes an anode separating trench 64, an anode separating insulating layer 65, and an anode separating electrode layer 66. The anode separating trench 64 is formed in the first main surface 3. The anode separating trench 64 includes side walls and a bottom wall. The side walls of the anode separating trench 64 may be formed perpendicular to the first main surface 3.

The side walls of the anode separating trench 64 may be downwardly inclined from the first main surface 3 toward the bottom wall. The anode separating trench 64 may be formed to a tapered shape with which an opening area at an opening side is greater than a bottom area. The bottom wall of the anode separating trench 64 may be formed parallel to the first main surface 3. The bottom wall of the anode separating trench 64 may be formed to a shape curved toward the second main surface 4.

The anode separating trench 64 includes an opening edge portion. The opening edge portion connects the first main surface 3 and the side walls of the anode separating trench 64. The opening edge portion has an inclined portion that is downwardly inclined from the first main surface 3 toward the side walls of the anode separating trench 64. The inclined portion is formed to a curved shape that is depressed toward the second main surface 4. A wide portion having an opening width wider than an opening width at the bottom wall side is thereby formed at the opening side of the anode separating trench 64. The inclined portion may be formed to a curved shape that projects toward the second main surface 4 of the semiconductor layer 2.

The anode separating trench 64 includes a bottom wall edge portion. The bottom wall edge portion connects the side walls and the bottom wall of the anode separating trench 64. The bottom wall edge portion may be formed to a shape curved toward the second main surface 4.

A depth of the anode separating trench 64 may be not less than 2 μm and not more than 10 μm. The depth of the anode separating trench 64 may be not less than 2 μm and not more than 3 μm, not less than 3 μm and not more than 4 μm, not less than 4 μm and not more than 5 μm, not less than 5 μm and not more than 6 μm, not less than 6 μm and not more than 7 μm, not less than 8 μm and not more than 9 μm, or not less than 9 μm and not more than 10 μm. The depth of the anode separating trenches 64 may be equal to the depth of the gate trenches 39. The depth of the anode separating trenches 64 may be equal to the depth of the region separating trenches 54.

A width of each anode separating trench 64 may be not less than 0.5 μm and not more than 3 μm. The width of the anode separating trench 64 is a width of the anode separating trench 64 in the first direction X. The width of the anode separating trench 64 may be not less than 0.5 μm and not more than 1 μm, not less than 1 μm and not more than 1.5 μm, not less than 1.5 μm and not more than 2 μm, not less than 2 μm and not more than 2.5 μm, or not less than 2.5 μm and not more than 3 μm. The width of the anode separating trenches 64 may be equal to the width of the gate trenches 39. The width of the anode separating trenches 64 may be equal to the width of the region separating trenches 54.

The anode separating insulating layers 65 are formed as films along the inner walls of the anode separating trenches 64. The anode separating insulating layers 65 demarcate recess spaces inside the anode separating trenches 64. In this embodiment, each anode separating insulating layer 65 includes a silicon oxide film. The anode separating insulating layer 65 may also include a silicon nitride film in place of or in addition to the silicon oxide film.

A portion of each anode separating insulating layer 65 that covers a side wall (side wall extending along the second direction Y) of the corresponding anode separating trench 64 includes an upper end portion positioned at the opening side of the anode separating trench 64. The upper end portion of the anode separating insulating layer 65 is positioned at the bottom wall side of the anode separating trench 64 with respect to the first main surface 3.

The anode separating insulating layer 65 includes a first region 65a, a second region 65b, and a third region 65c. The first region 65a covers the side walls of the anode separating trench 64. The second region 65b covers the bottom wall of the anode separating trench 64. The upper end portion of the anode separating insulating layer 65 is formed by the second region 65b.

A thickness of the second region 65b may be not less than a thickness of the first region 65a. The thickness of the second region 65b may be greater than the thickness of the first region 65a. A portion of the second region 65b that is positioned at the opening side of the anode separating trench 64 may bulge toward the inside of the anode separating trench 64.

In this embodiment, the third region 65c covers the opening edge portion of the anode separating trench 64 at both end portions of the anode separating trench 64 in the second direction Y (see FIG. 12). The thickness of the third region 65c may be greater than the thickness of the first region 65a.

The third region 65c includes a bulging portion bulging into the anode separating trench 64 at the opening edge portion of the anode separating trench 64. The third region 65c protrudes curvingly toward the inside of the anode separating trench 64. The third region 65c narrows an opening of the anode separating trench 64 at the opening edge portion of the gate trench 39. Obviously, an anode separating insulating layer 65 having a uniform thickness may be formed instead.

The anode separating electrode layer 66 is embedded across the anode separating insulating layer 65 in the anode separating trench 64. Specifically, the anode separating electrode layer 66 is embedded in the recess space demarcated by the anode separating insulating layer 65 in the anode separating trench 64. The anode separating electrode layer 66 may contain a conductive polysilicon. The anode separating electrode layer 66 is controlled by the emitter signal.

The anode separating electrode layer 66 is formed to a wall shape extending along the normal direction Z in sectional view. The anode separating electrode layer 66 has an upper end portion positioned at the opening side of the anode separating trench 64. The upper end portion of the anode separating electrode layer 66 is positioned at the bottom wall side of the anode separating trench 64 with respect to the first main surface 3.

The upper end portion of the anode separating electrode layer 66 is formed to a convergent shape directed toward the first main surface 3. A depression depressed toward the bottom wall of the anode separating trench 64 is formed at the upper end portion of the anode separating electrode layer 66. The depression of the anode separating electrode layer 66 is formed to a convergent shape directed toward the bottom wall of the anode separating trench 64.

Inside the anode separating trench 64, a recess 67 is demarcated by the side walls of the anode separating trench 64, the upper end portion of the anode separating electrode layer 66, and the upper end portion of the anode separating insulating layer 65. The wide portion of the anode separating trench 64 is formed by the recess 67. Side walls of the recesses 67 (the side walls of the anode separating trenches 64) expose the anode regions 62.

Bottom portions of the anode regions 62 are formed in regions between the first main surface 3 and the bottom walls of the anode separating trenches 64 in regard to the normal direction Z. The bottom portions of the anode regions 62 are formed at the first main surface 3 side with respect to the bottom portions of the carrier storage regions 47 in regard to the normal direction Z.

The plurality of floating regions 52 include proximate floating regions 52A that are most proximate to the diode regions 9. In this embodiment, each proximate floating region 52A is demarcated from an FET structure 35 and an anode region 62 by an anode separating structure 63.

An entirety of each proximate floating region 52A overlaps with the collector region 34 in the normal direction Z. That is, the anode separating structure 63 that demarcates the proximate floating region 52A overlaps with the collector region 34 in the normal direction Z. In this embodiment, a boundary between an IGBT region 8 and a diode region 9 is demarcated by a portion of an anode separating structure 63 that extends in a region between a proximate floating region 52A and an anode region 62.

Obviously, each proximate floating region 52A may be demarcated from an FET structure 35 and an anode region 62 by a region separating trench structure 53 in place of an anode separating structure 63. In this case, a boundary between an IGBT region 8 and a diode region 9 is demarcated by a portion of a region separating trench structure 53 that extends in a region between a proximate floating region 52A and an anode region 62.

The proximate floating regions 52A may be omitted. In this case, a boundary between an IGBT region 8 and a diode region 9 is demarcated by a portion of an anode separating structure 63 that extends in a region between an FET structure 35 and an anode region 62.

Referring to FIG. 9 to FIG. 12, the semiconductor device 1 includes an interlayer insulating layer 79 formed on the first main surface 3 of the semiconductor layer 2. The interlayer insulating layer 79 is formed as film along the first main surface 3 and selectively covers the first main surface 3. Specifically, the interlayer insulating layer 79 selectively covers the IGBT regions 8 and the diode regions 9.

The interlayer insulating layer 79 may contain silicon oxide or silicon nitride. The interlayer insulating layer 79 may contain at least one type of material among NSG (non-doped silicate glass), PSG (phosphor silicate glass), and BPSG (boron phosphor silicate glass).

A thickness of the interlayer insulating layer 79 may be not less than 0.1 µm and not more than 1 µm. The thickness of the interlayer insulating layer 79 may be not less than 0.1 µm and not more than 0.2 µm, not less than 0.2 µm and not more than 0.4 µm, not less than 0.4 µm and not more than 0.6 µm, not less than 0.6 µm and not more than 0.8 µm, or not less than 0.8 µm and not more than 1 µm.

In this embodiment, the interlayer insulating layer 79 has a laminated structure that includes a first insulating layer 80, a second insulating layer 81, and a third insulating layer 82 that are laminated in that order from the first main surface 3 side. The first insulating layer 80 preferably contains silicon oxide (for example, a thermal oxide film). The second insulating layer 81 preferably includes an NGS layer. The second insulating layer 81 may include a PSG layer or a BPSG layer in place of an NGS layer. The third insulating layer 82 preferably includes a BPSG layer. The third insulating layer 82 may include an NGS layer or a PSG layer in place of a BPSG layer. The third insulating layer 82 preferably contains an insulating material with a property different from that of the second insulating layer 81.

The first insulating layer 80 is formed as a film on the first main surface 3. The first insulating layer 80 is continuous to the gate insulating layers 40, the region separating insulating layers 55, and the anode separating insulating layers 65. The second insulating layer 81 is formed as film on the first insulating layer 80. The third insulating layer 82 is formed as a film on the second insulating layer 81.

A thickness of the first insulating layer 80 may be not less than 500 Å and not more than 2000 Å. The thickness of the first insulating layer 80 may be not less than 500 Å and not more than 1000 Å, not less than 1000 Å and not more than 1500 Å, or not less than 1500 Å and not more than 2000 Å.

A thickness of the second insulating layer 81 may be not less than 500 Å and not more than 4000 Å. The thickness of the second insulating layer 81 may be not less than 500 Å and not more than 1000 Å, not less than 1000 Å and not more than 1500 Å, not less than 1500 Å and not more than 2000 Å, not less than 2000 Å and not more than 2500 Å, not less than 2500 Å and not more than 3000 Å, not less than 3000 Å and not more than 3500 Å, or not less than 3500 Å and not more than 4000 Å.

A thickness of the third insulating layer 82 may be not less than 1000 Å and not more than 8000 Å. The thickness of the third insulating layer 82 may be not less than 1000 Å and not more than 2000 Å, not less than 2000 Å and not more than 4000 Å, not less than 4000 Å and not more than 6000 Å, or not less than 6000 Å and not more than 8000 Å.

Referring to FIG. 11, the gate electrode layers 41 of the FET structures 35 have gate lead-out electrode layers 41a that are led out from gate trenches 39 onto the first main surface 3. The gate lead-out electrode layers 41a are led out from the gate trenches 39 of the first outer trench gate structures 37 onto the first main surface 3. The gate lead-out electrodes 41a are led out along the second direction Y.

Specifically, the gate lead-out electrode layers 41a are formed in an interior of the interlayer insulating layer 79. The gate lead-out electrode layers 41a are led out onto the first insulating layer 80 and is interposed in regions between the first insulating layer 80 and the second insulating layer 81. The gate lead-out electrode layers 41a are electrically connected to the gate wiring 19 in an unillustrated region. The gate signal applied to the gate terminal electrode 14 is transmitted to the gate electrode layers 41 via the gate wiring 19 and the gate lead-out electrode layers 41*a*.

Referring to FIG. 11, the region separating electrode layers 56 of the region separating structures 50 have separating lead-out electrode layers 56*a* that are led out from the region separating trenches 54 onto the first main surface 3. The region separating electrode layers 56 are led out along the second direction Y.

Specifically, the separating lead-out electrode layers 56*a* are formed in the interior of the interlayer insulating layer 79. The separating lead-out electrode layers 56*a* are led out onto the first insulating layer 80 and are interposed in regions between the first insulating layer 80 and the second insulating layer 81. The separating lead-out electrode layers 56*a* are electrically connected to the emitter terminal electrode 13. The emitter signal applied to the separating lead-out electrode layers 56*a* is transmitted to the region separating electrode layers 56 via the separating lead-out electrode layers 56*a*.

Referring to FIG. 12, the anode separating electrode layers 66 of the anode separating structures 63 have anode lead-out electrode layers 66*a* that are led out from the anode separating trenches 64 onto the first main surface 3. The anode lead-out electrode layers 66*a* are led out along the second direction Y.

Specifically, the anode lead-out electrode layers 66*a* are formed in the interior of the interlayer insulating layer 79. The anode lead-out electrode layers 66*a* are led out onto the first insulating layer 80 and are interposed in regions between the first insulating layer 80 and the second insulating layer 81. The anode lead-out electrode layers 66*a* are electrically connected to the emitter terminal electrode 13. The emitter signal applied to the anode lead-out electrode layers 66*a* is transmitted to the anode separating electrode layers 66 via the anode lead-out electrode layers 66*a*.

Referring to FIG. 9 and FIG. 10, the interlayer insulating layer 79 has emitter openings 83. The emitter openings 83 expose the emitter trenches 48. The emitter openings 83 are in communication with the emitter trenches 48. In this embodiment, the emitter trenches 48 are formed in the first main surface 3 upon penetrating through the first insulating layer 80 and the second insulating layer 81.

Each emitter opening 83 penetrates through the third insulating layer 82 to expose an emitter trench 48. The emitter opening 83 forms a single opening with the emitter trench 48. An opening edge portion of the emitter opening 83 is formed to a shape curved toward the inside of the interlayer insulating layer 79. The emitter opening 83 thereby has an opening width greater than an opening width of the emitter trench 48.

Referring to FIG. 10 and FIG. 12, the interlayer insulating layer 79 includes diode openings 84. The diode openings 84 expose the diode regions 9. Specifically, each diode opening 84 penetrates through the interlayer insulating layer 79 to expose a plurality of anode regions 62 and a plurality of anode separating structures 63.

A portion of an inner wall of each diode opening 84 that extends along the second direction Y may be positioned above an anode region 62. The portion of the inner wall of the diode opening 84 that extends along the second direction Y may be positioned above an anode separating structure 63. In this embodiment, the portion of the inner wall of the diode opening 84 that extends along the second direction Y is positioned above an anode region 62 most proximate to a proximate floating region 52A.

The interlayer insulating layer 79 may cover one or a plurality of anode regions 62. The interlayer insulating layer 79 may cover not less than one and not more than five anode regions 62. The interlayer insulating layer 79 may cover one or a plurality of anode separating structures 63. The interlayer insulating layer 79 may cover not less than one and not more than five anode separating structures 63. The diode openings 84 may expose all of the anode regions 62. Each diode opening 84 may expose a portion or an entirety of a proximate floating region 52A.

The interlayer insulating layer 79 includes first openings 86. The first openings 86 expose the separating lead-out electrode layers 56*a* in the IGBT regions 8. Each first opening 86 is formed such as to become narrow in opening width from an opening side to a bottom wall side.

The interlayer insulating layer 79 includes second openings 87. The second openings 87 expose the anode lead-out electrode layers 66*a* in the diode regions 9. Each second opening 87 is formed such as to become narrow in opening width from an opening side to a bottom wall side.

Referring to FIG. 9 and FIG. 10, the semiconductor device 1 has emitter plug electrodes 91 embedded in portions of the interlayer insulating layer 79 that cover the IGBT regions 8. The emitter plug electrodes 91 penetrate through the interlayer insulating layer 79 and are electrically connected to the emitter regions 46 and the collector regions 49. Specifically, the emitter plug electrodes 91 are embedded in the emitter trenches 48. The emitter plug electrodes 91 are electrically connected to the emitter regions 46 and the collector regions 49 inside the emitter trenches 48.

In this embodiment, each emitter plug electrode 91 has a laminated structure that includes a barrier electrode layer 92 and a main electrode layer 93. The barrier electrode layer 92 is formed as a film along inner walls of the corresponding emitter trench 48 such as to contact the interlayer insulating layer 79. The barrier electrode layer 92 demarcates a recess space inside the emitter trench 48.

The barrier electrode layer 92 may have a single layer structure that includes a titanium layer or a titanium nitride layer. The barrier electrode layer 92 may have a laminated structure that includes a titanium layer and a titanium nitride layer. In this case, the titanium nitride layer may be laminated on the titanium layer.

The main electrode layer 93 is embedded in the emitter trench 48 across the barrier electrode layer 92. Specifically, the main electrode layer 93 is embedded in the recess space demarcated in the emitter trench 48 by the barrier electrode layer 92. The main electrode layer 93 may contain tungsten.

Referring to FIG. 11, the semiconductor device 1 includes first plug electrodes 94 embedded in the first openings 86. The first plug electrodes 94 are electrically connected to the separating lead-out electrode layers 56*a* inside the first openings 86. The first plug electrodes 94 have a structure corresponding to the emitter plug electrodes 91. Description of the emitter plug electrodes 91 applies to description concerning the first plug electrodes 94.

Structures in the first plug electrodes 94 corresponding to the structures described for the emitter plug electrodes 91 shall be provided with the same reference signs and description thereof shall be omitted.

Referring to FIG. 12, the semiconductor device 1 includes second plug electrodes 95 embedded in the second openings 87. The second plug electrodes 95 are electrically connected to the anode lead-out electrode layers 66*a* inside the second openings 87. The second plug electrodes 95 have a structure corresponding to the emitter plug electrodes 91. Description of the emitter plug electrodes 91 applies to description concerning the second plug electrodes 95. Structures in the second plug electrodes 95 corresponding to the structures described for the emitter plug electrodes 91 shall be provided with the same reference signs and description thereof shall be omitted.

Referring to FIG. 9 to FIG. 12, the emitter terminal electrode 13 described above is formed on the interlayer insulating layer 79. The emitter terminal electrode 13 may contain at least one type of material among aluminum, copper, aluminum-silicon-copper alloy, aluminum-silicon alloy, and aluminum-copper alloy.

The emitter terminal electrode 13 may have a single layer structure that contains one type of any of the above conductive materials. The emitter terminal electrode 13 may have a laminated structure in which at least two types among the above conductive materials are laminated in any order. In this embodiment, the emitter terminal electrode 13 is constituted of an aluminum-silicon-copper alloy.

The emitter terminal electrode 13 is electrically connected to the emitter regions 46 and the contact regions 49 via the emitter plug electrodes 91 on the interlayer insulating layer 79. Specifically, the emitter terminal electrode 13 enters into the emitter openings 83 from above the interlayer insulating layer 79. The emitter terminal electrode 13 is electrically connected to the emitter plug electrodes 91 inside the emitter openings 83. The emitter terminal electrode 13 is thereby electrically connected to the emitter regions 46 and the contact regions 49 via the emitter plug electrodes 91.

Referring to FIG. 10 and FIG. 12, the emitter terminal electrode 13 further enters into the diode openings 84 from above the interlayer insulating layer 79 and via the inner walls of the diode openings 84. The emitter terminal electrode 13 functions as an anode terminal electrode in the diode regions 9.

The emitter terminal electrode 13 contacts the inner walls of the diode openings 84. The emitter terminal electrode 13 is electrically connected to the anode regions 62 in the diode openings 84. The emitter terminal electrode 13 is electrically connected to the anode separating electrode layers 66 in the diode openings 84. In this embodiment, the emitter terminal electrode 13 is directly connected to the anode regions 62 and the anode separating electrode layers 66.

Specifically, inside each diode opening 84, the emitter terminal electrode 13 enters into the recesses 67 (anode separating trenches 64) from above the first main surface 3. The emitter terminal electrode 13 is connected to the anode separating electrode layers 66 inside the recesses 67. Also, the emitter terminal electrode 13 is connected to the anode regions 62 on the first main surface 3 and inside the recesses 67. The emitter terminal electrode 13 forms ohmic contacts with the anode regions 62.

An angle $\theta$ that an inner wall of the diode opening 84 forms with the first main surface 3 is preferably not less than 45° and not more than 90°. The angle $\theta$ is an angle that the inner wall of the diode opening 84 forms with the first main surface 3 inside a covering portion of the interlayer insulating layer 79 that covers the first main surface 3.

Specifically, the angle $\theta$ is an angle that a line joining an apex portion and a base portion of the inner wall of the diode opening 84 respectively positioned at an opening side of the diode opening 84 and positioned at a bottom portion side of the diode opening 84 forms with the first main surface 3 inside the interlayer insulating layer 79.

The angle $\theta$ may be not less than 45° and not more than 50°, not less than 50° and not more than 55°, not less than 55° and not more than 60°, not less than 60° and not more than 65°, not less than 65° and not more than 70°, not less than 70° and not more than 75°, not less than 75° and not more than 80°, not less than 80° and not more than 85°, or not less than 85° and not more than 90°. The angle $\theta$ is preferably not less than 60° and not more than 90°.

When the angle $\theta$ is less than 45°, thin film portions are formed in portions of the interlayer insulating layer 79 that cover the diode regions 9. When the thin film portions are formed in the interlayer insulating layer 79, the emitter terminal electrode 13 opposes the first main surface 3 (the anode regions 62 and/or the anode separating electrode layers 66) across the thin film portions of the interlayer insulating layer 79. In this case, there is a possibility that as a consequence of electric field concentrating at the thin film portions of the interlayer insulating layer 79, dielectric breakdown tolerance decreases with the thin film portions of the interlayer insulating layer 79 as starting points.

Thus, in this embodiment, the inner walls of the diode openings 84 are formed such that the angle $\theta$ is not less than 45° (preferably not less than 60°) to suppress the forming of the thin film portions in the interlayer insulating layer 79. Decrease in dielectric breakdown tolerance due to undesirable electric field concentration can thereby be suppressed.

Referring to FIG. 11 and FIG. 12, the emitter terminal electrode 13 is electrically connected to the first plug electrodes 94 and the second plug electrodes 95, respectively, on the interlayer insulating layer 79. The emitter signal is transmitted to the region separating electrode layers 56 via the first plug electrodes 94. The emitter signal is transmitted to the anode separating electrode layers 66 via the second plug electrodes 95.

Although specific illustration shall be omitted, if a lead wire (for example, a bonding wire) is to be connected to the emitter terminal electrode 13, a single layer electrode constituted of a nickel layer or a gold layer or a laminated electrode that includes a nickel layer and a gold layer may be formed on the emitter terminal electrode 13. In the laminated electrode, the gold layer may be formed over the nickel layer.

Although specific illustration shall be omitted, the gate terminal electrode 14, the first sense terminal electrode 15, the second sense terminal electrode 16, the current detection terminal electrode 17, and the open terminal electrode 18 are formed, like the emitter terminal electrode 13, on the interlayer insulating layer 79.

The plurality of terminal electrodes 14 to 18 may each contain at least one type of material among aluminum, copper, aluminum-silicon-copper alloy, aluminum-silicon alloy, and aluminum-copper alloy. The plurality of terminal electrodes 14 to 18 may each have a single layer structure that contains one type of any of the above conductive materials. The plurality of terminal electrodes 14 to 18 may each have a laminated structure in which at least two types among the above conductive materials are laminated in any order. In this embodiment, the plurality of terminal electrodes 14 to 18 each contains the same conductive material as that of the emitter terminal electrode 13.

If a lead wire (for example, a bonding wire) is to be connected to each of the plurality of terminal electrodes 14 to 18, a single layer electrode constituted of a nickel layer or a gold layer or a laminated electrode that includes a nickel layer and a gold layer may be formed on each of the plurality of terminal electrodes 14 to 18. In the laminated electrode, the gold layer may be formed over the nickel layer.

Figure 13:
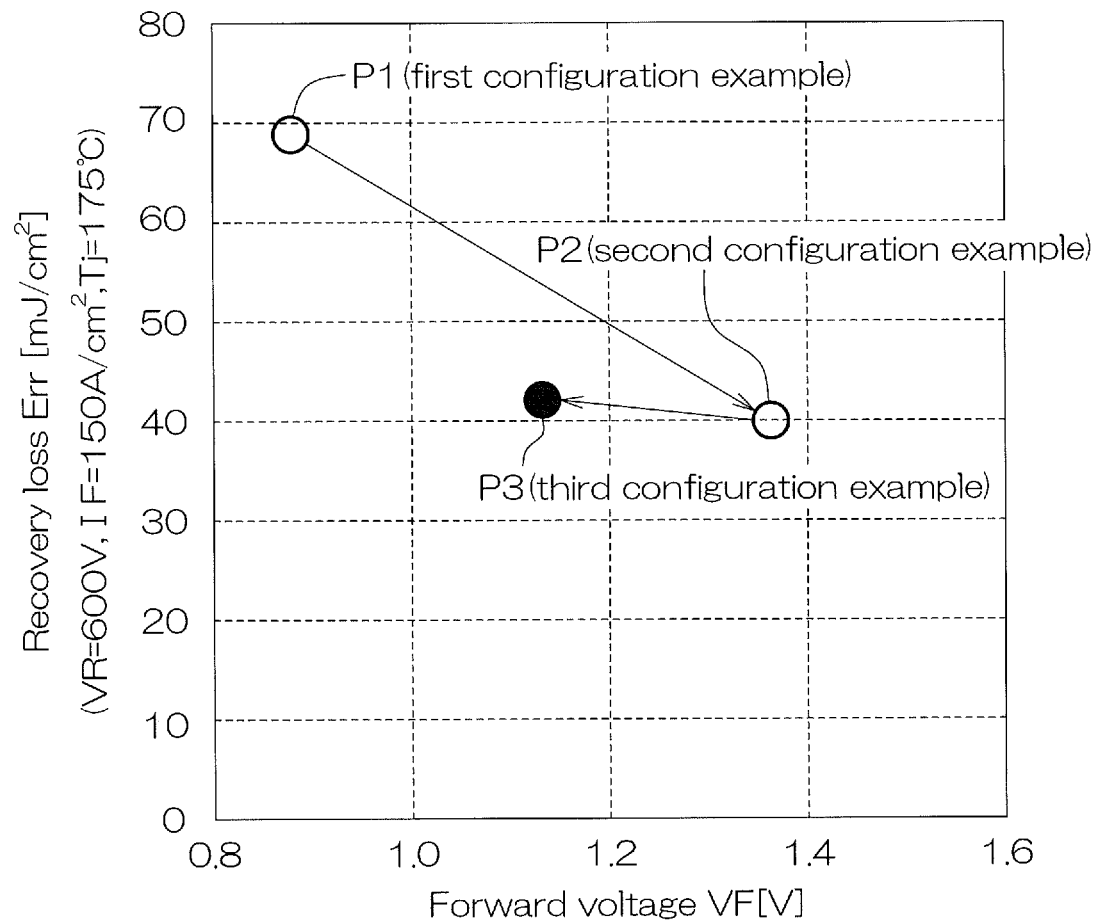
FIG. 13 is a graph of results of examining a relationship between a recovery loss and a forward voltage by a simulation.

FIG. 13 is a graph of results of examining a relationship of a recovery loss Err and a forward voltage VF by a simulation. In FIG. 13, the ordinate indicates the recovery loss Err [mJ·cm$^{-2}$] and the abscissa indicates the forward voltage VF [V]. A first plotted point P1, a second plotted point P2, and a third plotted point P3 are shown in FIG. 13.

The first plotted point P1 represents a characteristic of a first configuration example of the semiconductor device 1. The first configuration example has a structure in which the p-type impurity concentration of the anode regions 62 is equal to the p-type impurity concentration of the body regions 45 and the emitter terminal electrode 13 is electrically connected via a barrier electrode layer to the anode regions 62. The barrier electrode layer may have, like the barrier electrode layers 92, a single layer structure that includes a titanium layer or a titanium nitride layer or a laminated structure that includes a titanium layer and a titanium nitride layer.

The second plotted point P2 represents a characteristic of a second configuration example of the semiconductor device 1. The second configuration example has a structure in which the p-type impurity concentration of the anode regions 62 is less than the p-type impurity concentration of the body regions 45 and the emitter terminal electrode 13 is electrically connected via a barrier electrode layer to the anode regions 62. The barrier electrode layer may have, like the barrier electrode layer 92, a single layer structure that includes a titanium layer or a titanium nitride layer or a laminated structure that includes a titanium layer and a titanium nitride layer.

The third plotted point P3 represents a characteristic of a third configuration example of the semiconductor device 1. The third configuration example has a structure in which the p-type impurity concentration of the anode regions 62 is less than the p-type impurity concentration of the body regions 45 and the emitter terminal electrode 13 is directly connected to the anode regions 62 without interposition of the barrier electrode layer. The third plotted point P3 is also a characteristic of the semiconductor device 1.

Referring to the first plotted point P1, the first configuration example, while having a comparatively low forward voltage VF, has a comparatively high recovery loss Err. With the first configuration example, the recovery loss Err was 69 $mJ \cdot cm^{-2}$ and the forward voltage VF was 0.88 V.

Referring to the second plotted point P2, in comparison to the first configuration example, the recovery loss Err decreased and the forward voltage VF increased with the second configuration example. With the second configuration example, the recovery loss Err was 40 $mJ \cdot cm^{-2}$ and the forward voltage VF was 1.38 V.

Referring to the third plotted point P3, in comparison to the first configuration example, the recovery loss Err decreased and the forward voltage VF increased with the third configuration example. In comparison to the second configuration example, the recovery loss Err increased and the forward voltage VF decreased with the third configuration example. In the third configuration example, the recovery loss Err was 42 $mJ \cdot cm^{-2}$ and the forward voltage VF was 1.13 V.

In the first configuration example, the p-type impurity concentration of the anode regions 62 is equal to the p-type impurity concentration of the body regions 45. An ohmic property of the barrier electrode layer with respect to the anode regions 62 is thereby improved and therefore, a satisfactory forward voltage VF is achieved. However, with the first configuration example, there is a tradeoff that the recovery loss Err is increased due to the anode regions 62 being made high in concentration.

With the second configuration example, the recovery loss Err is decreased due to lowering of concentration of the anode regions 62. However, with the second configuration example, since the ohmic property of the barrier electrode layer with respect to the anode regions 62 is decreased due to the lowering of concentration of the anode regions 62, there is a tradeoff that the forward voltage VF increases.

With the third configuration example, the recovery loss Err is decreased due to lowering of concentration of the anode regions 62. With the third configuration example, there is no decrease in ohmic property due to the barrier electrode layer because the emitter terminal electrode 13 is directly connected to the anode region 62. The emitter terminal electrode 13 forms a comparatively satisfactory ohmic contact with the anode regions 62. The recovery loss Err can thereby be reduced while suppressing increase in the forward voltage VF.

From the graph of FIG. 13, it was found that if a comparative low recovery loss Err is required, the structure according to the second configuration example or the structure according to the third configuration example is preferable. It was also found that if a comparatively low forward voltage VF and a comparative low recovery loss Err are required, the structure according to the third configuration example is preferable.

It may be considered to directly connect the emitter terminal electrode 13 to the emitter regions 46 and the contact regions 49 in the IGBT regions 8. However, in this case, the barrier electrode layer 92 is not present and therefore, interdiffusion of constituent material occurs between the semiconductor layer 2 and the emitter terminal electrode 13. In particular, if the emitter terminal electrode 13 contains aluminum, the aluminum diffuses into the semiconductor layer 2 to cause changes in IGBT characteristics such as change in gate threshold voltage, etc.

Also in this case, there is a need to appropriately embed the emitter terminal electrode 13 in the emitter trenches 48 and there is thus a problem that a comparatively advanced manufacturing condition is required. That is, the emitter trenches 48 are introduced due to the plurality of trench gate structures 36 being made narrow in pitch.

With the structure where the plurality of trench gate structures 36 are made narrow in pitch, contact areas with respect to the emitter regions 46 and the contact regions 49 are reduced. The emitter trenches 48 are formed to reliably achieve contacts with the emitter regions 46 and the contact regions 49 in such a narrow pitch structure.

Due to being formed in regions between trench gate structures 36 that are mutually adjacent, the emitter trenches 48 are comparatively narrow in width. A comparatively advanced manufacturing condition is required to embed the emitter terminal electrode 13 in the comparatively narrow emitter trenches 48 while connecting the anode regions 62 to the emitter terminal electrode 13.

Thus, in this embodiment, the emitter plug electrodes 91 are embedded in the emitter trenches 48. Each emitter plug electrode 91 has the laminated structure that includes the barrier electrode layer 92 containing titanium and/or titanium nitride and the main electrode layer 93 containing tungsten.

Titanium and/or titanium nitride have properties of being excellent in thin film property and film forming property. On the other hand, tungsten has a property of being excellent in embedding property. The emitter plug electrodes 91 can thereby be embedded appropriately in the emitter trenches 48.

Further, the barrier electrode layer 92 suppresses the conductive material of the emitter terminal electrode 13 and the conductive material of the main electrode layers 93 from diffusing into the semiconductor layer 2. The emitter terminal electrode 13 can thereby be electrically connected appropriately to the emitter regions 46 and the contact regions 49 via the emitter plug electrodes 91.

On the other hand, the diode regions 9, unlike the IGBT regions 8, do not have a complex structure and therefore do not require an advanced manufacturing condition. As shown in FIG. 13, with the diode regions 9, even if the emitter terminal electrode 13 is directly connected to the anode regions 62 without the interposition of the barrier electrode layer, the recovery loss Err can be suppressed while suppressing increase in the forward voltage VF. Diode characteristics can thus be improved appropriately while suppressing changes in IGBT characteristics.

Figure 14:
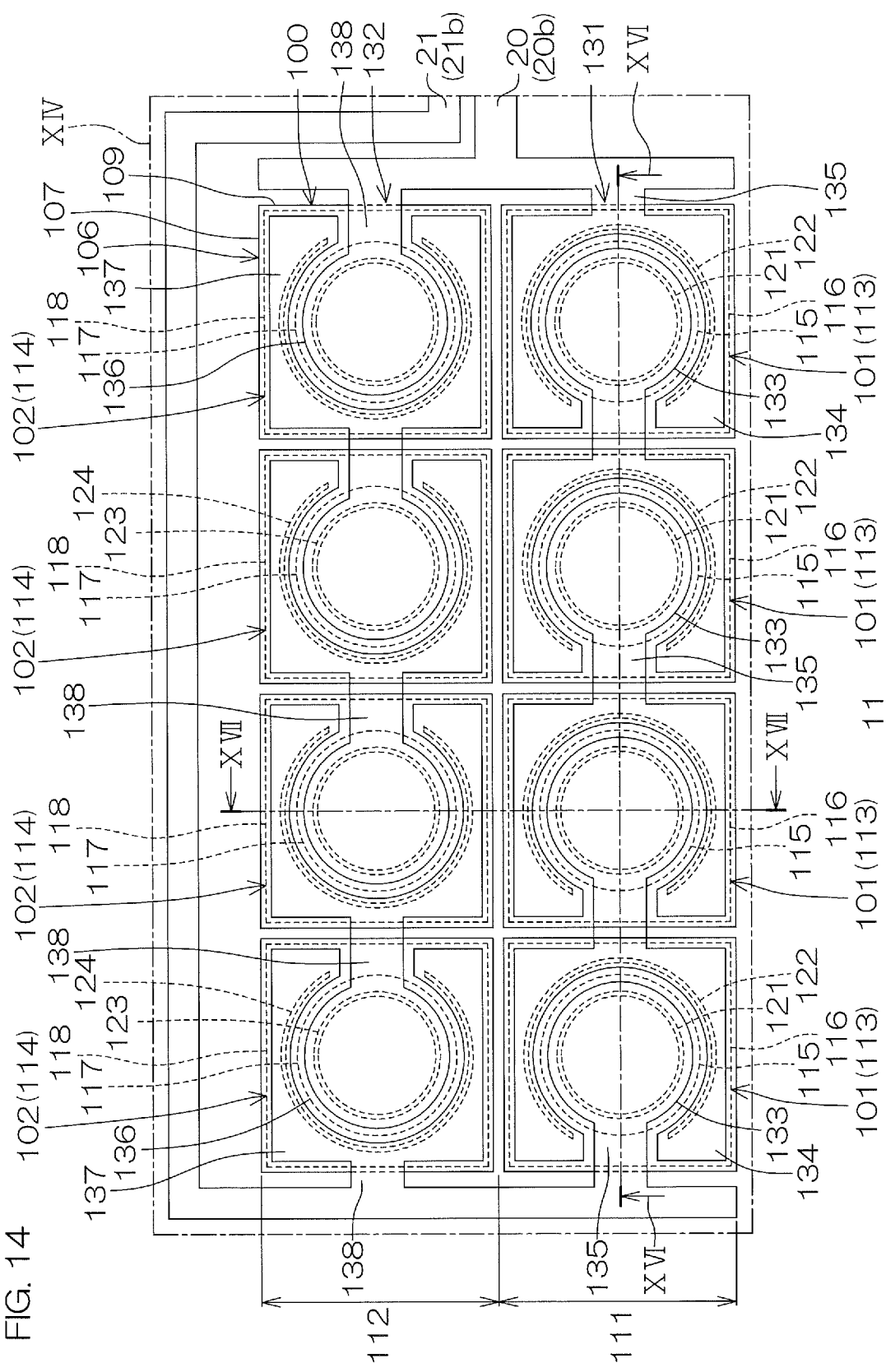
FIG. 14 is an enlarged view of a region XIV shown in FIG. 1.
Figure 15:
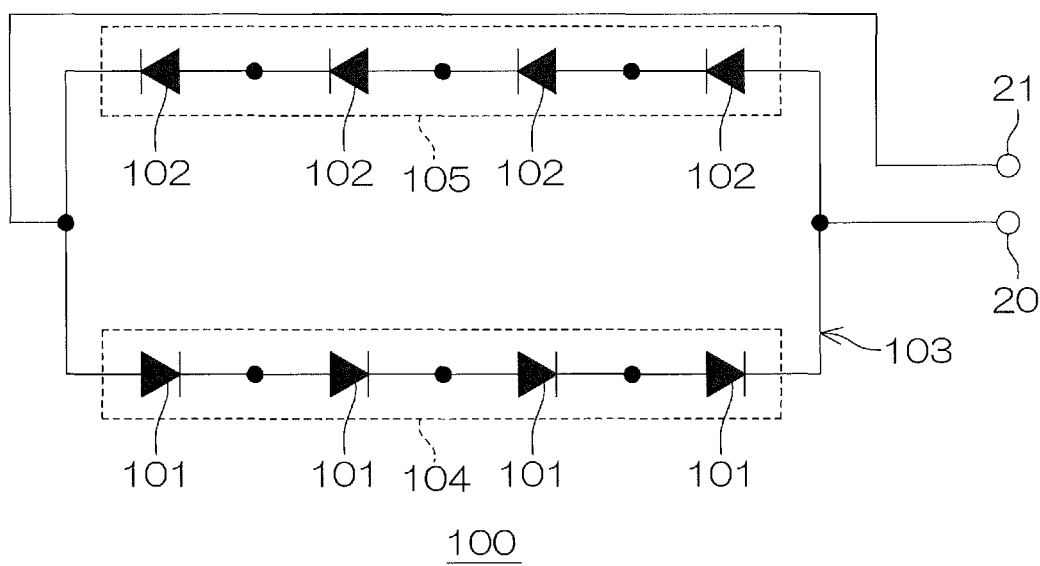
FIG. 15 is a circuit diagram of an electrical structure of the region shown in FIG. 14.
Figure 16:
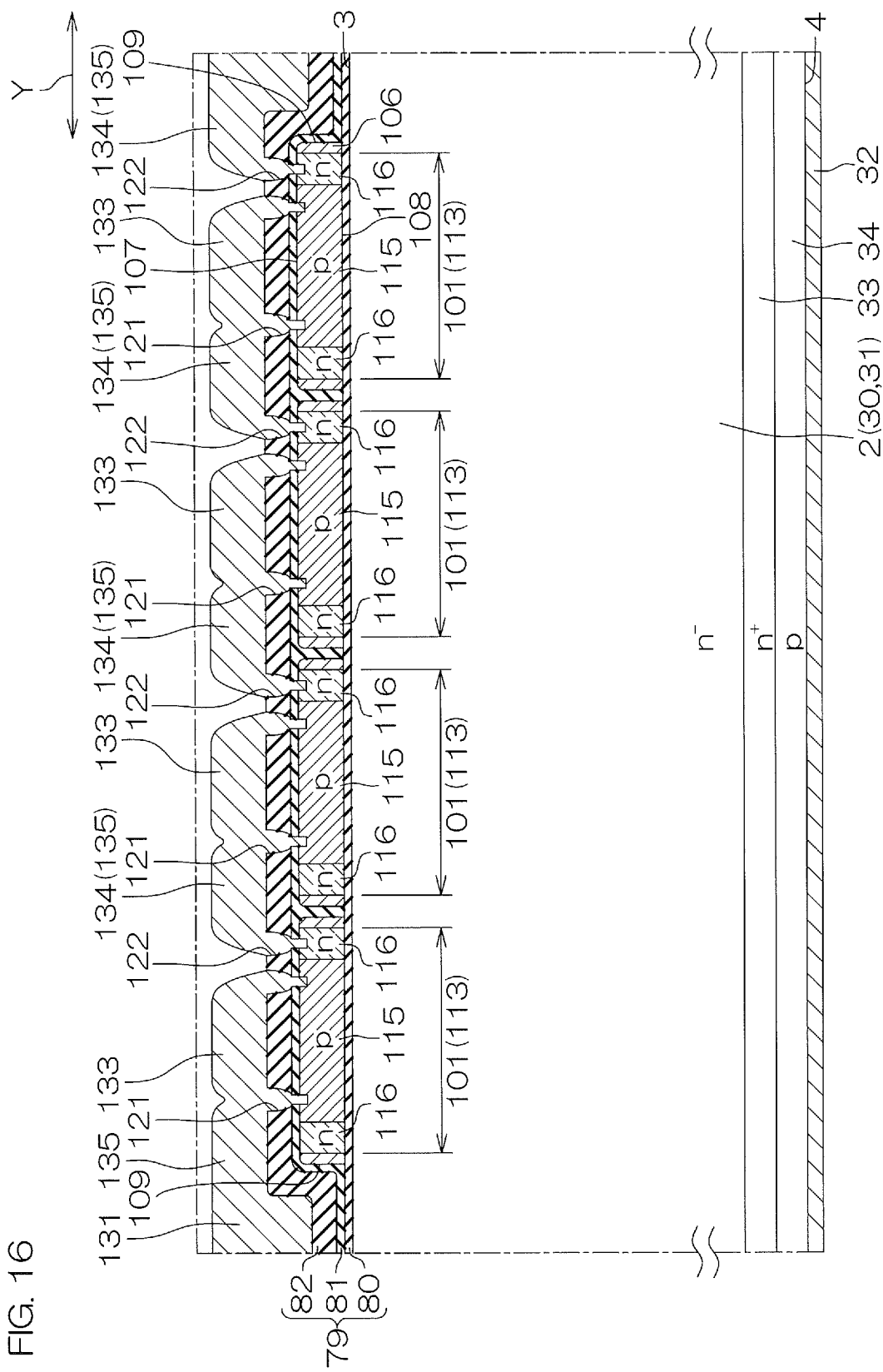
FIG. 16 is a sectional view taken along line XVI-XVI shown in FIG. 14.
Figure 17:
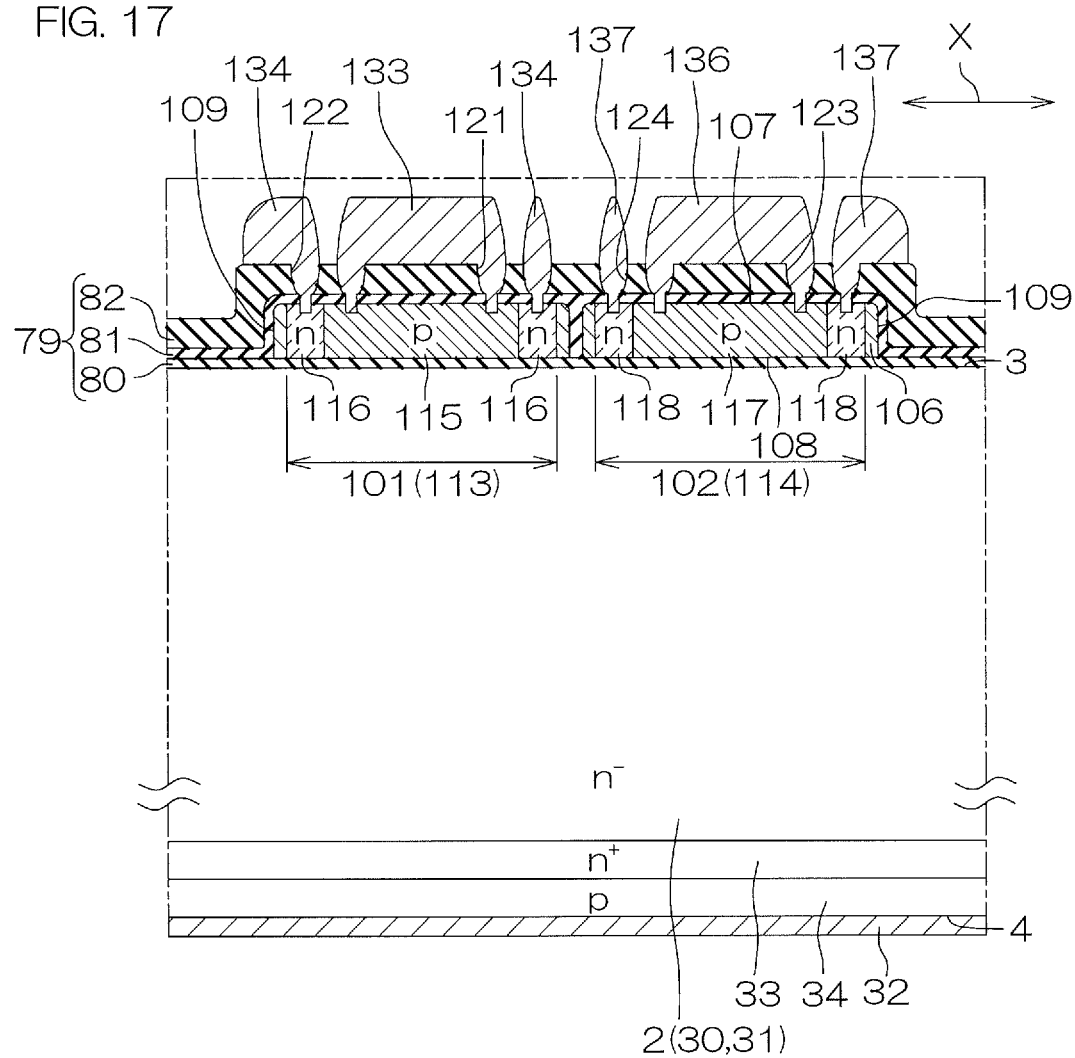
FIG. 17 is a sectional view taken along line XVII-XVII shown in FIG. 14.

FIG. 14 is an enlarged view of a region XIV shown in FIG. 1. FIG. 15 is a circuit diagram of the electrical structure of the region shown in FIG. 14. FIG. 16 is a sectional view taken along line XVI-XVI shown in FIG. 14. FIG. 17 is a sectional view taken along line XVII-XVII shown in FIG. 14.

Referring to FIG. 14 to FIG. 17, the sensor region 11 includes a temperature sensitive diode sensor 100 as an example of the temperature sensor. The temperature sensitive diode sensor 100 has a parallel circuit 103 that includes first diodes 101 and second diodes 102. The second diodes 102 are connected in reverse parallel with respect to the first diodes 101. That is, an anode of the second diodes 102 is connected to a cathode of the first diodes 101 and a cathode of the second diodes 102 is connect to an anode of the first diodes 101.

Specifically, the parallel circuit 103 has a configuration where a first series circuit 104 including a plurality (four in this embodiment) of the first diodes 101 that are connected in forward series and a second series circuit 105 including a plurality (four in this embodiment) of the second diodes 102 that are connected in forward series are connected in reverse parallel.

Referring to FIG. 16 and FIG. 17, the temperature sensitive diode sensor 100 includes a polysilicon layer 106 formed on the first main surface 3 of the semiconductor layer 2. The temperature sensitive diode sensor 100 is formed by selectively introducing an n-type impurity and a p-type impurity into the undoped polysilicon layer 106.

Specifically, the polysilicon layer 106 is formed on the first insulating layer 80. The polysilicon layer 106 has a first surface 107 at one side, a second surface 108 at another side, and side surfaces 109 connecting the first surface 107 and the second surface 108. The first surface 107 and the second surface 108 are formed to quadrilateral shapes (rectangular shapes in this embodiment) in plan view. The second surface 108 of the polysilicon layer 106 contacts the first insulating layer 80. The polysilicon layer 106 is electrically insulated from the semiconductor layer 2 by the first insulating layer 80.

A thickness of the polysilicon layer 106 may be not less than 0.2 μm and not more than 1 μm. The thickness of the polysilicon layer 106 may be not less than 0.2 μm and not more than 0.4 μm, not less than 0.4 μm and not more than 0.6 μm, not less than 0.6 μm and not more than 0.8 μm, or not less than 0.8 μm and not more than 1 μm.

The temperature sensitive diode sensor 100 includes a first circuit forming region 111 and a second circuit forming region 112 each formed in the polysilicon layer 106. The first circuit forming region 111 and the second circuit forming region 112 are set at an interval from each other along a short direction of the polysilicon layer 106 (the second direction Y in this embodiment).

In this embodiment, the first circuit forming region 111 includes a plurality (four in this embodiment) of first diode forming regions 113. The first diode forming regions 113 are regions in which the first diodes 101 are formed. The plurality of first diode forming regions 113 are set at intervals from each other along a long direction of the polysilicon layer 106 (the first direction X in this embodiment).

In this embodiment, each first diode forming region 113 is formed to a quadrilateral shape in plan view. Each first diode forming region 113 is demarcated as a cell from other regions by slits formed in the polysilicon layer 106. Each first diode forming region 113 may be demarcated from other regions by undoped regions of the polysilicon layer 106.

In this embodiment, the second circuit forming region 112 includes a plurality (four in this embodiment) of second diode forming regions 114. The second diode forming regions 114 are regions in which the second diodes 102 are formed. The plurality of second diode forming regions 114 are set at intervals from each other along the long direction of the polysilicon layer 106 (the first direction X in this embodiment).

In this embodiment, each second diode forming region 114 is formed to a quadrilateral shape in plan view. Each second diode forming region 114 is demarcated as a cell from other regions by slits formed in the polysilicon layer 106. Each second diode forming region 114 may be demarcated from other regions by undoped regions of the polysilicon layer 106.

Each first diode forming region 113 include a p-type first anode region 115 and an n-type first cathode region 116. The first anode region 115 is formed in a central portion of the first diode forming region 113. In this embodiment, the first anode region 115 is exposed from the first surface 107 and the second surface 108 of the polysilicon layer 106.

The first anode region 115 is formed to a circular shape in plan view. A planar shape of the first anode region 115 is arbitrary. The first anode region 115 may be formed to a triangular shape, a quadrilateral shape, a hexagonal shape or other polygonal shape or an elliptical shape in plan view.

The first cathode region 116 is formed along a peripheral edge of the first anode region 115. In this embodiment, the first cathode region 116 is formed to an annular shape surrounding the first cathode region 116 in plan view. In this embodiment, the first cathode region 116 is exposed from the first surface 107 and the second surface 108 of the polysilicon layer 106.

The first cathode region 116 is electrically connected to the first anode region 115. The first cathode region 116 is connected to the first anode region 115 across an entire thickness direction of the polysilicon layer 106. The first cathode region 116 forms a pn-junction portion with the first anode region 115. Each first diode forming region 113 thereby includes one first diode 101 having the first anode region 115 as an anode and the first cathode region 116 as a cathode.

Each second diode forming region 114 includes a p-type second anode region 117 and an n-type second cathode region 118. The second anode region 117 is formed in a central portion of the second diode forming region 114. In this embodiment, the second anode region 117 is exposed from the first surface 107 and the second surface 108 of the polysilicon layer 106.

The second anode region 117 is formed to a circular shape in plan view. A planar shape of the second anode region 117 is arbitrary. The second anode region 117 may be formed to a triangular shape, a quadrilateral shape, a hexagonal shape or other polygonal shape or an elliptical shape in plan view.

The second cathode region 118 is formed along a peripheral edge of the second anode region 117. In this embodiment, the second cathode region 118 is formed to an annular shape surrounding the second cathode region 118 in plan view. In this embodiment, the second cathode region 118 is exposed from the first surface 107 and the second surface 108 of the polysilicon layer 106.

The second cathode region 118 is electrically connected to the second anode region 117. The second cathode region 118 is connected to the second anode region 117 across the entire thickness direction of the polysilicon layer 106. The second cathode region 118 forms a pn-junction portion with the second anode region 117. Each second diode forming region 114 thereby includes one second diode 102 having the second anode region 117 as an anode and the second cathode region 118 as a cathode.

The interlayer insulating layer 79 described above covers the polysilicon layer 106. The interlayer insulating layer 79 includes first anode openings 121 and first cathode openings 122 at portions covering the respective first diode forming regions 113. The first anode openings 121 expose the first anode regions 115. The first anode openings 121 penetrate through the interlayer insulating layer 79 and are formed by digging into surface layer portions of the polysilicon layer 106. Bottom portions of the first anode openings 121 are positioned inside the first anode regions 115.

Each first anode opening 121 extends as a band along the peripheral edge of the first anode region 115 in plan view. Specifically, the first anode opening 121 is formed to a circular annular shape in plan view. A planar shape of the first anode opening 121 is arbitrary and not restricted to a circular annular shape. The first anode opening 121 may be formed to a triangular annular shape, a quadrilateral annular shape, a hexagonal annular shape or other polygonal annular shape or an elliptical annular shape or to a triangular shape, a quadrilateral shape, a hexagonal shape or other polygonal shape or an elliptical shape in plan view.

In this embodiment, one each of the first anode opening 121 is formed in each first diode forming region 113. The number of first anode openings 121 is arbitrary. Therefore, a plurality of the first anode openings 121 may be formed at intervals in each first diode forming region 113.

The first cathode openings 122 expose the first cathode regions 116 of the first diode forming regions 113. The first cathode openings 122 penetrate through the interlayer insulating layer 79 and are formed by digging into surface layer portions of the polysilicon layer 106. Bottom portions of the first cathode openings 122 are positioned inside the first cathode regions 116.

Each first cathode opening 122 extends as a band along the peripheral edge of the first anode region 115 in plan view. The first cathode opening 122 is formed to a C shape in plan view. A planar shape of the first cathode opening 122 is arbitrary and not restricted to a C shape. The first cathode opening 122 may be formed to a triangular shape, a quadrilateral shape, a hexagonal shape or other polygonal shape or an elliptical shape in plan view.

In this embodiment, one each of the first cathode opening 122 is formed in each first diode forming region 113. The number of first cathode openings 122 is arbitrary. Therefore, a plurality of the first cathode openings 122 may be formed at intervals in each first diode forming region 113.

The interlayer insulating layer 79 includes second anode openings 123 and second cathode openings 124 at portions covering the respective second diode forming regions 114. The second anode openings 123 expose the second anode regions 117. The second anode openings 123 penetrate through the interlayer insulating layer 79 and are formed by digging into surface layer portions of the polysilicon layer 106. Bottom portions of the second anode openings 123 are positioned inside the second anode regions 117.

Each second anode opening 123 extends as a band along the peripheral edge of the second anode region 117 in plan view. Specifically, the second anode opening 123 is formed to a circular annular shape in plan view. A planar shape of the second anode opening 123 is arbitrary and not restricted to a circular annular shape. The second anode opening 123 may be formed to a triangular annular shape, a quadrilateral annular shape, a hexagonal annular shape or other polygonal annular shape or an elliptical annular shape or to a triangular shape, a quadrilateral shape, a hexagonal shape or other polygonal shape or an elliptical shape in plan view.

In this embodiment, one each of the second anode opening 123 is formed in each second diode forming region 114. The number of second anode openings 123 is arbitrary. Therefore, a plurality of the second anode openings 123 may be formed at intervals in each second diode forming region 114.

The second cathode openings 124 expose the second cathode regions 118 of the second diode forming regions 114. The second cathode openings 124 penetrate through the interlayer insulating layer 79 and are formed by digging into surface layer portions of the polysilicon layer 106. Bottom portions of the second cathode openings 124 are positioned inside the second cathode regions 118.

Each second cathode opening 124 extends as a band along the peripheral edge of the second anode region 117 in plan view. The second cathode opening 124 is formed to a C shape in plan view. A planar shape of the second cathode opening 124 is arbitrary and not restricted to a C shape. The second cathode opening 124 may be formed to a triangular shape, a quadrilateral shape, a hexagonal shape or other polygonal shape or an elliptical shape in plan view.

In this embodiment, one each of the second cathode opening 124 is formed in each second diode forming region 114. The number of second cathode openings 124 is arbitrary. Therefore, a plurality of the second cathode openings 124 may be formed at intervals in each second diode forming region 114.

The semiconductor device 1 includes a first diode wiring 131 formed on a portion of the interlayer insulating layer 79 that covers the first circuit forming region 111. The first diode wiring 131 connects in forward series the plurality of first diodes 101 between the first sense wiring 20 and the second sense wiring 21. The first diode wiring 131 has one end portion connected to the first sense wiring 20 and another end portion connected to the second sense wiring 21.

The first diode wiring 131 may contain at least one type of material among aluminum, copper, aluminum-silicon-copper alloy, aluminum-silicon alloy, and aluminum-copper alloy.

Specifically, the first diode wiring 131 includes a plurality of first anode electrodes 133, a plurality of first cathode electrodes 134, and a plurality of first connection electrodes 135. The respective first anode electrodes 133 are formed on portions of the interlayer insulating layer 79 covering the respective first diode forming regions 113.

Each first anode electrode 133 is formed to a circular shape in plan view. A planar shape of the first anode electrode 133 is arbitrary. The first anode electrode 133 may be formed to a triangular shape, a quadrilateral shape, a hexagonal shape or other polygonal shape or an elliptical shape in plan view.

The first anode electrodes 133 enter into the first anode openings 121 from above the interlayer insulating layer 79. The first anode electrodes 133 are electrically connected to the first anode regions 115 inside the first anode openings 121.

The respective first cathode electrodes 134 are formed on portions of the interlayer insulating layer 79 covering the respective first diode forming regions 113. The first cathode electrodes 134 extend as bands along the first anode electrodes 133 in plan view.

In this embodiment, each first cathode electrode 134 is formed to a C shape in plan view. A planar shape of the first cathode electrode 134 is arbitrary and is not restricted to a C shape. The first cathode electrode 134 may be formed to a triangular shape, a quadrilateral shape, a hexagonal shape or other polygonal shape or an elliptical shape in plan view.

The first cathode electrodes 134 enter into the first cathode openings 122 from above the interlayer insulating layer 79. The first cathode electrodes 134 are electrically connected to the first cathode regions 116 inside the first cathode openings 122.

Each first connection electrode 135 is formed on a portion of the interlayer insulating layer 79 that covers a region between a plurality of first diode forming regions 113 that are mutually adjacent. The first connection electrode 135 is led out from the first cathode electrode 134 of a first diode forming region 113 at one side and is connected to the first anode electrode 133 of a first diode forming region 113 at another side.

In this embodiment, the first connection electrodes 135 are formed as bands extending along the long direction of the polysilicon layer 106 (the first direction X in this embodiment) in plan view. The first connection electrodes 135 may be routed in line shapes in the regions between the plurality of first diode forming regions 113 that are mutually adjacent.

One first connection electrode 135 that is positioned at one end portion side in the long direction of the polysilicon layer 106 is connected to the second sense wiring 21. One first connection electrode 135 that is positioned at another end portion side in the long direction of the polysilicon layer 106 is connected to the first sense wiring 20. The first series circuit 104 that includes the plurality (four in this embodiment) of first diodes 101 that are connected in forward series with respect to the first sense wiring 20 is thereby formed in a region between the first sense wiring 20 and the second sense wiring 21.

The semiconductor device 1 includes a second diode wiring 132 formed on a portion of the interlayer insulating layer 79 that covers the second circuit forming region 112. The second diode wiring 132 connects in forward series the plurality of second diodes 102 between the first sense wiring 20 and the second sense wiring 21. The second diode wiring 132 has one end portion connected to the first sense wiring 20 and another end portion connected to the second sense wiring 21.

The second diode wiring 132 may contain at least one type of material among aluminum, copper, aluminum-silicon-copper alloy, aluminum-silicon alloy, and aluminum-copper alloy.

Specifically, the second diode wiring 132 includes a plurality of second anode electrodes 136, a plurality of second cathode electrodes 137, and a plurality of second connection electrodes 138. The respective second anode electrodes 136 are formed on portions of the interlayer insulating layer 79 covering the respective second diode forming regions 114.

Each second anode electrode 136 is formed to a circular shape in plan view. A planar shape of the second anode electrode 136 is arbitrary. The second anode electrode 136 may be formed to a triangular shape, a quadrilateral shape, a hexagonal shape or other polygonal shape or an elliptical shape in plan view.

The second anode electrodes 136 enter into the second anode openings 123 from above the interlayer insulating layer 79. The second anode electrodes 136 are electrically connected to the second anode regions 117 inside the second anode openings 123.

The respective second cathode electrodes 137 are formed on portions of the interlayer insulating layer 79 covering the respective second diode forming regions 114. The second cathode electrodes 137 extend as bands along the second anode electrodes 136 in plan view.

In this embodiment, each second cathode electrode 137 is formed to a C shape in plan view. A planar shape of the second cathode electrode 137 is arbitrary and is not restricted to a C shape. The second cathode electrode 137 may be formed to a triangular shape, a quadrilateral shape, a hexagonal shape or other polygonal shape or an elliptical shape in plan view.

The second cathode electrodes 137 enter into the second cathode openings 124 from above the interlayer insulating layer 79. The second cathode electrodes 137 are electrically connected to the second cathode regions 118 inside the second cathode openings 124.

Each second connection electrode 138 is formed on a portion of the interlayer insulating layer 79 that covers a region between a plurality of second diode forming regions 114 that are mutually adjacent. The second connection electrode 138 is led out from the second cathode electrode 137 of a second diode forming region 114 atone side and is connected to the second anode electrode 136 of a second diode forming region 114 at another side.

In this embodiment, the second connection electrodes 138 are formed as bands extending along the long direction of the polysilicon layer 106 (the first direction X in this embodiment) in plan view. The second connection electrodes 138 may be routed in line shapes in the regions between the plurality of second diode forming regions 114 that are mutually adjacent.

One second connection electrode 138 that is positioned at one end portion side in the long direction of the polysilicon layer 106 is connected to the second sense wiring 21. One second connection electrode 138 that is positioned at another end portion side in the long direction of the polysilicon layer 106 is connected to the first sense wiring 20. The second series circuit 105 that includes the plurality (four in this embodiment) of second diodes 102 that are connected in forward series with respect to the second sense wiring 21 is thereby formed in a region between the first sense wiring 20 and the second sense wiring 21.

Figure 18:
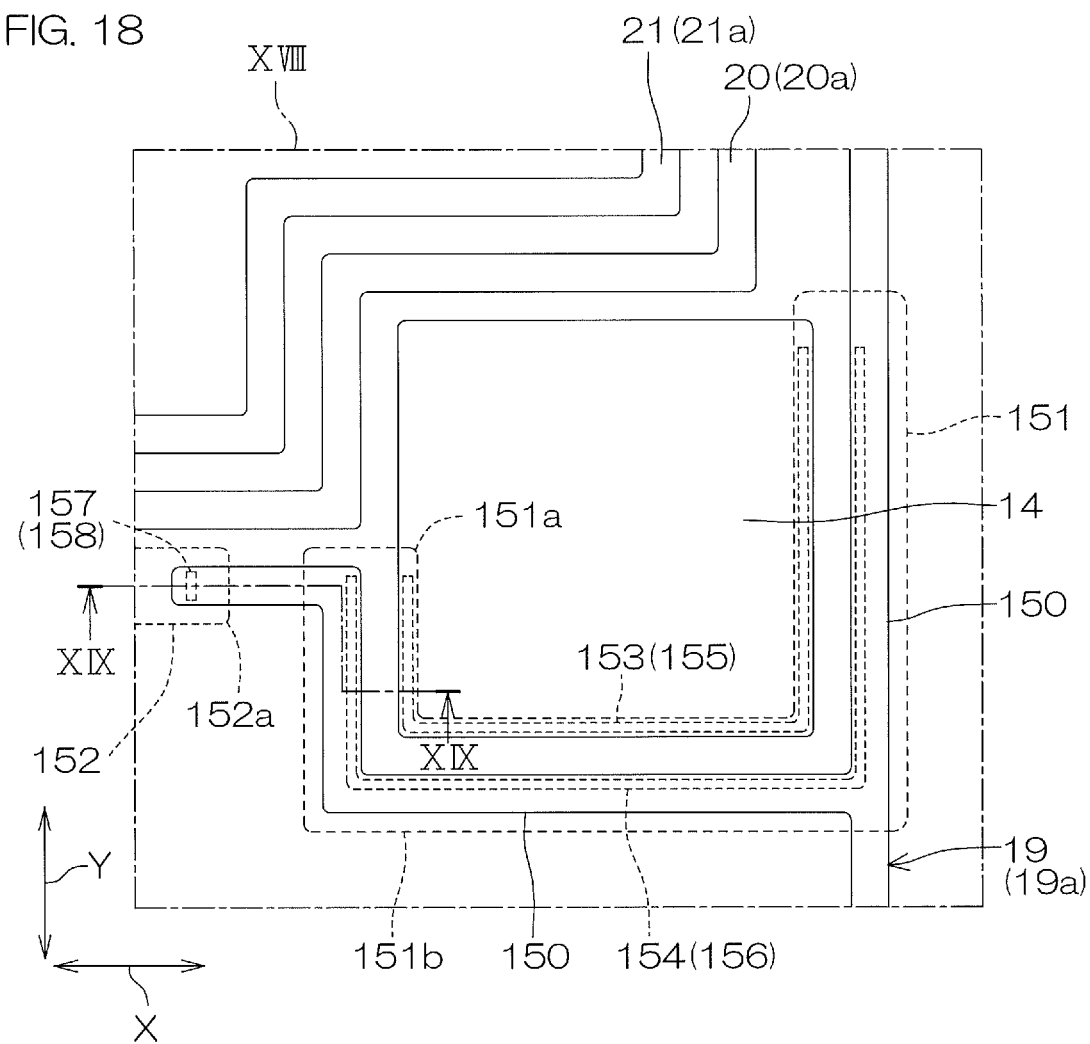
FIG. 18 is an enlarged view of a region XVIII shown in FIG. 1.

FIG. 18 is an enlarged view of a region XVIII shown in FIG. 1. FIG. 19 is a sectional view taken along line XIX-XIX shown in FIG. 18.

Referring to FIG. 18 and FIG. 19, in this embodiment, the gate wiring 19 includes a low resistance wiring portion 150, a first high resistance wiring portion 151, and a second high resistance wiring portion 152.

The low resistance wiring portion 150 has a comparatively low resistance value and forms a main current path of the gate wiring 19. The low resistance wiring portion 150 is formed on the first main surface 3 (interlayer insulating layer 79) of the semiconductor layer 2 at an interval from the gate terminal electrode 14. The low resistance wiring portion 150 is formed along a periphery of the gate terminal electrode 14 and is routed selectively on the first main surface 3 (interlayer insulating layer 79) of the semiconductor layer 2.

The low resistance wiring portion 150 may contain at least one type of material among aluminum, copper, aluminum-silicon-copper alloy, aluminum-silicon alloy, and aluminum-copper alloy. The low resistance wiring portion 150 may be formed of the same metal material as the gate terminal electrode 14.

The first high resistance wiring portion 151 has a resistance value higher than the resistance value of the low resistance wiring portion 150. The first high resistance wiring portion 151 may contain a conductive polysilicon. The first high resistance wiring portion 151 is interposed in a region between the gate terminal electrode 14 and the low resistance wiring portion 150 and is electrically connected to the gate terminal electrode 14 and the low resistance wiring portion 150. The gate signal input into the gate terminal electrode 14 is transmitted to the low resistance wiring portion 150 via the first high resistance wiring portion 151.

Specifically, the first high resistance wiring portion 151 is formed in a lower layer region of the gate terminal electrode 14 and the low resistance wiring portion 150. The first high resistance wiring portion 151 is formed in a region between the first main surface 3 and the interlayer insulating layer 79. The first high resistance wiring portion 151 is formed on the first insulating layer 80.

The first high resistance wiring portion 151 includes a first lead-out portion 151a and a second lead-out portion 151b. The first lead-out portion 151a is led out from above the first insulating layer 80 to a region directly below the gate terminal electrode 14. The second lead-out portion 151b is led out from above the first insulating layer 80 to a region directly below the low resistance wiring portion 150.

A first opening 153 and a second opening 154 are formed in regions of the interlayer insulating layer 79 that cover the first high resistance wiring portion 151. The first opening 153 exposes the first lead-out portion 151a of the first high resistance wiring portion 151. The second opening 154 exposes the second lead-out portion 151b of the second high resistance wiring portion 152.

A first plug electrode 155 is embedded in the first opening 153. The first lead-out portion 151a is electrically connected to the gate terminal electrode 14 via the first plug electrode 155. Description of the emitter plug electrodes 91 applies to description concerning the first plug electrode 155. Structures in the first plug electrode 155 corresponding to the structures described for the emitter plug electrodes 91 shall be provided with the same reference signs and description thereof shall be omitted.

A second plug electrode 156 is embedded in the second opening 154. The second lead-out portion 151b is electrically connected to the first high resistance wiring portion 151 via the second plug electrode 156. Description of the emitter plug electrodes 91 applies to description concerning the second plug electrode 156. Structures in the second plug electrode 156 corresponding to the structures described for the emitter plug electrodes 91 shall be provided with the same reference signs and description thereof shall be omitted.

The second high resistance wiring portion 152 has a resistance value higher than the resistance value of the low resistance wiring portion 150. The second high resistance wiring portion 152 may contain a conductive polysilicon. The second high resistance wiring portion 152 is interposed in a region between the gate lead-out electrode layers 41a and the low resistance wiring portion 150 and is electrically connected to the gate lead-out electrode layers 41a and the low resistance wiring portion 150. The gate signal transmitted to the low resistance wiring portion 150 is transmitted to the gate lead-out electrode layers 41a via the second high resistance wiring portion 152.

Specifically, the second high resistance wiring portion 152 is formed in a lower layer region of the low resistance wiring portion 150. The second high resistance wiring portion 152 is formed in the same layer as the gate lead-out electrode layers 41a. The second high resistance wiring portion 152 is formed in a region between the first main surface 3 and the interlayer insulating layer 79. The second high resistance wiring portion 152 is formed on the first insulating layer 80.

The second high resistance wiring portion 152 includes a lead-out portion 152a led out from above the first insulating layer 80 to a region directly below the low resistance wiring portion 150. Also, the second high resistance wiring portion 152 has connection portions continuous to the gate lead-out electrode layers 41a in unillustrated regions.

A third opening 157 is formed in a region of the interlayer insulating layer 79 that covers the second high resistance wiring portion 152. The third opening 157 exposes the lead-out portion 152a of the second high resistance wiring portion 152.

A third plug electrode 158 is embedded in the third opening 157. Description of the emitter plug electrodes 91 applies to description concerning the third plug electrode 158. Structures in the third plug electrode 158 corresponding to the structures described for the emitter plug electrodes 91 shall be provided with the same reference signs and description thereof shall be omitted.

The lead-out portion 152a is electrically connected to the low resistance wiring portion 150 via the third plug electrode 158. A connection position of the lead-out portion 152a and the low resistance wiring portion 150 is arbitrary and not restricted to the location shown in FIG. 18 and FIG. 19.

The shorter the distance between the low resistance wiring portion 150 and a gate lead-out electrode layer 41a is made, the more a wiring resistance can be reduced. The connection position of the lead-out portion 152a and the low resistance wiring portion 150 is preferably set in consideration of the wiring resistances between the low resistance wiring portion 150 and the gate lead-out electrode layers 41a.

The gate signal input into the gate terminal electrode 14 is transmitted to the gate lead-out electrode layers 41a via the first high resistance wiring portion 151, the low resistance wiring portion 150, and the second high resistance wiring portion 152. The gate signal transmitted to the gate lead-out electrode layers 41a is transmitted to the gate electrode layers 41.

The gate wiring 19 thus has the first high resistance wiring portion 151 interposed between the low resistance wiring portion 150 and the gate terminal electrode 14. The gate signal input into the gate terminal electrode 14 is transmitted to the low resistance wiring portion 150 via the first high resistance wiring portion 151.

The first high resistance wiring portion 151 suppresses an inrush current from flowing from the gate terminal electrode 14 into the low resistance wiring portion 150. On the other hand, the low resistance wiring portion 150 transmits the gate signal to the FET structures 35 while suppressing voltage drop of the gate signal. Malfunction of the FET structures 35 due to an inrush current can thus be suppressed. Also, since malfunction of the FET structures 35 can be suppressed, reduction of switching noise can also be achieved.

Also, the gate wiring 19 includes the second high resistance wiring portion 152 interposed between the low resistance wiring portion 150 and the gate lead-out electrode layers 41a. The second high resistance wiring portion 152 suppresses an inrush current from flowing from the low resistance wiring portion 150 into the gate lead-out electrode layers 41a. Malfunction of the FET structures 35 due to an inrush current can thus be suppressed appropriately. Also, since malfunction of the FET structures 35 can be suppressed appropriately, reduction of switching noise can also be achieved appropriately.

As described above, with the semiconductor device 1, when the total extension of the boundary lines between the plurality of IGBT regions 8 and the plurality of diode regions 9 is represented by L, the total area of the plurality of diode regions 9 is represented by SD, and the dispersion degree D of the plurality of diode regions 9 with respect to the active region 6 is defined by the formula $\text{Log}_e(L^2/SD)$, the dispersion degree D is not less than 2 and not more than 15. Thereby, improvement of the breakdown tolerance to the surge current Is can be achieved while suppressing change in the forward voltage VF before and after application of the bias voltage Vge to the IGBT (see FIG. 3 and FIG. 4).

When the dispersion degree D is set in the range of not less than 2 and not more than 7, the tolerance to the surge current Is can be increased while reliably suppressing the increase in the forward voltage VF due to the application of the bias voltage Vge. On the other hand, when the dispersion degree D is set in the range of not less than 7 and not more than 12, the tolerance to the surge current Is can be increased reliably while suppressing the increase in the forward voltage VF due to the application of the bias voltage Vge.

Also, the semiconductor device 1 includes the interlayer insulating layer 79 having the diode openings 84 that expose the diode regions 9. The angle θ that the inner walls of the diode openings 84 form with the first main surface 3 inside interlayer insulating layer 79 is not less than 45° and not more than 90°.

When the angle θ is less than 45°, thin film portions are formed in the portions of the interlayer insulating layer 79 that cover the diode regions 9. When the thin film portions are formed in the interlayer insulating layer 79, the emitter terminal electrode 13 opposes the first main surface 3 (the anode regions 62 and/or the anode separating electrode layers 66) across the thin film portions of the interlayer insulating layer 79. In this case, there is a possibility that as a consequence of electric field concentrating at the thin film portions of the interlayer insulating layer 79, dielectric breakdown tolerance decreases with the thin film portions of the interlayer insulating layer 79 as starting points.

Thus, in this embodiment, the inner walls of the diode openings 84 are formed such that the angle θ is not less than 45° (preferably not less than 60°) to suppress the forming of the thin film portions in the interlayer insulating layer 79. Dielectric breakdown of the interlayer insulating layer 79 due to undesirable electric field concentration can thereby be suppressed and therefore, decrease in dielectric breakdown tolerance can be suppressed.

Also, the semiconductor device 1 has the structure where the p-type impurity concentration of the anode regions 62 is less than the p-type impurity concentration of the body regions 45 and the emitter terminal electrode 13 is directly connected to the anode regions 62 without the interposition of the barrier electrode layer. Specifically, the emitter terminal electrode 13 forms ohmic contacts with the anode regions 62. The recovery loss Err can thereby be suppressed while suppressing increase in the forward voltage VF (see the third configuration example (third plotted point P3) in FIG. 13).

The semiconductor device 1 may have a structure where the p-type impurity concentration of the anode regions 62 is less than the p-type impurity concentration of the body regions 45 and the emitter terminal electrode 13 is electrically connected to the anode regions 62 via the barrier electrode layer. In this case, the recovery loss Err can be suppressed (see the second configuration example (second plotted point P2) in FIG. 13).

FIG. 20A to FIG. 20T are sectional views corresponding to FIG. 10 and are sectional views for describing an example of a manufacturing method for the semiconductor device 1 shown in FIG. 1. In the following, a manufacturing process for the IGBT regions 8 and the diode regions 9 shall be described.

Referring to FIG. 20A, in manufacturing the semiconductor device 1, first, an n⁻-type semiconductor wafer 162 is prepared. The semiconductor wafer 162 has a first wafer main surface 163 and a second wafer main surface 164. The first wafer main surface 163 and the second wafer main surface 164 of the semiconductor wafer 162 respectively correspond to the first main surface 3 and the second main surface 4 of the semiconductor layer 2.

Next, a plurality of device forming regions 165, each corresponding to a semiconductor device 1, are set on the semiconductor wafer 162. Each device forming region 165 includes the active region 6 and the outer region 7. The active region 6 includes the IGBT regions 8 and the diode regions 9. The same structures are formed at the same time on the plurality of device forming regions 165. After predetermined structures are made on the respective device forming regions 165, the semiconductor wafer 162 is cut along peripheral edges of the respective device forming regions 165. In the following, a description shall be provided concerning the structures on a single device forming region 165.

Figure 20B:
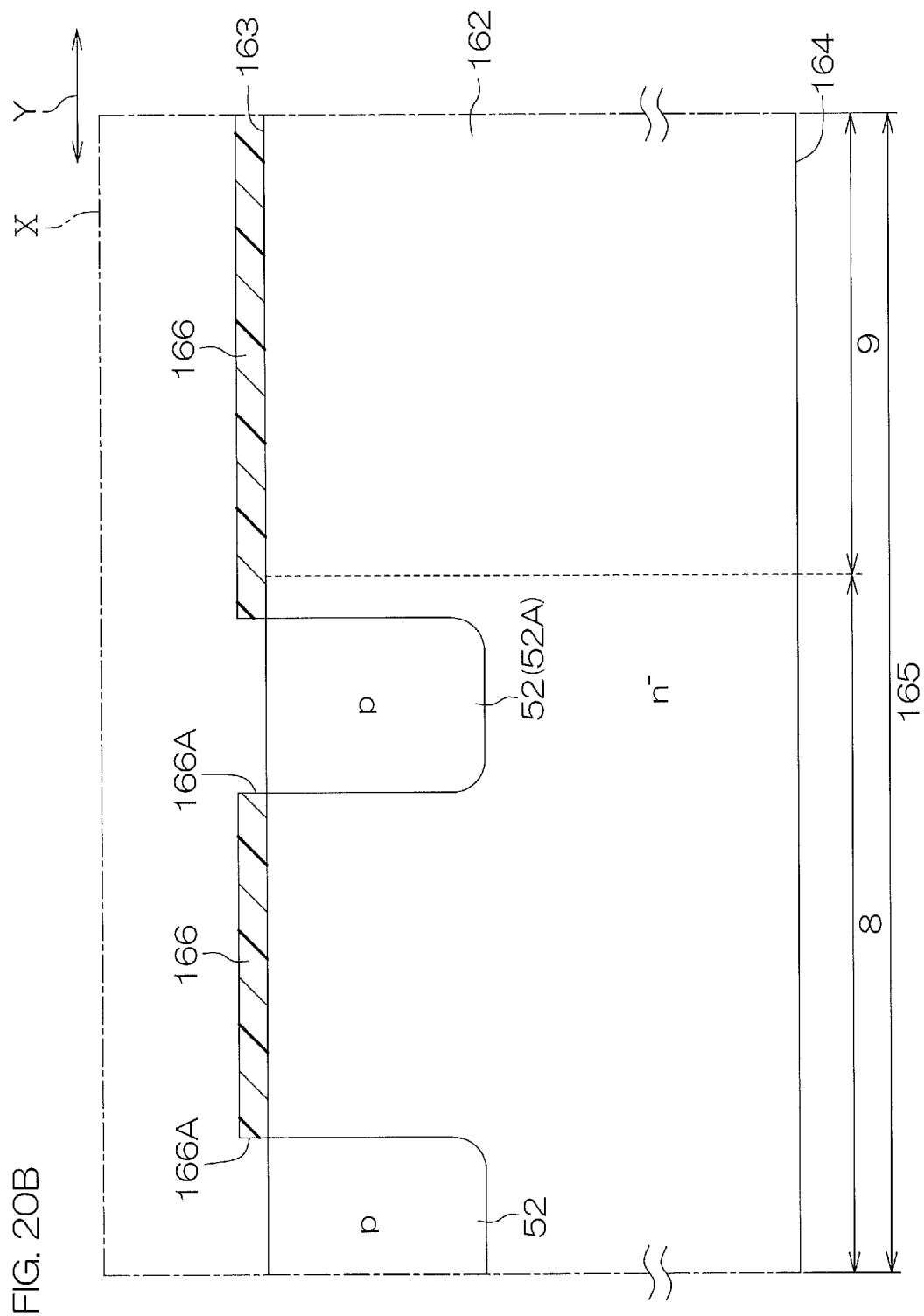
FIG. 20B is a sectional view of a step after that of FIG. 20A.

Next, referring to FIG. 20B, the plurality of p⁺-type floating regions 52 are formed in the IGBT regions 8. In this step, first, an ion introducing mask 166 having a predetermined pattern is formed on the first wafer main surface 163. The ion introducing mask 166 has a plurality of openings 166A that respectively expose regions in which the plurality of floating regions 52 are to be formed.

Next, a p-type impurity is introduced into the semiconductor wafer 162 via the ion introducing mask 166. The plurality of floating regions 52 are thereby formed in the IGBT regions 8. Thereafter, the ion introducing mask 166 is removed.

Next, referring to FIG. 20C, the gate trenches 39 and the region separating trenches 54 are formed in the IGBT regions 8 and the anode separating trenches 64 are formed in the diode regions 9. In this step, first, a hard mask 167 having a predetermined pattern is formed on the first wafer main surface 163.

The hard mask 167 has a plurality of openings 167A that respectively expose regions in which the gate trenches 39, the region separating trenches 54, and the anode separating trenches 64 are to be formed. The hard mask 167 may be formed by an oxidation treatment method performed on the first wafer main surface 163.

Next, unnecessary portions of the semiconductor wafer 162 are removed by an etching method via the hard mask 167. The etching method may be a wet etching methods.

Thereby, the gate trenches 39 and the region separating trenches 54 are formed in the IGBT regions 8 and the anode separating trenches 64 are formed in the diode regions 9. Thereafter, the hard mask 167 is removed.

Next, referring to FIG. 20D, the plurality of floating regions 52 are diffused inside the semiconductor wafer 162. The plurality of floating regions 52 are diffused to a depth position of covering the bottom walls of the region separating trenches 54.

Figure 20E:
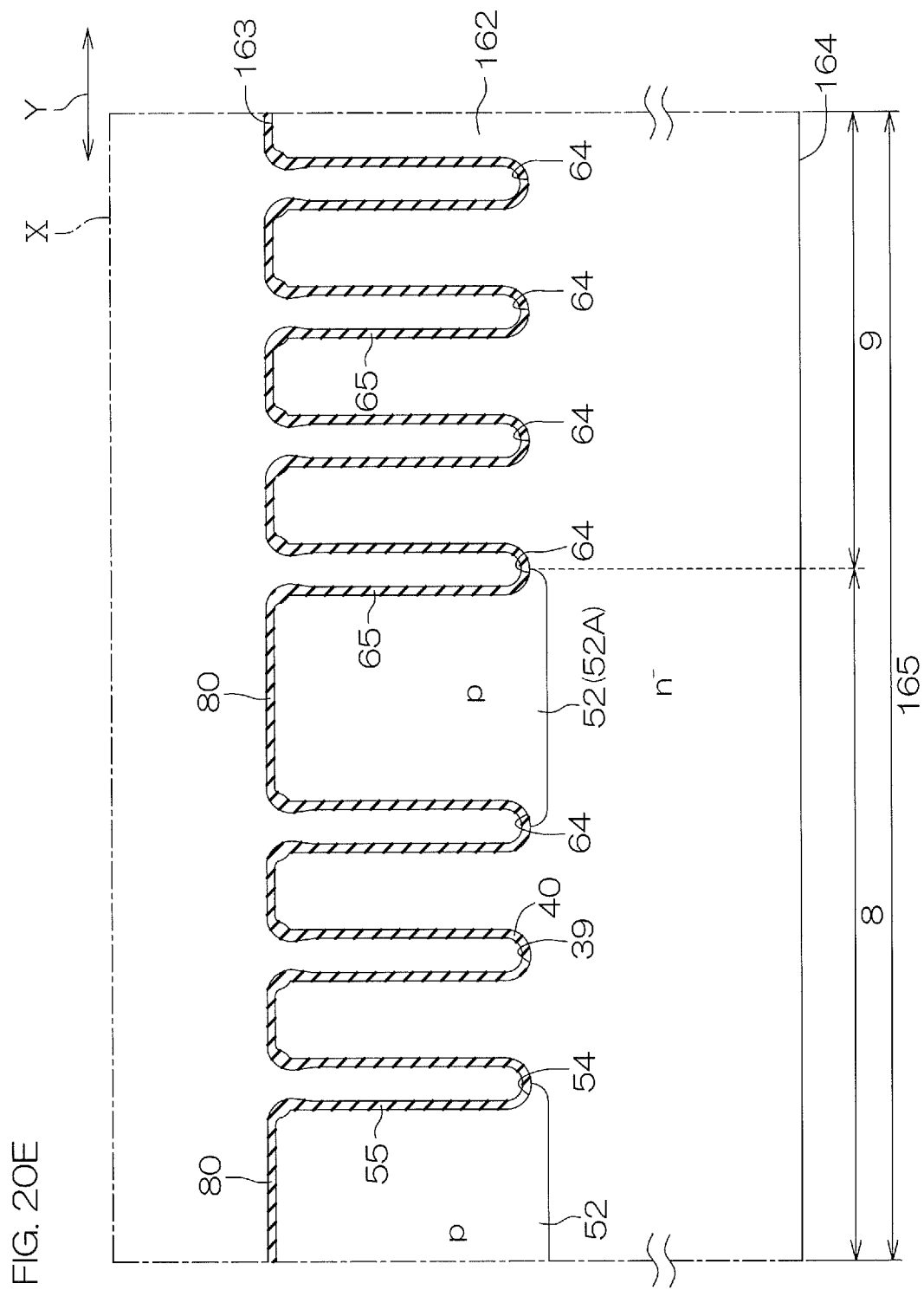
FIG. 20E is a sectional view of a step after that of FIG. 20D.

Next, referring to FIG. 20E, the gate insulating layers 40, the region separating insulating layers 55, the anode separating insulating layers 65, and the first insulating layer 80 are formed on the first wafer main surface 163. The gate insulating layers 40, the region separating insulating layers 55, the anode separating insulating layers 65, and the first insulating layer 80 may be formed by a CVD (chemical vapor deposition) method or an oxidation treatment method (for example, a thermal oxidation treatment method).

Figure 20F:
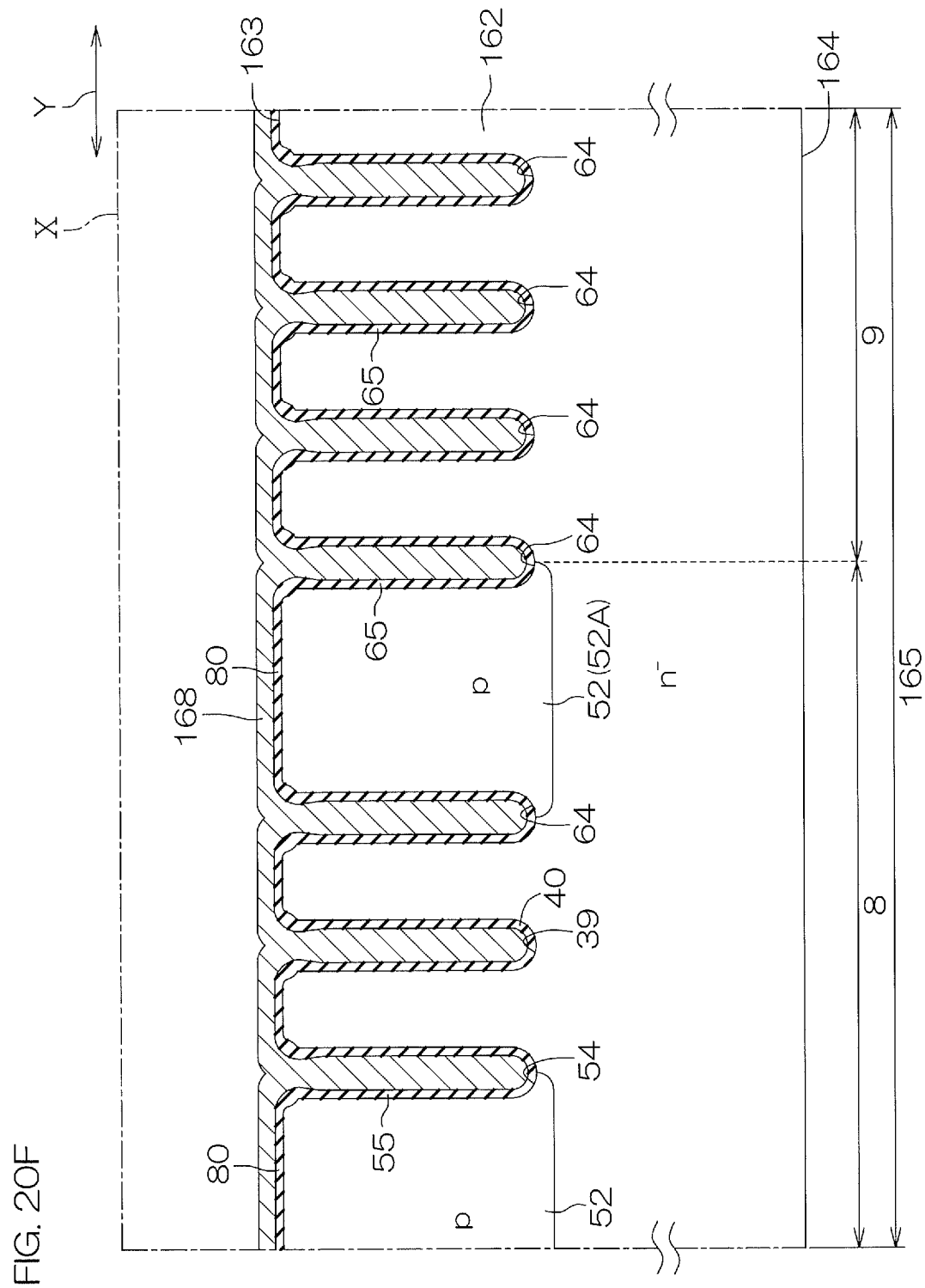
FIG. 20F is a sectional view of a step after that of FIG. 20E.

Next, referring to FIG. 20F, abase electrode layer 168 is formed. The base electrode layer 168 becomes a base of the gate wiring 19, the gate electrode layers 41, the gate lead-out electrode layers 41a, the region separating electrode layers 56, the separating lead-out electrode layers 56a, the anode separating electrode layers 66, and the anode lead-out electrode layers 66a. The base electrode layer 168 contains a conductive polysilicon. The base electrode layer 168 may be formed by a CVD method.

Figure 20G:
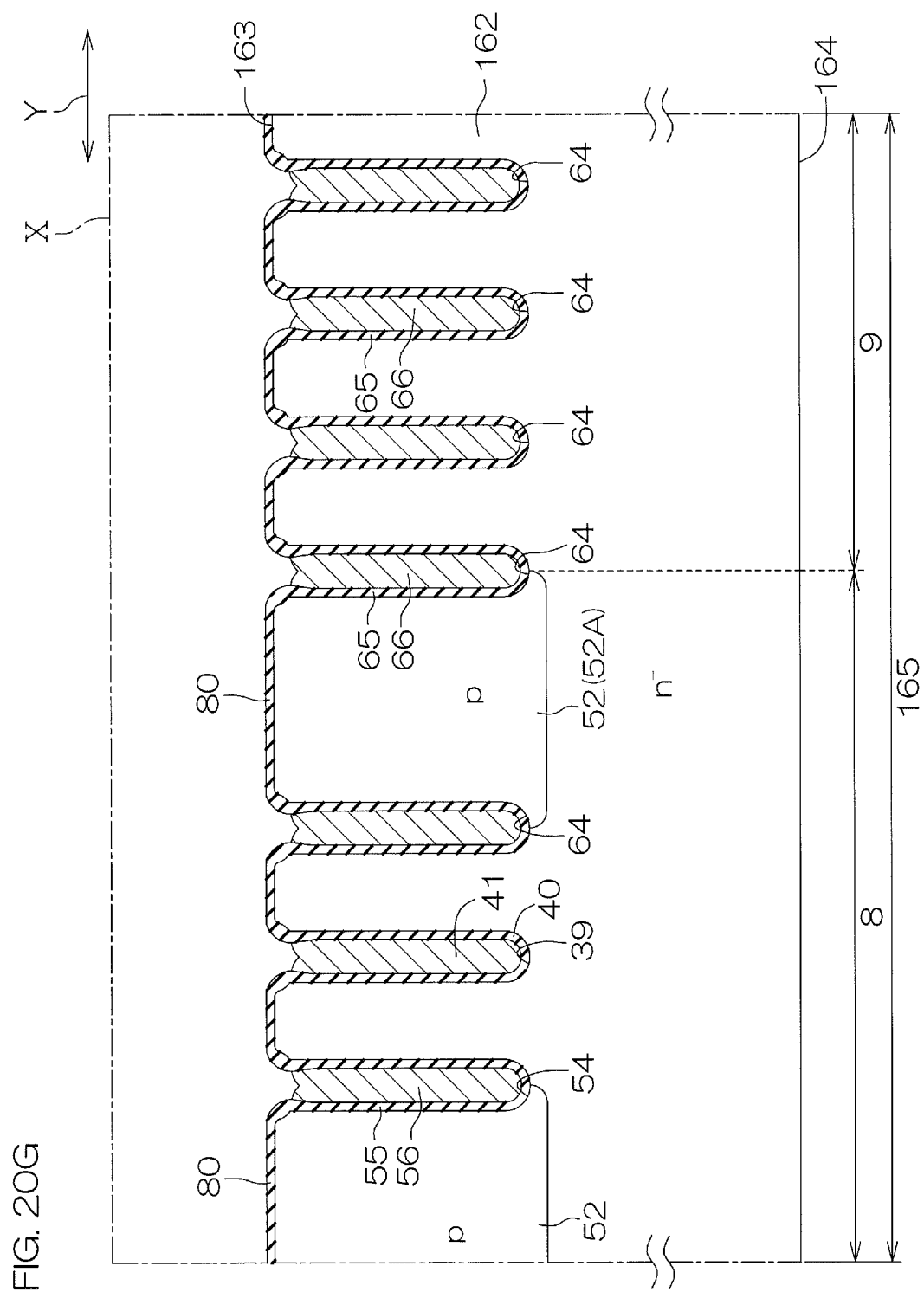
FIG. 20G is a sectional view of a step after that of FIG. 20F.

Next, referring to FIG. 20G, unnecessary portions of the base electrode layer 168 are removed. In this step, first, a mask (not shown) having a predetermined pattern is formed on the base electrode layer 168. The mask covers regions in which the gate wiring 19, the gate lead-out electrode layers 41a, the separating lead-out electrode layers 56a, and the anode lead-out electrode layers 66a are to be formed respectively and has openings that expose regions besides these regions.

Next, unnecessary portions of the base electrode layer 168 are removed by an etching method via the mask. The etching method may be a wet etching method. The unnecessary portions of the base electrode layer 168 are removed until the first insulating layer 80 is exposed. The gate wiring 19, the gate electrode layers 41, the gate lead-out electrode layers 41a, the region separating electrode layers 56, the separating lead-out electrode layers 56a, the anode separating electrode layers 66, and the anode lead-out electrode layers 66a are thereby formed. The mask is thereafter removed.

Figure 20H:
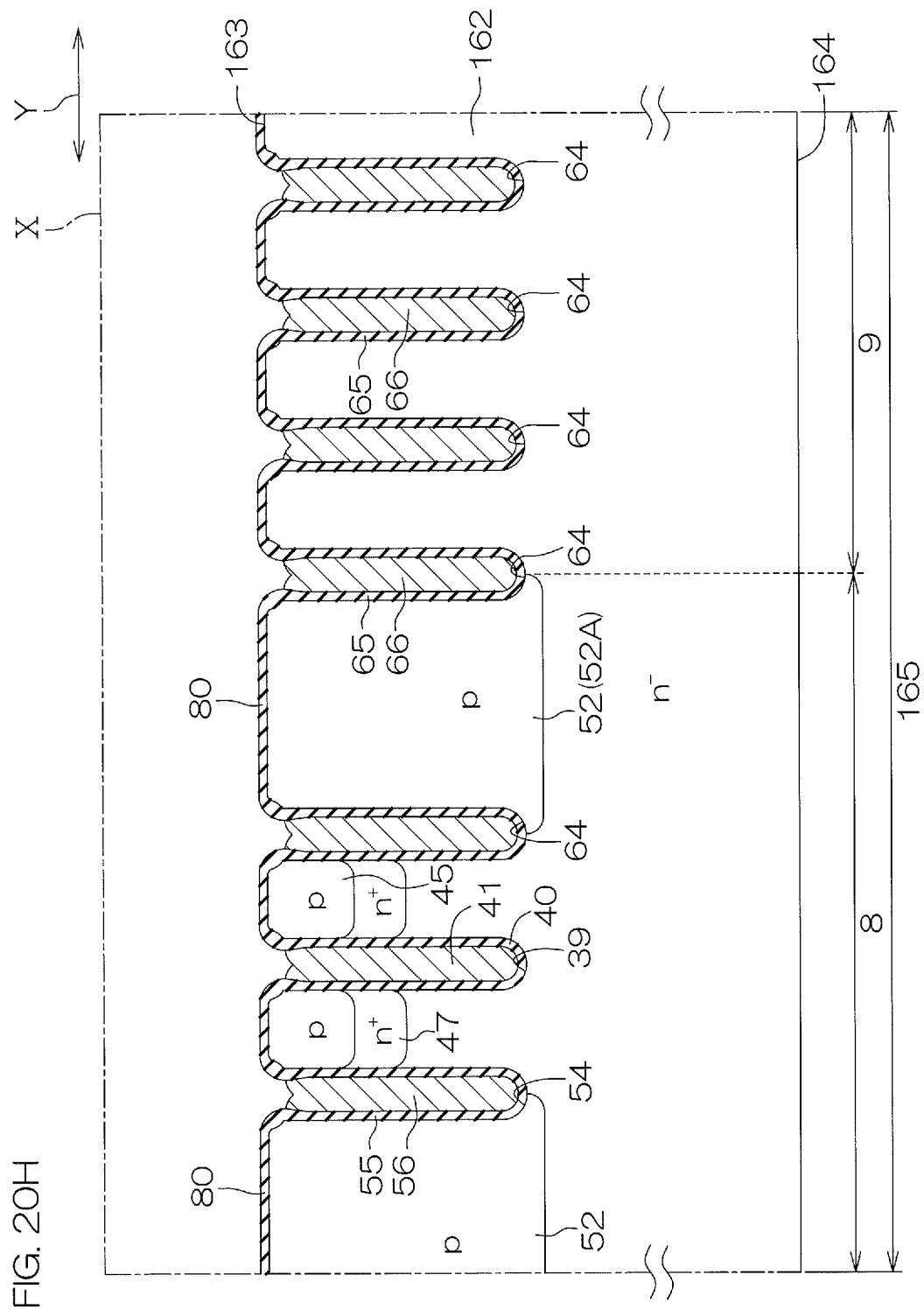
FIG. 20H is a sectional view of a step after that of FIG. 20G.

Next, referring to FIG. 20H, the plurality of $n^+$-type carrier storage regions 47 are formed in the IGBT regions 8. In this step, first, an ion introducing mask (not shown) having a predetermined pattern is formed on the first wafer main surface 163. The ion introducing mask has a plurality of openings that respectively expose regions in which the plurality of carrier storage regions 47 are to be formed.

Next, an n-type impurity is introduced into the semiconductor wafer 162 via the ion introducing mask. The plurality of carrier storage regions 47 are thereby formed in the IGBT regions 8. Thereafter, the ion introducing mask is removed.

Next, the plurality of p-type body regions 45 are formed in the IGBT regions 8. In this step, first, an ion introducing mask (not shown) having a predetermined pattern is formed on the first wafer main surface 163. The ion introducing mask has a plurality of openings that respectively expose regions in which the plurality of body regions 45 are to be formed.

Next, a p-type impurity is introduced into the semiconductor wafer 162 via the ion introducing mask. The plurality of body regions 45 are thereby formed in the IGBT regions 8. Thereafter, the ion introducing mask is removed.

Figure 20I:
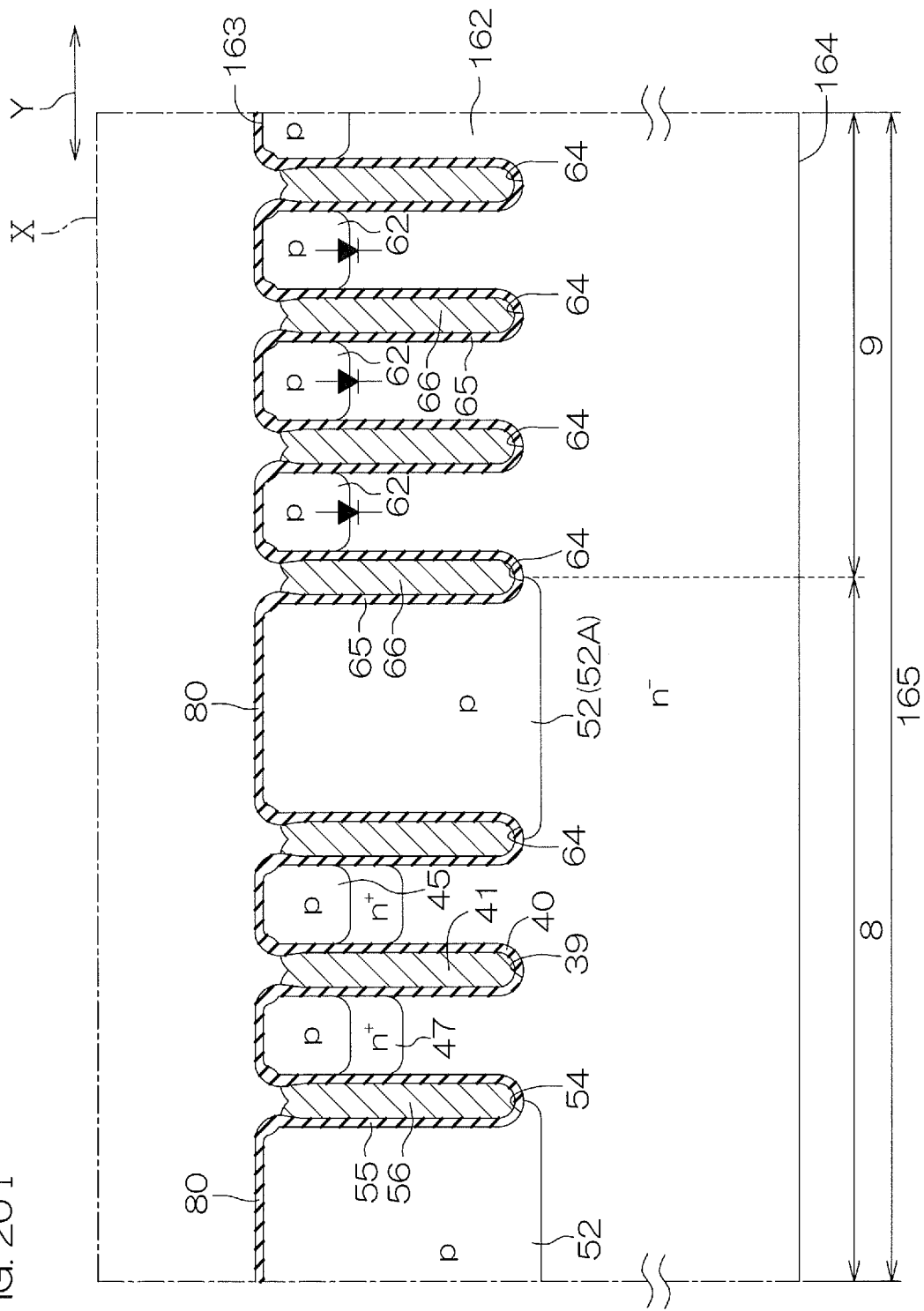
FIG. 20I is a sectional view of a step after that of FIG. 20H.

Next, referring to FIG. 20I, the plurality of $p^-$-type anode regions 62 are formed in the diode regions 9. The p-type impurity concentration of each anode region 62 is less than the p-type impurity concentration of each body region 45. In this step, first, an ion introducing mask (not shown) having a predetermined pattern is formed on the first wafer main surface 163. The ion introducing mask has a plurality of openings that respectively expose regions in which the plurality of anode regions 62 are to be formed.

Next, a p-type impurity is introduced into the semiconductor wafer 162 via the ion introducing mask. The plurality of anode regions 62 are thereby formed in the diode regions 9. Thereafter, the ion introducing mask is removed.

Next, referring to FIG. 20J, the plurality of $n^+$-type emitter regions 46 are formed in the IGBT regions 8. In this step, first, an ion introducing mask (not shown) having a predetermined pattern is formed on the first wafer main surface 163. The ion introducing mask has a plurality of openings that respectively expose regions in which the plurality of emitter regions 46 are to be formed.

Next, an n-type impurity is introduced into the semiconductor wafer 162 via the ion introducing mask. The plurality of emitter regions 46 are thereby formed in the IGBT regions 8. Thereafter, the ion introducing mask is removed.

Figure 20K:
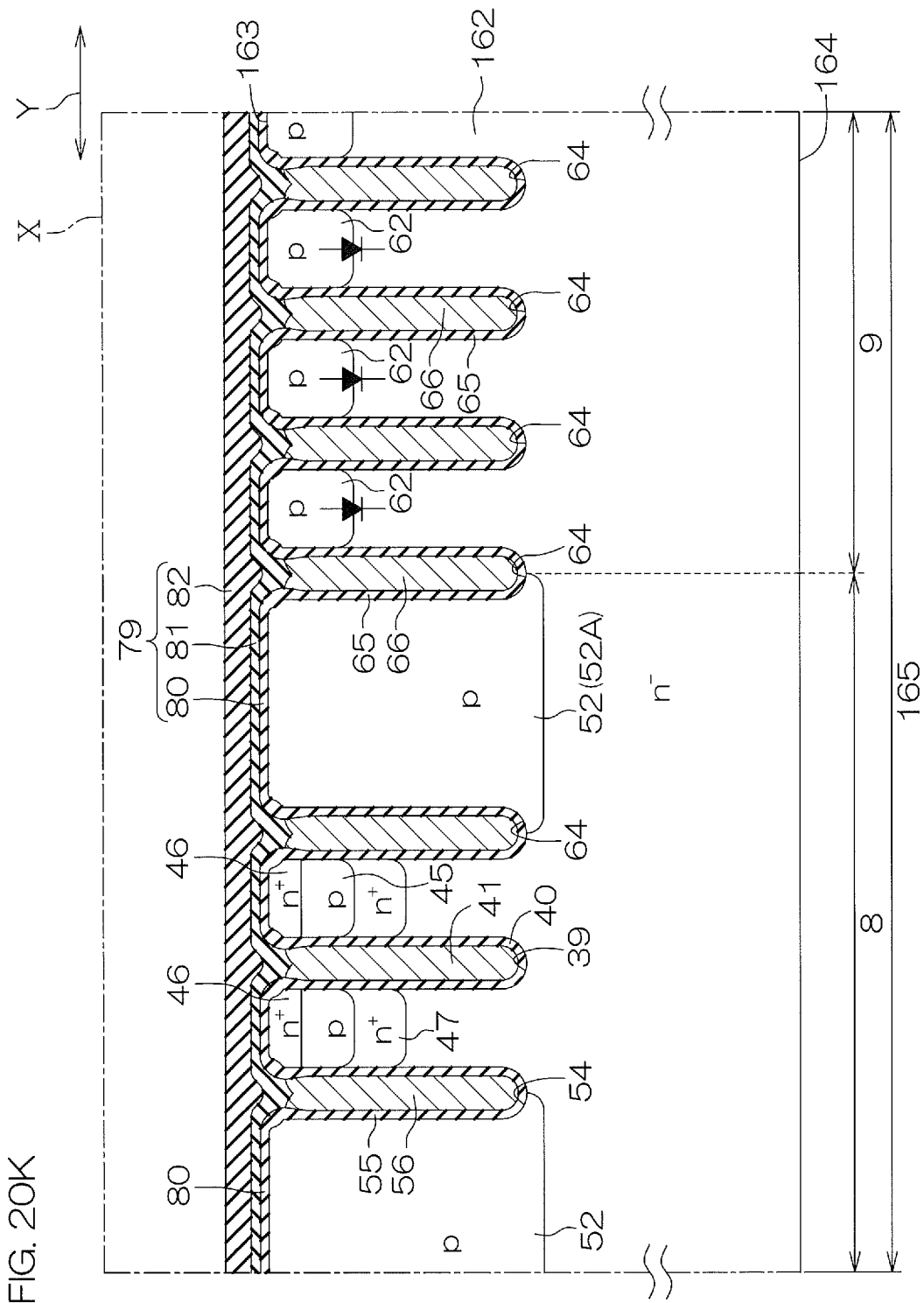
FIG. 20K is a sectional view of a step after that of FIG. 20J.

Next, referring to FIG. 20K, the second insulating layer 81 and the third insulating layer 82 are formed in that order from the first wafer main surface 163 side. The second insulating layer 81 includes an NSG layer. The second insulating layer 81 may be formed by a CVD method. The third insulating layer 82 includes an BPSG layer. The third insulating layer 82 may be formed by a CVD method. The interlayer insulating layer 79 that includes the first insulating layer 80, the second insulating layer 81, and the third insulating layer 82 is thereby formed.

Figure 20L:
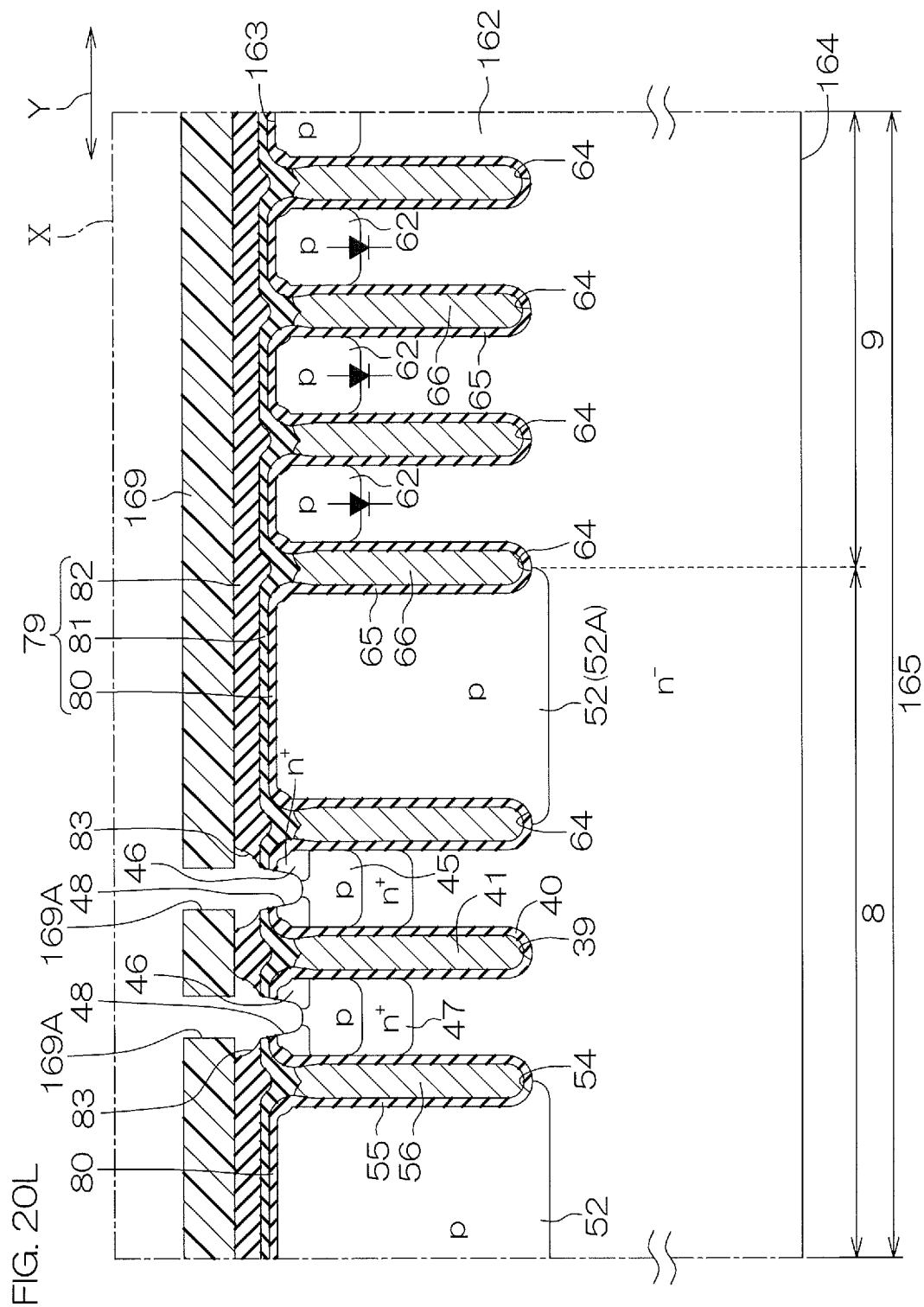
FIG. 20L is a sectional view of a step after that of FIG. 20K.

Next, referring to FIG. 20L, the plurality of emitter trenches 48 and the plurality of emitter openings 83 are formed in the IGBT regions 8. Also, in this step, the first openings 86 are formed in the IGBT regions 8 and the second openings 87 are formed in the diode regions 9.

In this step, first, a mask 169 having a predetermined pattern is formed on the interlayer insulating layer 79. The mask 169 has a plurality of openings 169A that respectively expose regions in which the emitter trenches 48, the emitter openings 83, the first openings 86, and the second openings 87 are to be formed.

Next, unnecessary portions of the interlayer insulating layer 79 are removed by an etching method via the mask 169. The etching method may be a wet etching method. In this step, unnecessary portions of the third insulating layer 82, unnecessary portions of the second insulating layer 81, and unnecessary portions of the first insulating layer 80 are removed successively by the etching method.

In this step, after removal of the first insulating layer 80, portions of the first wafer main surface 163 exposed from the mask 169 is further removed. The emitter trenches 48, the emitter openings 83, the first openings 86, and the second openings 87 are thereby formed. Thereafter, the mask 169 is removed.

Figure 20M:
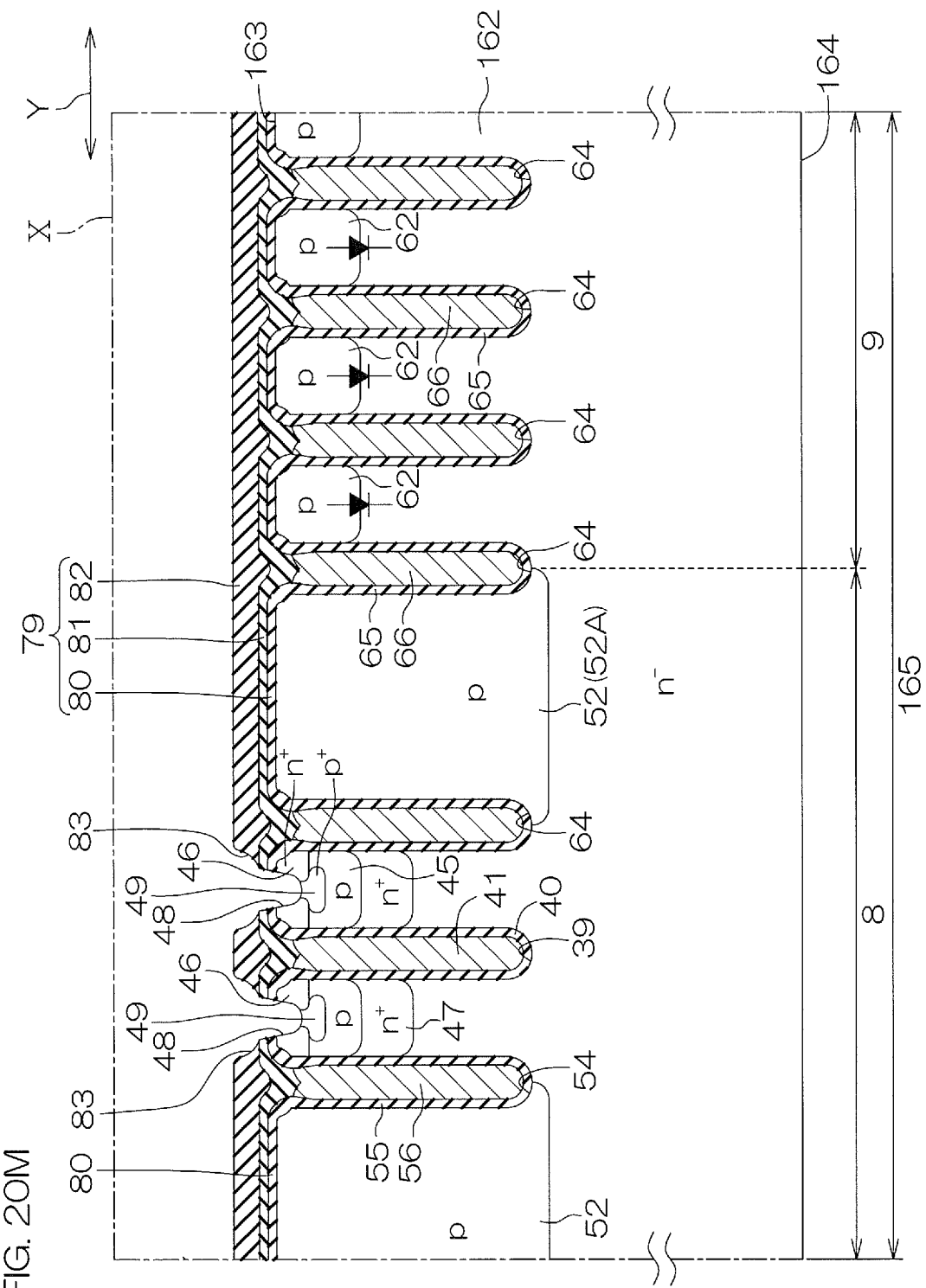
FIG. 20M is a sectional view of a step after that of FIG. 20L.

Next, referring to FIG. 20M, the plurality of $p^+$-type contact regions 49 are formed in the IGBT regions 8. In this step, first, an ion introducing mask (not shown) having a predetermined pattern is formed on the interlayer insulating layer 79. The ion introducing mask has a plurality of openings that respectively expose the plurality of emitter trenches 48 (emitter openings 83) as regions in which the plurality of contact regions 49 are to be formed.

Next, a p-type impurity is introduced into the semiconductor wafer 162 via the ion introducing mask. The plurality of contact regions 49 are thereby formed in the IGBT regions 8. Thereafter, the ion introducing mask is removed.

Next, referring to FIG. 20N, a plug base electrode layer 170 is formed on the interlayer insulating layer 79. The plug base electrode layer 170 becomes a base of the emitter plug electrodes 91, the first plug electrodes 94, and the second plug electrodes 95. This step includes steps of forming a barrier electrode layer 92 and a main electrode layer 93 in that order from the interlayer insulating layer 79 side.

The step of forming the barrier electrode layer 92 includes steps of forming a titanium layer and a titanium nitride layer in that order from the interlayer insulating layer 79 side. The titanium layer and the titanium nitride layer may be formed respectively by a sputter method. A barrier electrode layer 92 having a single layer structure that includes a titanium layer or a titanium nitride layer may be formed instead. The main electrode layer 93 contains tungsten. The main electrode layer 93 may be formed by a sputter method. The plug base electrode layer 170 is thereby formed on the interlayer insulating layer 79.

Figure 20O:
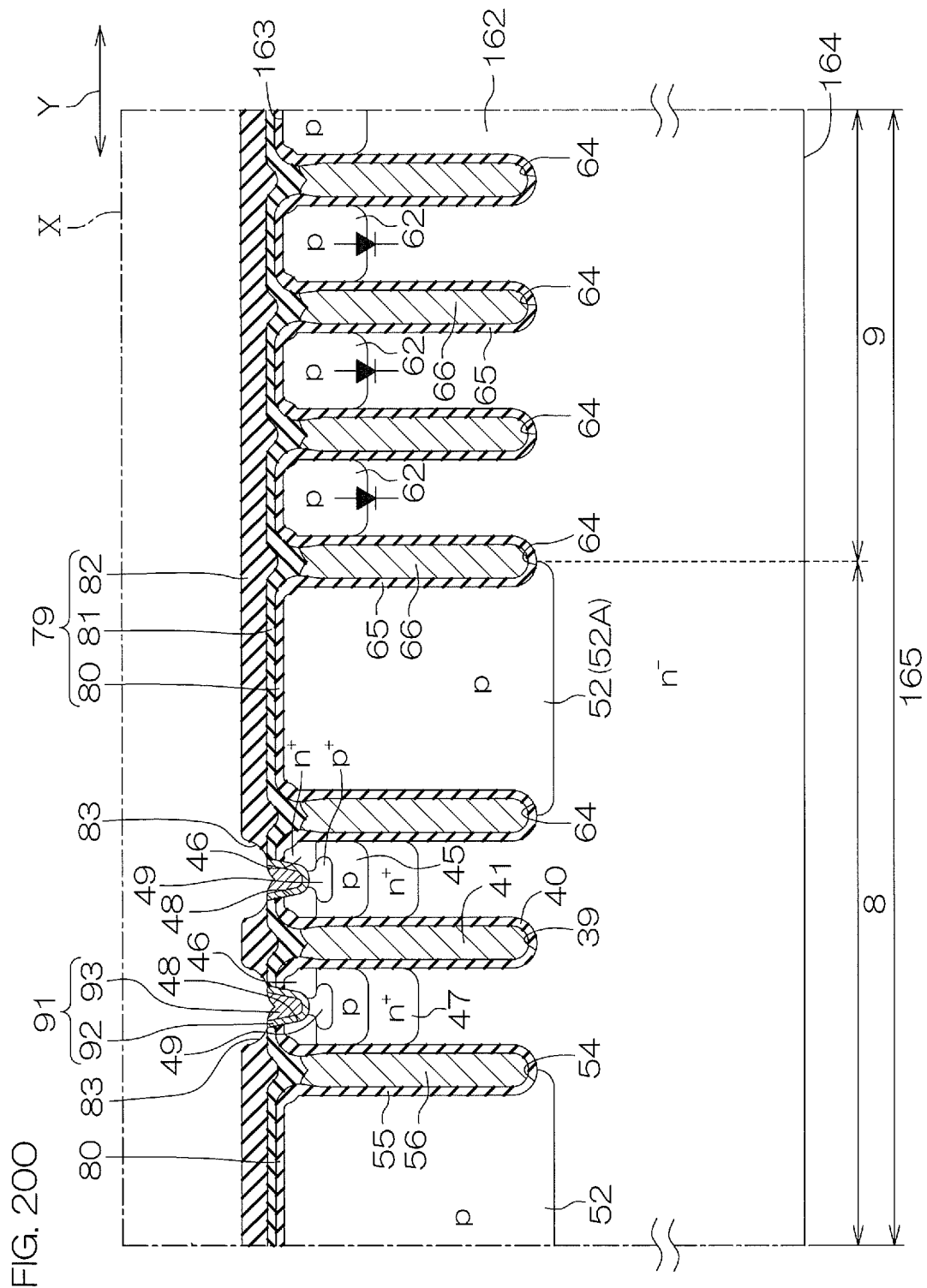
FIG. 20O is a sectional view of a step after that of FIG. 20N.

Next, referring to FIG. 20O, unnecessary portions of the plug base electrode layer 170 are removed. The unnecessary portions of the plug base electrode layer 170 may be removed by an etching method. The unnecessary portions of the plug base electrode layer 170 are removed until the interlayer insulating layer 79 is exposed.

Specifically, the unnecessary portions of the plug base electrode layer 170 are removed until the emitter openings 83 are exposed and the plug base electrode layer 170 is embedded in the emitter trenches 48, the first openings 86, and the second openings 87. The emitter plug electrodes 91, the first plug electrodes 94, and the second plug electrodes 95 are thereby formed.

Next, referring to FIG. 20P, the plurality of diode openings 84 are formed in the diode regions 9. In this step, first, a mask 171 having a predetermined pattern is formed on the interlayer insulating layer 79. The mask 171 has a plurality of openings 171A that respectively expose regions in which the plurality of diode openings 84 are to be formed.

Next, unnecessary portions of the interlayer insulating layer 79 are removed by an etching method via the mask 171. The etching method is preferably an anisotropic etching method. The anisotropic etching method may be a dry etching method (specifically, an RIE (reactive ion etching) method).

In this step, unnecessary portions of the first insulating layer 80, unnecessary portions of the second insulating layer 81, and unnecessary portions of the third insulating layer 82 are removed successively by the anisotropic etching method. The plurality of diode openings 84 are thereby formed. Also, the recesses 67 are formed inside the anode separating trenches 64. Thereafter, the mask 171 is removed.

In the step of forming the diode openings 84, processing conditions of the anisotropic etching method are adjusted such that the angle θ that the inner walls of the diode openings 84 form with the first wafer main surface 163 inside the interlayer insulating layer 79 is not less than 45° and not more than 90°.

The angle θ may be not less than 45° and not more than 50°, not less than 50° and not more than 55°, not less than 55° and not more than 60°, not less than 60° and not more than 65°, not less than 65° and not more than 70°, not less than 70° and not more than 75°, not less than 75° and not more than 80°, not less than 80° and not more than 85°, or not less than 85° and not more than 90°. The angle θ is preferably not less than 60° and not more than 90°.

It may be considered to adopt an isotropic etching method (for example, a wet etching method) in the step of forming the diode openings 84. However, in this case, the interlayer insulating layer 79 is also removed in lateral directions parallel to the first wafer main surface 163 and there is a likelihood of the angle θ of the inner walls becoming less than 45° due to overetching.

Especially in the case of the isotropic etching method, advanced processing conditions are required in terms of controlling a removal amount of the interlayer insulating layer 79 and it therefore becomes difficult to adjust the angle θ appropriately. Also, even if the interlayer insulating layer 79 is removed according to processing conditions determined in advance, the targeted angle θ may still not be achieved due to overetching. Therefore, in this step, the interlayer insulating layer 79 is removed by the anisotropic etching method. The angle θ can thereby be adjusted appropriately.

Figure 20Q:
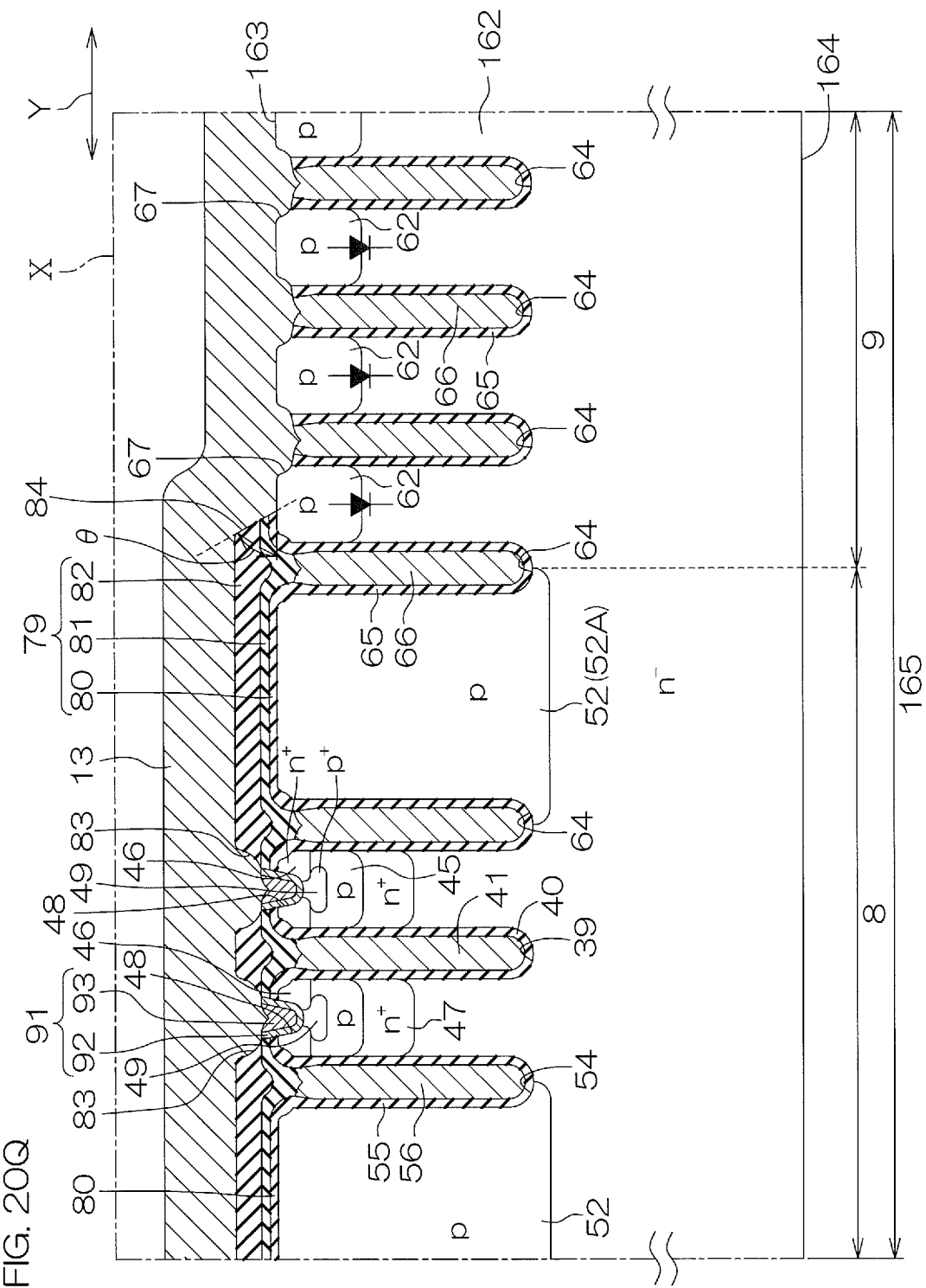
FIG. 20Q is a sectional view of a step after that of FIG. 20P.

Next, referring to FIG. 20Q, the emitter terminal electrode 13, the gate terminal electrode 14, the first sense terminal electrode 15, the second sense terminal electrode 16, the current detection terminal electrode 17, and the open terminal electrode 18 are formed on the first wafer main surface 163.

In this step, first, a base terminal electrode layer that becomes a base of the plurality of terminals 13 to 18 is formed. The base terminal electrode layer contains an aluminum-silicon-copper alloy. The base terminal electrode layer may be formed by a sputter method.

Next, a mask (not shown) having a predetermined pattern is formed on the base terminal electrode layer. The mask covers regions at which the plurality of terminals 13 to 18 are to be formed respectively and has openings that expose regions besides these. Next, unnecessary portions of the base terminal electrode layer are removed by an etching method via the mask. The etching method may be a wet etching method. The plurality of terminals 13 to 18 are thereby formed. Thereafter, the mask is removed.

Figure 20R:
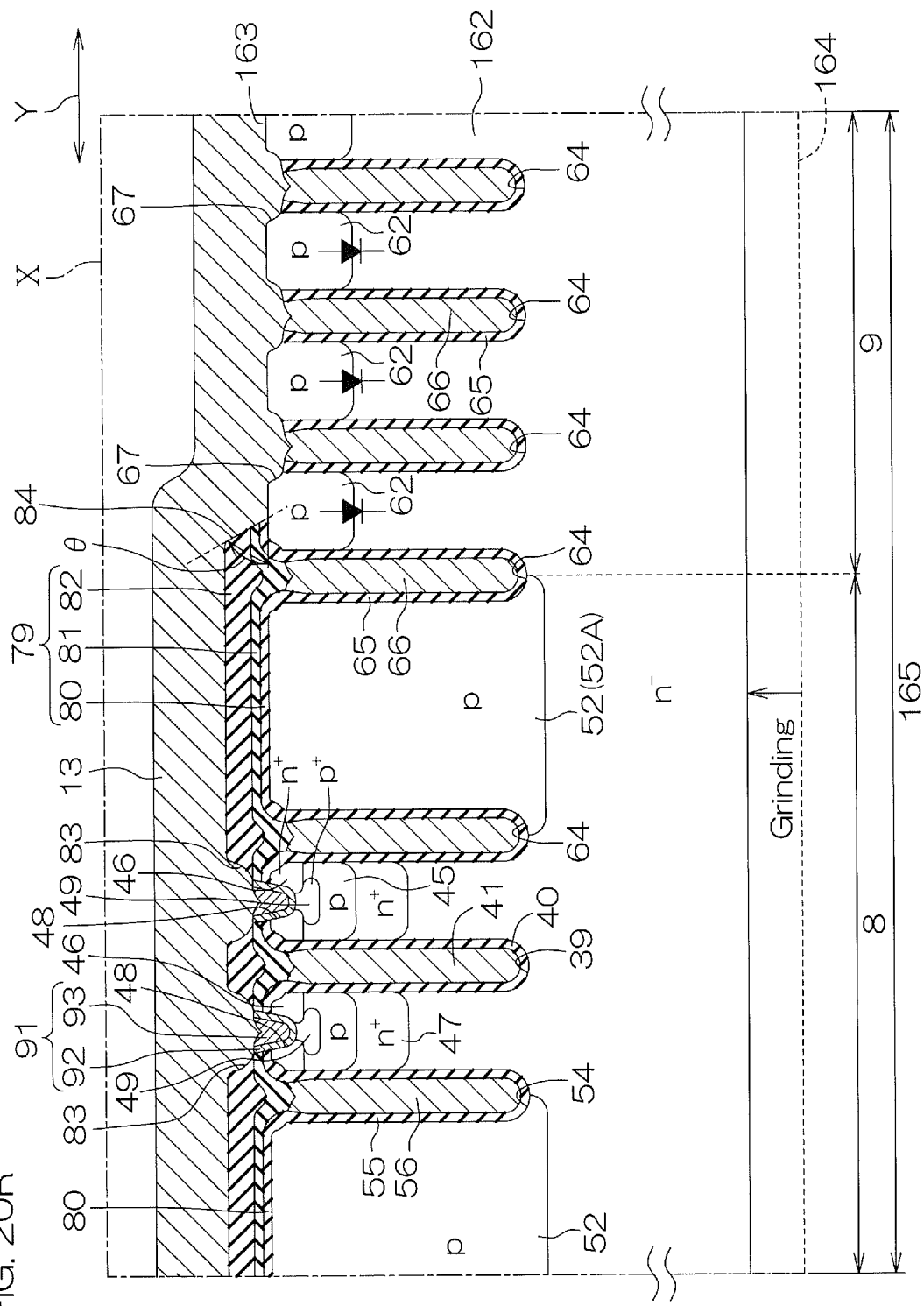
FIG. 20R is a sectional view of a step after that of FIG. 20Q.

Next, referring to FIG. 20R, the semiconductor wafer 162 is thinned to a predetermined thickness. The thinning step includes a step of thinning the semiconductor wafer 162 by a grinding method performed on the second wafer main surface 164. The grinding method may be a CMP (chemical mechanical polishing) method.

The thinning step may include a step of thinning the semiconductor wafer 162 by an etching method performed on the second wafer main surface 164 instead of a grinding method. The etching method may be a wet etching method.

The thinning step may also include a step of thinning the semiconductor wafer 162 by a grinding method and an etching method performed on the second wafer main surface 164. The semiconductor wafer 162 may also be thinned by performing a grinding method and an etching method in that order. The semiconductor wafer 162 may also be thinned by performing an etching method and a grinding method in that order.

When just a grinding method is performed, the second wafer main surface 164 of the semiconductor wafer 162 becomes a ground surface having grinding marks. In this case, the second main surface 4 of the semiconductor layer 2 becomes a ground surface having grinding marks. The step of thinning the semiconductor wafer 162 is performed as needed and may be omitted.

Figure 20S:
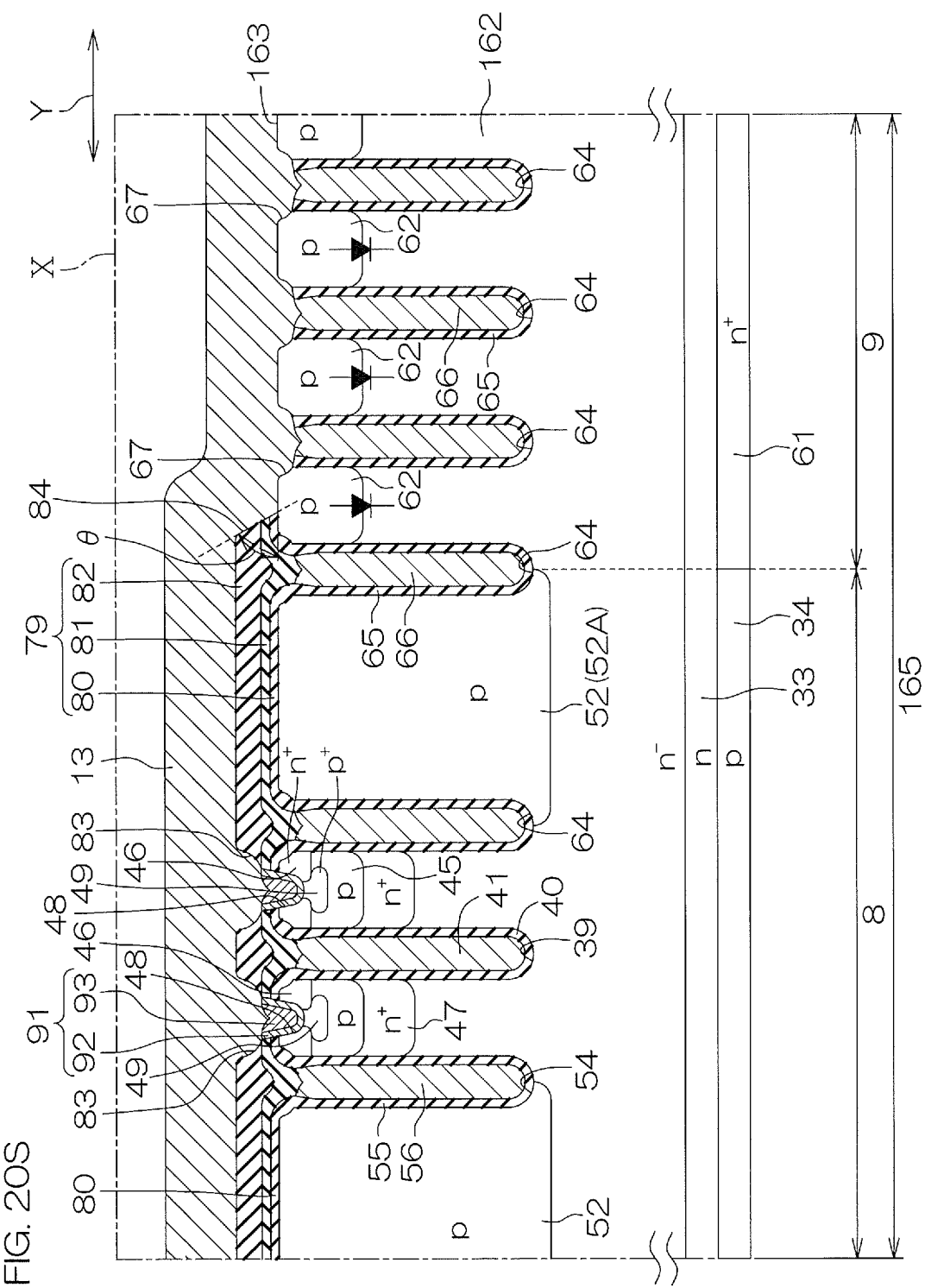
FIG. 20S is a sectional view of a step after that of FIG. 20R.

Next, referring to FIG. 20S, the n-type buffer layer 33 is formed in a surface layer portion of the second wafer main surface 164. In this step, an n-type impurity is introduced across an entirety of the second wafer main surface 164 of the semiconductor wafer 162. The n-type buffer layer 33 is thereby formed.

Next, the p-type collector region 34 is formed in a surface layer portion of the second wafer main surface 164. In this step, first, an ion introducing mask (not shown) having a predetermined pattern is formed on the second wafer main surface 164. The ion introducing mask has an opening that exposes a region in which the collector region 34 is to be formed. Next, a p-type impurity is introduced into the second wafer main surface 164 via the ion introducing mask. The collector region 34 is thereby formed. Thereafter, the ion introducing mask is removed.

Next, the plurality of $n^+$-type cathode regions 61 are formed in surface layer portions of the second wafer main surface 164. In this step, first, an ion introducing mask (not shown) having a predetermined pattern is formed on the second wafer main surface 164. The ion introducing mask has a plurality of openings that respectively expose regions in which the plurality of cathode regions 61 are to be formed. Next, an n-type impurity is introduced into the second wafer main surface 164 via the ion introducing mask. The plurality of cathode regions 61 are thereby formed. Thereafter, the ion introducing mask is removed.

Next, referring to FIG. 20T, the collector terminal electrode 32 is formed on the second wafer main surface 164. The collector terminal electrode 32 may include at least one among a Ti layer, an Ni layer, an Au layer, an Ag layer, and an Al layer. The collector terminal electrode 32 may be formed by a sputter method. Thereafter, the semiconductor wafer 162 is cut along the peripheral edges of each device forming region 165 to cut out a semiconductor device 1. The semiconductor device 1 is manufactured through steps including the above.

An annealing treatment may be performed on the second wafer main surface 164 after the step of thinning the semiconductor wafer 162 and before the step of forming the collector terminal electrode 32. The annealing treatment may be a laser annealing treatment. In this case, an Si amorphous layer may be formed in a surface layer portion of the second wafer main surface 164. In this case, a lattice defect region that includes lattice defects may be formed in a surface layer portion of the second wafer main surface 164.

An Si amorphous layer may be formed in a surface layer portion of the second main surface 4 of the semiconductor layer 2 that has been cut out from the semiconductor wafer 162. Also, a lattice defect region that includes lattice defects may be formed in a surface layer portion of the second main surface 4 of the semiconductor layer 2. By such a structure, an ohmic property of the collector terminal electrode 32 with respect to the second main surface 4 (the collector region 34 and the cathode regions 61) can be improved.

An order of the step of forming the carrier storage regions 47, the step of forming the body regions 45, the step of forming the anode regions 62, and the step of forming the emitter regions 46 is arbitrary and not restricted to the order of steps described above.

However, from a standpoint of suppressing undesirable diffusion due to heating, the regions are preferably formed in an order from those introduced deeply in the semiconductor wafer 162. That is, it is preferable to form the carrier storage regions 47 that are formed in the deepest regions first and to form the emitter regions 46 that are formed in the shallowest regions last. In this case, undesirable diffusion of the body regions 45, the emitter regions 46, the carrier storage regions 47, and the anode regions 62 can be suppressed.

Also, the step of forming the buffer layer 33, the step of forming the cathode regions 61, and the step of forming the collector region 34 is arbitrary and not restricted to the order of steps described above. Also, the step of thinning the semiconductor wafer 162, the step of forming the buffer layer 33, the step of forming the cathode regions 61, and the step of forming the collector region 34 may be performed at any timing after the step of preparing the semiconductor wafer 162 and before the step of forming the plurality of terminals 13 to 18.

For example, the step of thinning the semiconductor wafer 162, the step of forming the buffer layer 33, the step of forming the cathode regions 61, and the step of forming the collector region 34 may be performed before the step of forming the floating regions 52.

However, from a standpoint of suppressing undesirable diffusion due to heating, the step of thinning the semiconductor wafer 162, the step of forming the buffer layer 33, the step of forming the cathode regions 61, and the step of forming the collector region 34 are preferably performed after the step of forming the body regions 45, the step of forming the emitter regions 46, the step of forming the carrier storage regions 47, and the step of forming the anode regions 62.

Figure 21:
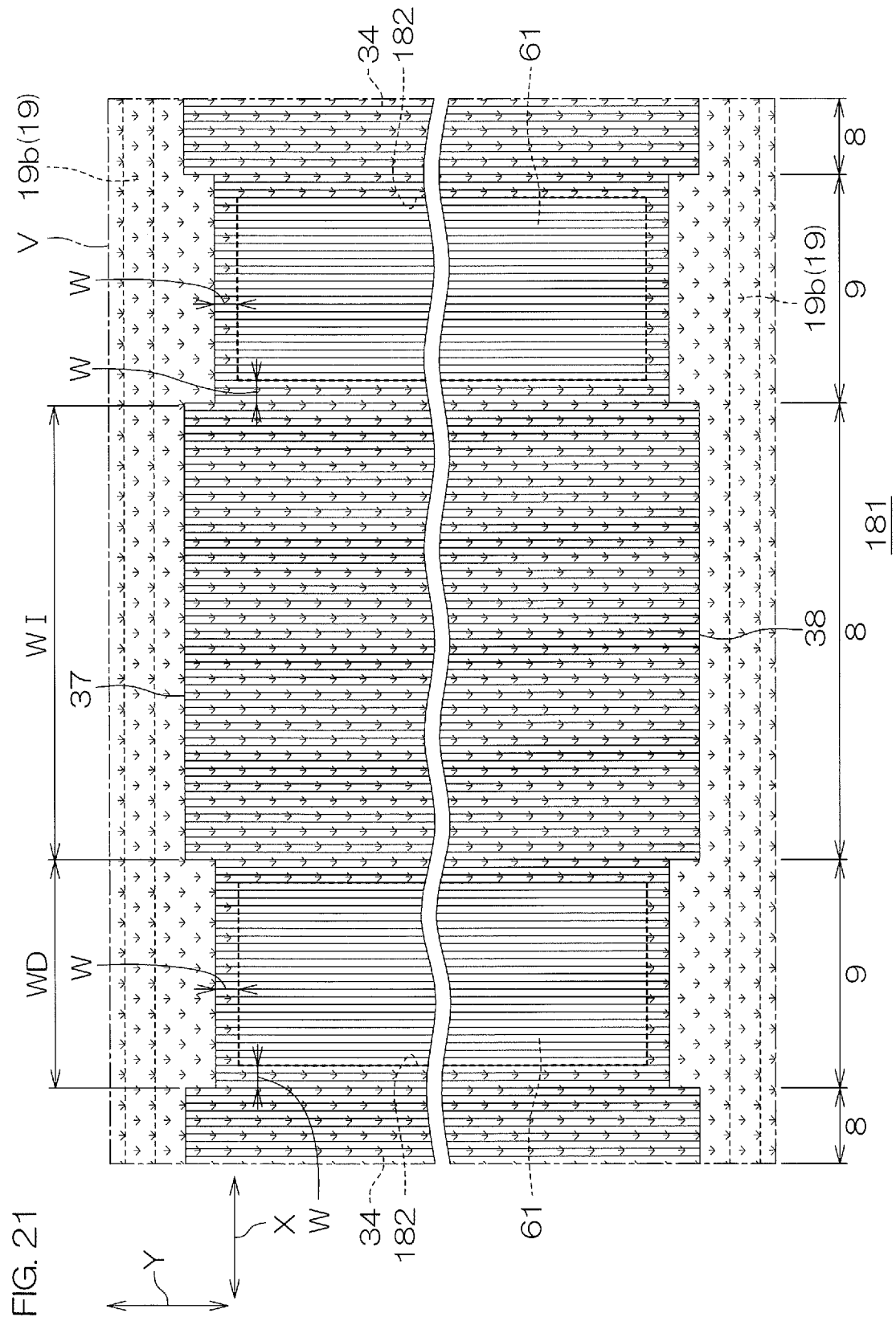
FIG. 21 is an enlarged view of a region corresponding to FIG. 5 and is an enlarged view of a semiconductor device according to a second preferred embodiment of the present invention.
Figure 22:
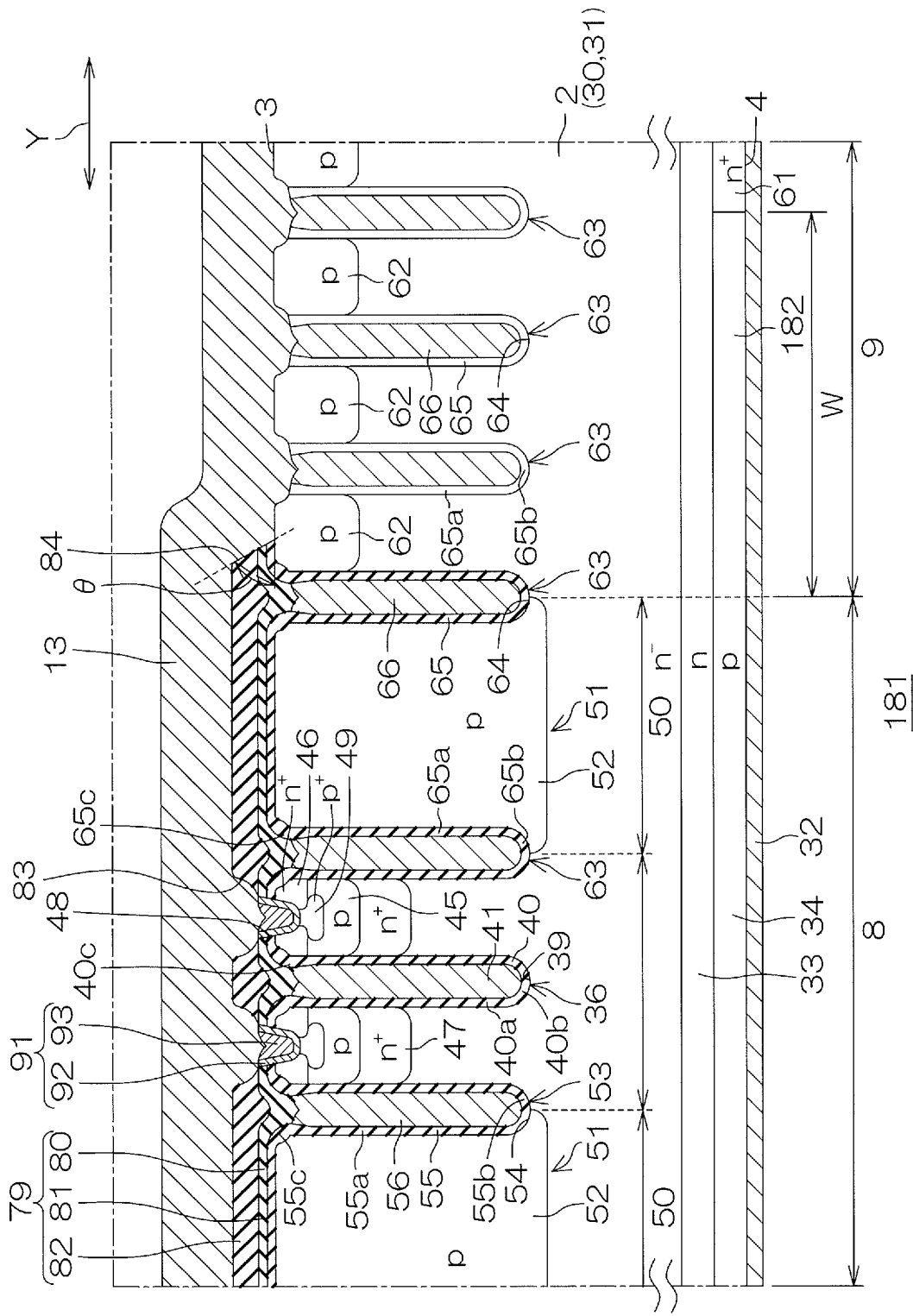
FIG. 22 is a sectional view of a region corresponding to FIG. 10 and is a sectional view for describing the structure of the semiconductor device shown in FIG. 21.

FIG. 21 is an enlarged view of a region corresponding to FIG. 5 and is an enlarged view of a semiconductor device 181 according to a second preferred embodiment of the present invention. FIG. 22 is a sectional view of a region corresponding to FIG. 10 and is a sectional view for describing the structure of the semiconductor device 181 shown in FIG. 21.

In the following, structures corresponding to structures described for the semiconductor device 1 shall be provided with the same reference signs and description thereof shall be omitted. In FIG. 21, a region in which the collector region 34 is formed is shown with dotted hatching.

Referring to FIG. 21 and FIG. 22, in this embodiment, the collector region 34 includes lead-out regions 182. The lead-out regions 182 cross the boundaries between the IGBT regions 8 and the diode regions 9 and are led out to peripheral edges of the diode regions 9. The lead-out regions 182 are led out from the IGBT regions 8 to the diode regions 9 along the first direction X.

In this embodiment, the lead-out regions 182 are formed as bands along the peripheral edges of the diode regions 9 in plan view. Specifically, the lead-out regions 182 are formed to annular shapes (endless shapes in this embodiment) that surround inner regions of the diode regions 9 in plan view. The lead-out regions 182 are thereby led out from the IGBT regions 8 to the diode regions 9 along the first direction X and the second direction Y.

The lead-out regions 182 overlap with the diode regions 9 over a predetermined overlap width W in plan view. Starting points of the overlap width W are set at the boundaries between the IGBT regions 8 and the diode regions 9. In this embodiment, the starting points of the overlap width W are set at central portions of anode separating trenches 64 that are most proximate to the IGBT regions 8 and contact the anode regions 62. End points of the overlap width W are set at boundaries between the lead-out regions 182 and the cathode regions 61.

A ratio W/WD of the overlap width W with the width WD of the diode regions may be not less than 0.001 and not more than 0.5. The ratio W/WD may be not less than 0.001 and not more than 0.01, not less than 0.01 and not more than 0.05, not less than 0.05 and not more than 0.1, not less than 0.1 and not more than 0.15, not less than 0.15 and not more than 0.2, not less than 0.2 and not more than 0.25, not less than 0.25 and not more than 0.3, not less than 0.3 and not more than 0.35, not less than 0.35 and not more than 0.4, not less than 0.4 and not more than 0.45, or not less than 0.45 and not more than 0.5.

The overlap width W may be not less than 1 μm and not more than 200 μm. The overlap width W may be not less than 1 μm and not more than 50 μm, not less than 50 μm and not more than 100 μm, not less than 100 μm and not more than 150 μm, or not less than 150 μm and not more than 200 μm.

The overlap width W may be not less than 1 μm and not more than 20 μm, not less than 20 μm and not more than 40 μm, not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm. The overlap width W is preferably not less than 10 μm and not more than 150 μm.

Each lead-out region 182 may oppose one or a plurality of anode regions 62 in regard to the normal direction Z. The lead-out region 182 may oppose, 1, 2, 3, 4, 5, 6, 7, 8, 9, 10, 11, 12, 13, 14, 15, 16, 17, 18, 19, or 20 anode regions 62. The lead-out region 182 preferably opposes not less than 1 and not more than 10 anode regions 62.

Each lead-out region 182 may oppose one or a plurality of anode separating trenches 64 in regard to the normal direction Z. The lead-out region 182 may oppose, 1, 2, 3, 4, 5, 6, 7, 8, 9, 10, 11, 12, 13, 14, 15, 16, 17, 18, 19, or 20 anode separating trenches 64. The lead-out region 182 preferably opposes not less than 1 and not more than 10 anode separating trenches 64.

Figure 23:
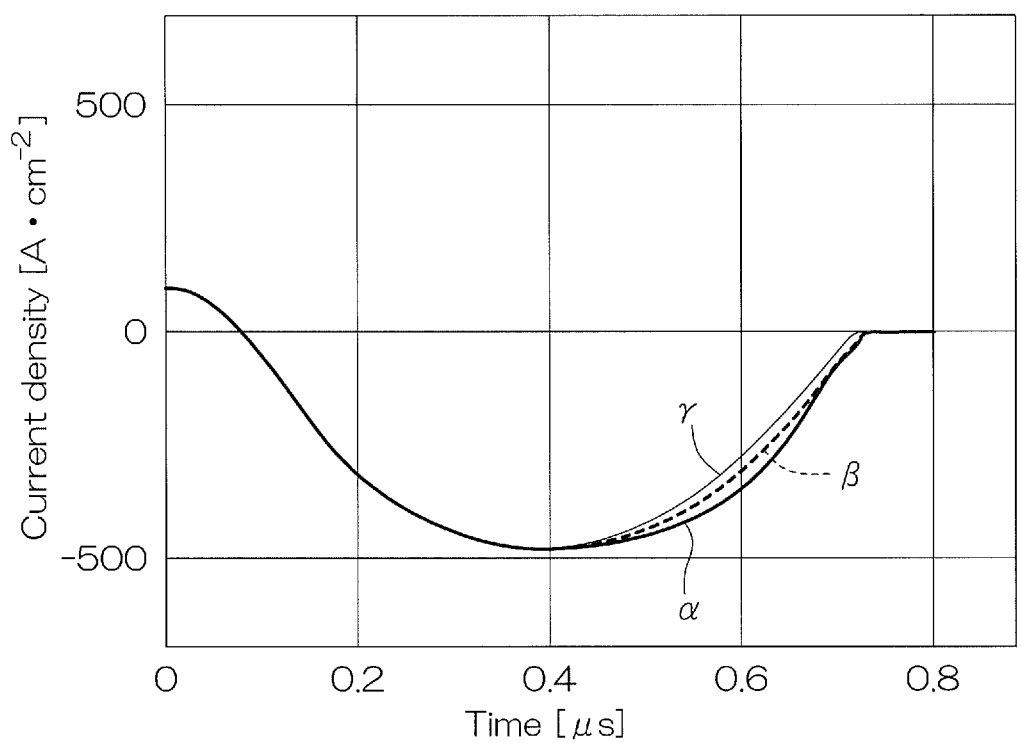
FIG. 23 is a graph of results of examining reverse recovery characteristics of pn-junction diodes by a simulation.

FIG. 23 is a graph of results of examining reverse recovery characteristics of pn-junction diodes by a simulation. In FIG. 23, the ordinate indicates current density [A·cm$^{-3}$] and the abscissa indicates time [μs].

First characteristics α, second characteristics β, and third characteristics γ are shown in FIG. 23. The first characteristics α represent reverse recovery current characteristics of a pn-junction diode in a case where the overlap width W is set to 0 μm. The second characteristics β represent reverse recovery current characteristics of a pn-junction diode in a case where the overlap width W is set to 100 μm. The third characteristics γ represent reverse recovery current characteristics of a pn-junction diode in a case where the overlap width W is set to 150 μm.

Referring to the first characteristics a, the second characteristics and the third characteristics γ, it was found that a reverse recovery current of a pn-junction diode is reduced and a reverse recovery time of the pn-junction diode is shortened by increasing the overlap width W. That is, it was found that the recovery loss Err can be reduced by increasing the overlap width W. However, if the overlap width W is increased too much, the cathode regions 61 are eliminated and diode characteristics are lost and therefore, the overlap width W is preferably not less than 1 μm and not more than 200 μm.

Figure 24:
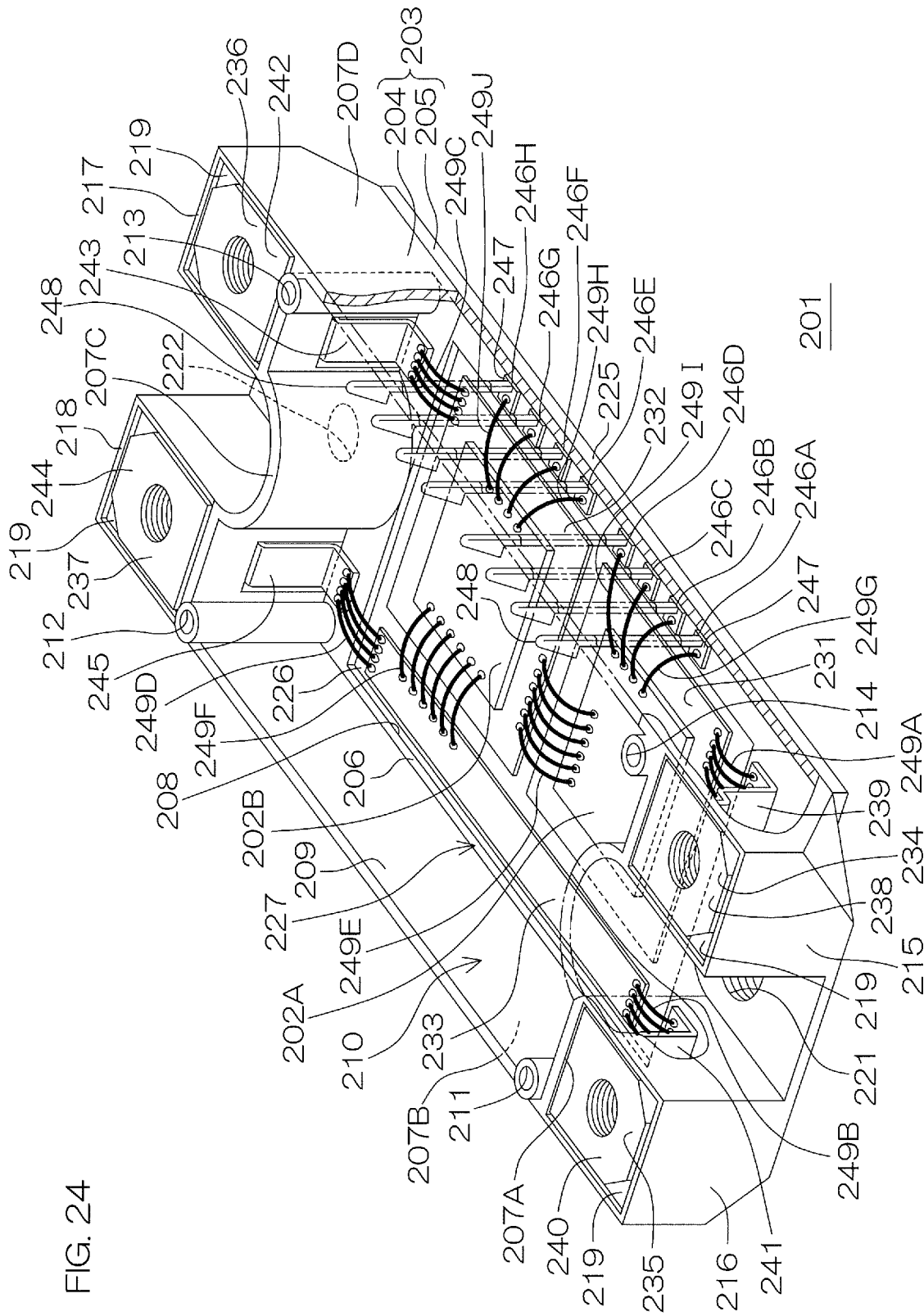
FIG. 24 is a perspective view of a configuration example of a semiconductor module.

FIG. 24 is a perspective view of a configuration example of a semiconductor module 201. One or two or more semiconductor chips 202 are incorporated in the semiconductor module 201.

In this embodiment, the semiconductor module 201 has a structure in which two semiconductor chips 202 are incorporated. In the following, the two semiconductor chips 202 shall be referred to respectively as the first semiconductor chip 202A and the second semiconductor chip 202B for convenience.

The semiconductor device 1 according to the first preferred embodiment or the semiconductor device 181 according to the second preferred embodiment is applied as the first semiconductor chip 202A. The semiconductor device 1 according to the first preferred embodiment or the semiconductor device 181 according to the second preferred embodiment is applied as the second semiconductor chip 202B.

Referring to FIG. 24, the semiconductor module 201 includes a housing 203 that houses the first semiconductor chip 202A and the second semiconductor chip 202B. The housing 203 includes a resin case 204 and a supporting substrate 205. The supporting substrate 205 is a substrate that supports the first semiconductor chip 202A and the second semiconductor chip 202B.

The resin case 204 includes a bottom wall 206 and side walls 207A, 207B, 207C, and 207D. The bottom wall 206 is formed to a quadrilateral shape (a rectangular shape in this embodiment) in a plan view as viewed from a normal direction thereof.

A penetrating hole 208 is formed in the bottom wall 206. The penetrating hole 208 is formed in a region at an interval toward an internal region from peripheral edges of the bottom wall 206. In this embodiment, the penetrating hole 208 is formed to a quadrilateral shape (a rectangular shape in this embodiment) in plan view.

The side walls 207A to 207D are erected from the peripheral edges of the bottom wall 206 toward an opposite side to the bottom wall 206. The side walls 207A to 207D demarcate an opening 209 at the opposite side to the bottom wall 206. The side walls 207A to 207D demarcate an internal space 210 with the bottom wall 206.

The side wall 207A and the side wall 207C extend along a short direction of the bottom wall 206. The side wall 207A and the side wall 207C oppose each other in a long direction of the bottom wall 206. The side wall 207B and the side wall 207D extend along the long direction of the bottom wall 206. The side wall 207B and the side wall 207D oppose each other in the short direction of the bottom wall 206.

Bolt insertion holes 211, 212, 213, and 214 are respectively formed at four corner portions of the internal space 210. The internal space 210 is closed by an unillustrated lid member. The lid member is bolted to the bolt insertion holes 211, 212, 213, and 214 by bolts.

The resin case 204 includes a plurality of terminal supporting portions 215, 216, 217, and 218. In this embodiment, the plurality of terminal supporting portions 215 to 218 include a first terminal supporting portion 215, a second terminal supporting portion 216, a third terminal supporting portion 217, and a fourth terminal supporting portion 218.

The first terminal supporting portion 215 and the second terminal supporting portion 216 are mounted on the side wall 207A. In this embodiment, the first terminal supporting portion 215 and the second terminal supporting portion 216 are formed integral to the outer wall of the side wall 207A.

The first terminal supporting portion 215 and the second terminal supporting portion 216 are formed at an interval from each other in the short direction. The first terminal supporting portion 215 and the second terminal supporting portion 216 are respectively formed to block shapes. The first terminal supporting portion 215 and the second terminal supporting portion 216 respectively project outward in the long direction from the outer wall of the side wall 207A.

The third terminal supporting portion 217 and the fourth terminal supporting portion 218 are mounted on an outer wall of the side wall 207C. In this embodiment, the third terminal supporting portion 217 and the fourth terminal supporting portion 218 are formed integral to the outer wall of the side wall 207C.

The third terminal supporting portion 217 and the fourth terminal supporting portion 218 are formed at an interval from each other in the short direction. The third terminal supporting portion 217 and the fourth terminal supporting portion 218 are respectively formed to block shapes. The third terminal supporting portion 217 and the fourth terminal supporting portion 218 respectively project outward in the long direction from the side wall 207C.

The first terminal supporting portion 215, the second terminal supporting portion 216, the third terminal supporting portion 217, and the fourth terminal supporting portion 218 each have a supporting wall 219. Each supporting wall 219 is positioned in a region closer to the opening 209 side than the bottom wall 206. Each supporting wall 219 is formed to a quadrilateral shape in plan view.

A first bolt insertion hole 221 is formed in a region between the first terminal supporting portion 215 and the second terminal supporting portion 216. A second bolt insertion hole 222 is formed in a region between the third terminal supporting portion 217 and the fourth terminal supporting portion 218.

The supporting substrate 205 include a heat dissipation plate 225, an insulator 226, and a circuit portion 227. The supporting substrate 205 is mounted to an outer surface of the resin case 204 such that the circuit portion 227 is exposed from the penetrating hole 208 of the bottom wall 206. The supporting substrate 205 may be mounted to the outer surface of the resin case 204 by the heat dissipation plate 225 being adhered to the outer surface of the resin case 204.

The heat dissipation plate 225 may be a metal plate. The heat dissipation plate 225 may be an insulating plate covered by a metal film. The heat dissipation plate 225 is formed to a quadrilateral shape (a rectangular shape in this embodiment) in a plan view as viewed from a normal direction thereof.

The insulator 226 is formed on the heat dissipation plate 225. The insulator 226 may be a mounting substrate that contains an insulating material. The insulator 226 may be an insulating film formed as a film on the heat dissipation plate 225.

The circuit portion 227 is formed on the heat dissipation plate 225 via the insulator 226. The circuit portion 227 includes a plurality of wirings 231, 232, and 233, the first semiconductor chip 202A, and the second semiconductor chip 202B. In this embodiment, the wirings 231 to 233 include a first collector wiring 231, a second collector wiring 232, and an emitter wiring 233.

The first collector wiring 231 is formed as a plate or a film. The first collector wiring 231 is formed to a quadrilateral shape in plan view. The first collector wiring 231 is arranged in a region at one side in a long direction (side wall 207A side) and one side in a short direction (side wall 207D side) of the heat dissipation plate 225.

The second collector wiring 232 is formed as a plate or a film. The second collector wiring 232 is formed to a quadrilateral shape in plan view. The second collector wiring 232 is arranged at an interval from the first collector wiring 231 in a region at another side in the long direction (side wall 207C side) and the one side in the short direction (side wall 207D side) of the heat dissipation plate 225.

The emitter wiring 233 is formed as a plate or a film. The emitter wiring 233 is formed to a quadrilateral shape in plan view. In this embodiment, the emitter wiring 233 is formed to a rectangular shape extending along the long direction of the heat dissipation plate 225.

The emitter wiring 233 is arranged at intervals from the first collector wiring 231 and the second collector wiring 232 in a region at another side in the short direction (side wall 207B side) of the heat dissipation plate 225.

The first semiconductor chip 202A is arranged on the first collector wiring 231 in an orientation in which the collector terminal electrode 32 opposes the heat dissipation plate. The collector terminal electrode 32 of the first semiconductor chip 202A is bonded via a conductive bonding material to the first collector wiring 231.

The collector terminal electrode 32 of the first semiconductor chip 202A is thereby electrically connected to the first collector wiring 231. The conductive bonding material may contain solder or a conductive paste.

The second semiconductor chip 202B is arranged on the second collector wiring 232 in an orientation in which the collector terminal electrode 32 opposes the heat dissipation plate. The collector terminal electrode 32 of the second semiconductor chip 202B is bonded via a conductive bonding material to the second collector wiring 232.

The collector terminal electrode 32 of the second semiconductor chip 202B is thereby electrically connected to the second collector wiring 232. The conductive bonding material may contain solder or a conductive paste.

The semiconductor module 201 includes a plurality of terminal 234, 235, 236, and 237. The plurality of terminals 234 to 237 include a collector terminal 234, a first emitter terminal 235, a common terminal 236, and a second emitter terminal 237.

The collector terminal 234 is arranged at the first terminal supporting portion 215. The collector terminal 234 is electrically connected to the first collector wiring 231. The collector terminal 234 includes a first region 238 and a second region 239. The first region 238 of the collector terminal 234 is positioned outside the internal space 210. The second region 239 of the collector terminal 234 is positioned inside the internal space 210.

The first region 238 of the collector terminal 234 is supported by the supporting wall 219 of the first terminal supporting portion 215. The second region 239 of the collector terminal 234 penetrates through the side wall 207A from the first region 238 and is led out into the internal space 210. The second region 239 of the collector terminal 234 is electrically connected to the first collector wiring 231.

The first emitter terminal 235 is arranged at the second terminal supporting portion 216. The first emitter terminal 235 is electrically connected to the emitter wiring 233. The first emitter terminal 235 includes a first region 240 and a second region 241. The first region 240 of the first emitter terminal 235 is positioned outside the internal space 210. The second region 241 of the first emitter terminal 235 is positioned inside the internal space 210.

The first region 240 of the first emitter terminal 235 is supported by the supporting wall 219 of the second terminal supporting portion 216. The second region 241 of the first emitter terminal 235 penetrates through the side wall 207A from the first region 240 and is led out into the internal space 210. The second region 241 of the first emitter terminal 235 is electrically connected to the emitter wiring 233.

The common terminal 236 is arranged at the third terminal supporting portion 217. The common terminal 236 is electrically connected to the second collector wiring 232. The common terminal 236 includes a first region 242 and a second region 243. The first region 242 of the common terminal 236 is positioned outside the internal space 210. The second region 243 of the common terminal 236 is positioned inside the internal space 210.

The first region 242 of the common terminal 236 is supported by the supporting wall 219 of the second terminal supporting portion 216. The second region 243 of the common terminal 236 penetrates through the side wall 207C from the first region 240 and is led out into the internal space 210. The second region 243 of the common terminal 236 is electrically connected to the second collector wiring 232.

The second emitter terminal 237 is arranged at the fourth terminal supporting portion 218. The second emitter terminal 237 is electrically connected to the emitter wiring 233. The second emitter terminal 237 includes a first region 244 and a second region 245. The first region 244 of the second emitter terminal 237 is positioned outside the internal space 210. The second region 245 of the second emitter terminal 237 is positioned inside the internal space 210.

The first region 244 of the second emitter terminal 237 is supported by the supporting wall 219 of the fourth terminal supporting portion 218. The second region 245 of the second emitter terminal 237 penetrates through the side wall 207C from the first region 244 and is led out into the internal space 210. The second region 245 of the second emitter terminal 237 is electrically connected to the emitter wiring 233.

The semiconductor module 201 includes a plurality (six in this embodiment) of side wall terminals 246A to 246H. The plurality of side wall terminals 246A to 246H are arranged at intervals along the side wall 207D in the internal space 210.

The plurality of side wall terminals 246A to 246H each include an internal connection portion 247 and an external connection portion 248. The internal connection portions 247 are arranged on the bottom wall 206. The external connection portions 248 extend as lines from the internal connection portions 247 along the side wall 207D and are led out outside the internal space 210.

The plurality of side wall terminals 246A to 246H include three side wall terminals 246A to 246D for the first semiconductor chip 202A and three side wall terminals 246E to 246H for the second semiconductor chip 202B.

The side wall terminals 246A to 246D oppose the first collector wiring 231 along the short direction. The side wall terminal 246A is formed as a gate terminal connected to the gate terminal electrode 14 of the first semiconductor chip 202A.

The side wall terminals 246B to 246D are respectively formed as terminals connected to the first sense terminal electrode 15, the second sense terminal electrode 16, and the current detection terminal electrode 17 of the first semiconductor chip 202A. At least one of the side wall terminals 246B to 246D may be an open terminal.

The side wall terminals 246E to 246H oppose the second collector wiring 232 along the short direction. The side wall terminal 246E is formed as a gate terminal connected to the gate terminal electrode 14 of the second semiconductor chip 202B.

The side wall terminals 246F to 246H are respectively formed as terminals connected to the first sense terminal electrode 15, the second sense terminal electrode 16, and the current detection terminal electrode 17 of the second semiconductor chip 202B. At least one of the side wall terminals 246F to 246H may be an open terminal.

The semiconductor module 201 includes a plurality of lead wires 249A to 249J. The plurality of lead wires 249A to 249J may each contain at least one type of material among gold, silver, copper, and aluminum. The lead wires 249A to 249J may each include a bonding wire. The lead wires 249A to 249J may each include a conductive plate.

The plurality of lead wires 249A to 249J include first lead wires 249A, second lead wires 249B, third lead wires 249C, fourth lead wires 249D, fifth lead wires 249E, sixth lead wires 249F, a seventh lead wire 249G, an eighth lead wire 249H, ninth lead wires 249I, and tenth lead wires 249J.

The first lead wires 249A connect the collector terminal 234 and the first collector wiring 231. The second lead wires 249B connect the first emitter terminal 235 and the emitter wiring 233. The third lead wires 249C connect the common terminal 236 and the second collector wiring 232.

The fourth lead wires 249D connect the second emitter terminal 237 and the emitter wiring 233. The fifth lead wires 249E connect the emitter terminal electrode 13 of the first semiconductor chip 202A and the second collector wiring 232. The sixth lead wires 249F connect the emitter terminal electrode 13 of the second semiconductor chip 202B and the emitter wiring 233.

The seventh lead wire 249G connects the gate terminal electrode 14 of the first semiconductor chip 202A and the side wall terminal 246A. The eighth lead wire 249H connects the gate terminal electrode 14 of the second semiconductor chip 202B and the side wall terminal 246E.

The ninth lead wires 249I connect the first sense terminal electrode 15, the second sense terminal electrode 16, and the current detection terminal electrode 17 of the first semiconductor chip 202A and the side wall terminals 246B to 246D.

The tenth lead wires 249J connect the first sense terminal electrode 15, the second sense terminal electrode 16, and the current detection terminal electrode 17 of the second semiconductor chip 202B and the side wall terminals 246F to 246H.

Figure 25:
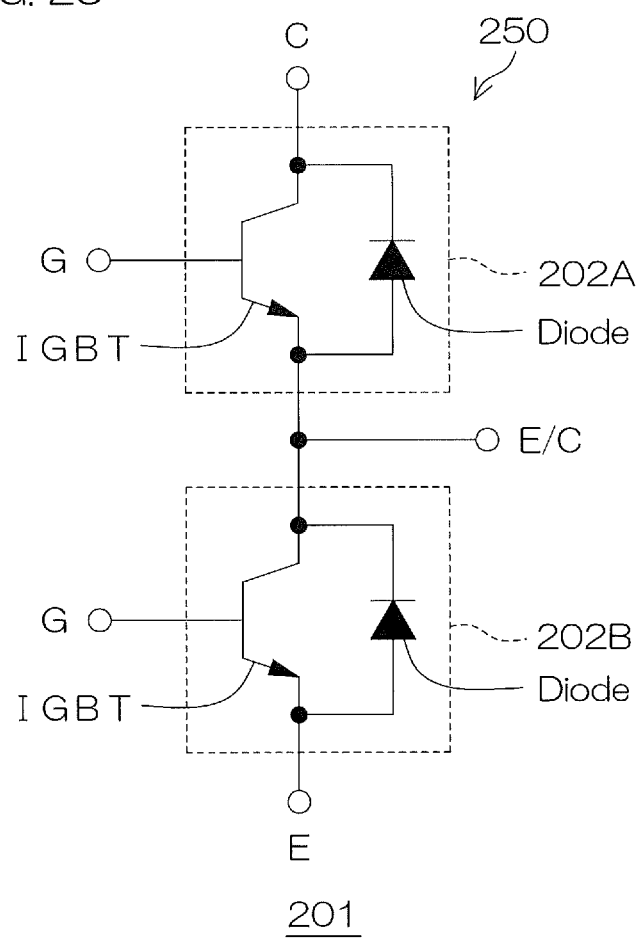
FIG. 25 is a circuit diagram of an electrical structure of the semiconductor module shown in FIG. 24.

FIG. 25 is a circuit diagram of the electrical structure of the semiconductor module 201 shown in FIG. 24.

Referring to FIG. 25, the semiconductor module 201 includes a half bridge circuit 250. The half bridge circuit 250 includes the first semiconductor chip 202A and the second semiconductor chip 202B.

The first semiconductor chip 202A constitutes a high voltage side arm of the half bridge circuit 250. The second semiconductor chip 202B constitutes a low voltage side arm of the half bridge circuit 250.

A gate terminal (the side wall terminal 246A) is connected to the gate terminal electrode 14 of the first semiconductor chip 202A. The collector terminal 234 is connected to the collector terminal electrode 32 of the first semiconductor chip 202A.

The collector terminal electrode 32 of the second semiconductor chip 202B is connected to the emitter terminal electrode 13 of the first semiconductor chip 202A. The common terminal 236 is connected to a connection portion of the emitter terminal electrode 13 of the first semiconductor chip 202A and the collector terminal electrode 32 of the second semiconductor chip 202B.

A gate terminal (the side wall terminal 246D) is connected to the gate terminal electrode 14 of the second semiconductor chip 202B. The first emitter terminal 235 (second emitter terminal 237) is connected to the emitter terminal electrode 13 of the second semiconductor chip 202B.

A gate driver IC, etc., may be connected via the gate terminal (side wall terminal 246A) to the gate terminal electrode 14 of the first semiconductor chip 202A. A gate driver IC, etc., may be connected via the gate terminal (side wall terminal 246D) to the gate terminal electrode 14 of the second semiconductor chip 202B.

The semiconductor module 201 may be an inverter module that drives any one phase among a U phase, a V phase, and a W phase in a three phase motor having the U phase, the V phase, and the W phase. An inverter device that drives the three phase motor may be arranged by three semiconductor modules 201 corresponding to the U phase, the V phase, and the W phase of the three phase motor.

In this case, a DC power supply is connected to the collector terminal 234 and the first emitter terminal 235 (second emitter terminal 237) of each semiconductor module 201. Also, any one phase among the U phase, the V phase, and the W phase of the three phase motor is connected as a load to the common terminal 236 of each semiconductor module 201.

With the inverter device, the first semiconductor chip 202A and the second semiconductor chip 202B are driven and controlled according to a predetermined switching pattern. A DC voltage is thereby converted to a three phase AC voltage and the three phase motor is driven sinusoidally.

The preferred embodiments of the present invention may be implemented in yet other embodiments.

With each of the preferred embodiments described above, the semiconductor layer 2 may have a laminated structure that includes a p-type semiconductor substrate in place of the n⁻-type semiconductor substrate 31 and an n⁻-type epitaxial layer formed on the semiconductor substrate. In this case, the p-type semiconductor substrate corresponds to the collector region 34. Also, the n⁻-type epitaxial layer corresponds to the drift region 30.

The p-type semiconductor substrate may be made of silicon. The n⁻-type epitaxial layer may be made of silicon. The n⁻-type epitaxial layer is formed by epitaxially growing silicon from a main surface of the p-type semiconductor substrate.

In each of the preferred embodiments described above, a structure with which the conductivity types of the respective semiconductor portions are inverted may be adopted. That is, a p-type portion may be formed to be of an n-type and an n-type portion may be formed to be of a p-type.

Examples of features extracted from this description and the drawings are indicated below.

[A1] A semiconductor device comprising: a semiconductor layer that has a first main surface at one side and a second main surface at another side; a drift region of a first conductivity type that is formed inside the semiconductor layer; a diode region that includes a first impurity region of a second conductivity type formed in a surface layer portion of the first main surface and a second impurity region of the first conductivity type formed in a surface layer portion of the second main surface; and an IGBT region that includes an FET structure including a body region of the second conductivity type formed in the first main surface, an emitter region of the first conductivity type formed in a surface layer portion of the body region, and a gate electrode layer opposing the body region and the emitter region via a gate insulating layer and a collector region of the second conductivity type formed in a surface layer portion of the second main surface and having a lead-out region led out to the diode region.

According to this semiconductor device, a density of carriers in a vicinity of a boundary between the IGBT region and the diode region can be reduced during reverse recovery operation of a diode. Retention of carriers in the vicinity of the boundary between the IGBT region and the diode region can thereby be suppressed and therefore a reverse recovery current can be suppressed. Consequently, reduction of recovery loss can be achieved.

[A2] The semiconductor device according to A1, wherein the lead-out region opposes the first impurity region in a normal direction to the first main surface.

[A3] The semiconductor device according to A1, wherein the diode region includes a plurality of the first impurity regions that are formed at intervals, and the lead-out region opposes at least one of the plurality of first impurity regions in the normal direction to the first main surface.

[A4] The semiconductor device according to any one of A1 to A3, wherein the diode region includes a trench that demarcates the first impurity region in the first main surface, and the lead-out region opposes the trench in a normal direction to the first main surface.

[A5] The semiconductor device according to A4, wherein the diode region includes a plurality of the trenches, and the lead-out region opposes at least one of the plurality of trenches in the normal direction to the first main surface.

[A6] The semiconductor device according to any one of A1 to A5, wherein an overlap width of the lead-out region with respect to the diode region is not less than 1 μm and not more than 200 μm in plan view.

[A7] The semiconductor device according to any one of A1 to A6, wherein the semiconductor layer includes an active region, a plurality of the diode regions are formed in the active region, a plurality of the IGBT regions are formed in the active region, and wherein, when a total extension of boundary lines between the plurality of diode regions and the plurality of IGBT regions is represented by L, a total area of the plurality of diode regions is represented by SD, and a dispersion degree of the plurality of diode regions with respect to the active region is defined by a formula $\text{Log}_e(L^2/SD)$, the dispersion degree is not less than 2 and not more than 15.

[A8] The semiconductor device according to any one of A1 to A7, further comprising: an insulating layer that covers the IGBT region on the first main surface, that has a diode opening exposing the diode region, and with which an angle that an inner wall of the diode opening forms with the first main surface inside a covering portion covering the first main surface is not less than 45° and not more than 90°; and a main surface electrode that enters into the diode opening from above the insulating layer and is electrically connected to the diode region.

[A9] The semiconductor device according to any one of A1 to A7, further comprising: an insulating layer that is formed on the first main surface and has a diode opening exposing the diode region; and a main surface electrode connected directly to the first impurity region inside the diode opening.

[A10] The semiconductor device according to A9, wherein the first impurity region has a second conductivity type impurity concentration less than a second conductivity type impurity concentration of the body region.

[A11] The semiconductor device according to A9 or A10, wherein an angle that an inner wall of the diode opening forms with the first main surface inside the insulating layer is not less than 45° and not more than 90°.

[B1] A semiconductor device comprising: a semiconductor layer that has a first main surface at one side and a second main surface at another side; an IGBT region that is formed in the semiconductor layer; a diode region formed in the semiconductor layer such as to be adjacent to the IGBT region; an insulating layer that covers the IGBT region on the first main surface, that has a diode opening exposing the diode region, and with which an angle that an inner wall of the diode opening forms with the first main surface inside a covering portion covering the first main surface is not less than 45° and not more than 90°; and a main surface electrode that enters into the diode opening from above the insulating layer and is electrically connected to the diode region.

When the angle θ of the inner wall of the diode opening is less than 45°, a thin film portion is formed in a portion of the insulating layer that covers the diode region. When the thin film portion is formed in the insulating layer, the main surface electrode opposes the first main surface across the thin film portion of the insulating layer. In this case, there is a possibility that as a consequence of electric field concentrating at the thin film portion of the insulating layer, dielectric breakdown tolerance decreases with the thin film portion of the insulating layer as a starting point.

Thus, in this semiconductor device, the inner wall of the diode opening is formed such that the angle θ of the inner wall of the diode opening is not less than 45° and not more than 90° to suppress the forming of the thin film portion in the insulating layer. Decrease in dielectric breakdown tolerance due to undesirable electric field concentration can thereby be suppressed.

[B2] The semiconductor device according to B1, further comprising: adrift region of a first conductivity type that is formed inside the semiconductor layer.

[B3] The semiconductor device according to B2, wherein the diode region includes a first impurity region of a second conductivity type formed in a surface layer portion of the first main surface, and a second impurity region of the first conductivity type formed in a surface layer portion of the second main surface

[B4] The semiconductor device according to B3, wherein the insulating layer includes a portion that covers the first impurity region.

[B5] The semiconductor device according to B3 or B4, wherein the diode region includes a diode region separating structure that demarcates the first impurity region in the first main surface.

[B6] The semiconductor device according to B5, wherein the insulating layer includes a portion that covers the diode region separating structure.

[B7] The semiconductor device according to B5 or B6, wherein the diode region separating structure includes a trench formed in the first main surface.

[B8] The semiconductor device according to any one of B2 to B7, wherein the IGBT region includes an FET structure that includes a body region of a second conductivity type formed in the first main surface, an emitter region of a first conductivity type formed in a surface layer portion of the body region, and a gate electrode layer opposing the body region and the emitter region via a gate insulating layer and a collector region of the second conductivity type formed in a surface layer portion of the second main surface.

[B9] The semiconductor device according to B8, further comprising: a plug electrode embedded in the insulating layer and electrically connected to the emitter region; and wherein the main surface electrode is electrically connected to the emitter region via the plug electrode on the insulating layer.

[B10] The semiconductor device according to B8 or B9, wherein the IGBT region includes a floating region of the second conductivity type that is adjacent to the FET structure in a surface layer portion of the first main surface and is formed to an electrically floated state.

[B11] The semiconductor device according to B10, wherein the IGBT region includes a plurality of the FET structures that are formed at intervals from each other and the floating region that is formed in a region of the surface layer portion of the first main surface between the plurality of the FET structures that are mutually adjacent.

[B12] The semiconductor device according to B10 or B11, wherein the IGBT region includes a region separating structure that demarcates the floating region from the FET structure in the first main surface.

[B13] The semiconductor device according to any one of B8 to B12, wherein the FET structure has a trench gate structure that includes a gate trench formed in the first main surface and the gate electrode layer that opposes the body region and the emitter region via the gate insulating layer inside the gate trench.

[B14] The semiconductor device according to any one of B1 to B13, further comprising: an RC-IGBT array that includes a plurality of the IGBT regions and a plurality of the diode regions arrayed alternately along one direction; and wherein the insulating layer has a plurality of the diode openings that respectively expose the plurality of diode regions.

[B15] The semiconductor device according to B14, wherein a plurality of the RC-IGBT arrays are formed at intervals from each other along an intersecting direction intersecting the one direction.

[B16] The semiconductor device according to B15, wherein the plurality of IGBT regions are arrayed in a matrix at intervals from each other along the one direction and the intersecting direction and the plurality of diode regions are arrayed in a matrix at intervals from each other along the one direction and the intersecting direction such as to be interposed in regions between two of the IGBT regions that are mutually adjacent in the one direction.

[B17] The semiconductor device according to any one of B1 to B16, wherein the IGBT region is formed to a quadrilateral shape in plan view and the diode region is formed to a quadrilateral shape in plan view.

[B18] The semiconductor device according to any one of B1 to B17, further comprising: a second main surface electrode that is formed on the second main surface and is electrically connected to the IGBT region and the diode region.

[C1] A semiconductor device comprising: a semiconductor layer that has a first main surface at one side and a second main surface at another side; a drift region of a first conductivity type that is formed inside the semiconductor layer; an IGBT region that includes an FET structure including a body region of a second conductivity type formed in the first main surface, an emitter region of the first conductivity type formed in a surface layer portion of the body region, and a gate electrode layer opposing the body region and the emitter region via a gate insulating layer and a collector region of the second conductivity type formed in a surface layer portion of the second main surface; a diode region that includes a first impurity region of the second conductivity type formed in a surface layer portion of the first main surface and having a second conductivity type impurity concentration less than a second conductivity type impurity concentration of the body region and a second impurity region of the first conductivity type formed in a surface layer portion of the second main surface; and a main surface electrode connected to the first impurity region on the first main surface. According to this semiconductor device, recovery loss can be suppressed.

[C2] The semiconductor device according to C1, wherein the main surface electrode is directly connected to the first impurity region. According to this semiconductor device, the recovery loss can be suppressed while suppressing increase in forward voltage.

[C3] The semiconductor device according to C1 or C2, further comprising: an insulating layer that is formed on the main surface and has a diode opening exposing the diode region; and wherein the main surface electrode is connected to the first impurity region inside the diode opening.

[C4] The semiconductor device according to C3, further comprising: a plug electrode embedded in the insulating layer and electrically connected to the emitter region; and wherein the main surface electrode enters into the diode opening from above the insulating layer and is electrically connected to the emitter region via the plug electrode on the insulating layer.

[C5] The semiconductor device according to C4, wherein the plug electrode has a laminated structure including a barrier electrode layer that contacts the insulating layer and a main electrode layer that is embedded in the insulating layer via the barrier electrode layer.

[C6] The semiconductor device according to C5, wherein the barrier electrode layer has a single layer structure that includes a titanium layer or a titanium nitride layer or a laminated structure that includes a titanium layer and a titanium nitride layer.

[C7] The semiconductor device according to C5 or C6, wherein the main electrode layer contains tungsten.

[C8] The semiconductor device according to any one of C4 to C7, wherein the FET structure includes an emitter trench that exposes the emitter region in the first main surface and the plug electrode penetrates through the insulating layer and is embedded in the emitter trench.

[C9] The semiconductor device according to C8, wherein the FET structure includes a contact region of the second conductivity type that is formed in a region of a surface layer portion of the body region along a bottom wall of the emitter trench and has a second conductivity type impurity concentration that exceeds the second conductivity type impurity concentration of the body region.

[C10] The semiconductor device according to C8 or C9, wherein the emitter trench penetrates through the emitter region.

[C11] The semiconductor device according to any one of C1 to C10, wherein the diode region is adjacent to the IGBT region.

[C12] The semiconductor device according to any one of C1 to C11, further comprising: an RC-IGBT array that includes a plurality of the IGBT regions and a plurality of the diode regions arrayed alternately along one direction.

[C13] The semiconductor device according to C12, wherein a plurality of the RC-IGBT arrays are formed at intervals from each other along an intersecting direction intersecting the one direction.

[C14] The semiconductor device according to C13, wherein the plurality of IGBT regions are arrayed in a matrix at intervals from each other along the one direction and the intersecting direction, and the plurality of diode regions are arrayed in a matrix at intervals from each other along the one direction and the intersecting direction such as to be interposed in regions between two of the IGBT regions that are mutually adjacent in the one direction.

[C15] The semiconductor device according to any one of C1 to C14, wherein the IGBT region is formed to a quadrilateral shape in plan view and the diode region is formed to a quadrilateral shape in plan view.

[C16] The semiconductor device according to any one of C1 to C15, wherein the FET structure has a trench gate structure that includes a gate trench formed in the first main surface and the gate electrode layer that opposes the body region and the emitter region via the gate insulating layer inside the gate trench.

[C17] The semiconductor device according to any one of C1 to C16, wherein the IGBT region includes a floating region of the second conductivity type that is adjacent to the FET structure in a surface layer portion of the first main surface and is formed to an electrically floated state.

[C18] The semiconductor device according to C17, wherein the IGBT region includes a plurality of the FET structures that are formed at intervals from each other and the floating region that is formed in a region of the surface layer portion of the first main surface between the plurality of the FET structures that are mutually adjacent.

[C19] The semiconductor device according to C17 or C18, wherein the IGBT region includes a region separating structure that demarcates the floating region from the FET structure in the first main surface.

[C20] The semiconductor device according to any one of C1 to C19, wherein the diode region includes a diode region separating structure that demarcates the first impurity region in the first main surface.

[C21] The semiconductor device according to any one of C1 to C20, wherein the main surface electrode contains at least one type of material among aluminum, copper, aluminum-silicon-copper alloy, aluminum-silicon alloy, and aluminum-copper alloy.

[C22] The semiconductor device according to any one of C1 to C21, further comprising: a second main surface electrode that is formed on the second main surface and is electrically connected to the collector region and the second impurity region.

[D1] A semiconductor device comprising: a semiconductor layer that has a main surface; a first RC-IGBT array that includes a first IGBT region and a first diode region that are arrayed mutually adjacently and is formed in the semiconductor layer; a second RC-IGBT array that includes a second IGBT region and a second diode region that are arrayed mutually adjacently and is formed in the semiconductor layer at an interval from the first RC-IGBT array; a temperature sensor that is formed at the semiconductor layer such as to be positioned in a region between the first RC-IGBT array and the second RC-IGBT array in plan view; a gate wiring formed in a region on the main surface between the first RC-IGBT array and the second RC-IGBT array and transmitting a gate signal to one of either or both of the first RC-IGBT and the second RC-IGBT; and a sensor wiring formed in the region on the main surface between the first RC-IGBT array and the second RC-IGBT array and transmitting a control signal for the temperature sensor.

According to this semiconductor device, reduction of wiring forming area can be achieved while increasing temperature detection precision by the temperature sensor. Reduction of a formable area for the RC-IGBT arrays can thereby be suppressed while increasing the temperature detection precision by the temperature sensor.

[D2] The semiconductor device according to D1, wherein the sensor wiring is formed such as to run in parallel to the gate wiring in the region between the first RC-IGBT array and the second RC-IGBT array.

[D3] The semiconductor device according to D1 or D2, wherein the sensor wiring includes a first sensor wiring connected to an end portion at one side of the temperature sensor and a second sensor wiring connected to an end portion at another side of the temperature sensor.

[D4] The semiconductor device according to D3, wherein the second sensor wiring is formed such as to run in parallel to the first sensor wiring in the region between the first RC-IGBT array and the second RC-IGBT array.

[D5] The semiconductor device according to any one of D1 to D4, wherein the first RC-IGBT array extends along one direction and the second RC-IGBT array extends along the one direction.

[D6] The semiconductor device according to any one of D1 to D5, wherein the first RC-IGBT array includes a plurality of the first IGBT regions and a plurality of the first diode regions that are arrayed alternately.

[D7] The semiconductor device according to any one of D1 to D6, wherein the second RC-IGBT array includes a plurality of the second IGBT regions and a plurality of the second diode regions that are arrayed alternately.

[D8] The semiconductor device according to any one of D1 to D7, wherein the semiconductor layer includes an active region and an outer region outside the active region, and the first RC-IGBT array, the second RC-IGBT array and the temperature sensor are formed in the active region.

[D9] The semiconductor device according to any one of D1 to D8, further comprising: a gate terminal electrode that is formed on the main surface in the outer region and is electrically connected to the gate wiring; and a sensor terminal electrode that is formed on the main surface in the outer region at an interval from the gate terminal electrode and is electrically connected to the sensor wiring.

[A1] to [A11] described above, [B1] to [B18] described above, [C1] to [22] described above, and [D1] to [D9] described above may be combined in any mode thereamong.

The present application corresponds to Japanese Patent Application No. 2018-196511 filed on Oct. 18, 2018 in the Japan Patent Office, and the entire disclosure of this application is incorporated herein by reference. While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST 1 semiconductor device
2 semiconductor layer
3 first main surface
4 second main surface
6 active region
8 IGBT region
9 diode region
12 RC-IGBT array
13 emitter terminal electrode
30 drift region
32 collector terminal electrode
34 collector region
35 FET structure
36 trench gate structure
39 gate trench
40 gate insulating layer
41 gate electrode layer
45 body region
46 emitter region
52 floating region
53 region separating trench structure
61 cathode region
62 anode region
79 interlayer insulating layer
84 diode opening
91 emitter plug electrode
181 semiconductor device
D dispersion degree
L total extension
SA area of active region
SD area of diode regions
SI area of IGBT regions
θ angle of internal wall of diode opening
X first direction
Y second direction

The invention claimed is:

1. A semiconductor device comprising:
a semiconductor layer that has a first main surface at one side and a second main surface at another side and includes an active region;
a plurality of IGBT regions that are formed in the active region; and
a plurality of diode regions that are formed in the active region such as to be mutually adjacent to the plurality of IGBT regions; and
wherein when a total extension of boundary lines between the plurality of IGBT regions and the plurality of diode regions is represented by L, a total area of the plurality of diode regions is represented by SD, and a dispersion degree of the plurality of diode regions with respect to the active region is defined by a formula $\mathrm{Log}_e(L^2 SD)$, the dispersion degree is not less than 2 and not more than 15.

2. The semiconductor device according to claim 1, wherein a ratio of a total area of the plurality of diode regions with respect to an area of the active region is not more than a ratio of a total area of the plurality of IGBT regions with respect to the area of the active region.

3. The semiconductor device according to claim 1, wherein a ratio of a total area of the plurality of IGBT regions with respect to an area of the active region is not more than 0.4.

4. The semiconductor device according to claim 1, wherein the dispersion degree is not less than 2 and not more than 7.

5. The semiconductor device according to claim 1, wherein the dispersion degree is not less than 7 and not more than 12.

6. The semiconductor device according to claim 1, further comprising:
an RC-IGBT array that includes the plurality of IGBT regions and the plurality of diode regions arrayed alternately along one direction.

7. The semiconductor device according to claim 6, wherein a plurality of the RC-IGBT arrays are formed at intervals from each other along an intersecting direction intersecting the one direction.

8. The semiconductor device according to claim 7, wherein the plurality of IGBT regions are arrayed in a matrix at intervals from each other along the one direction and the intersecting direction, and
the plurality of diode regions are arrayed in a matrix at intervals from each other along the one direction and the intersecting direction such as to be interposed in regions between two of the IGBT regions that are mutually adjacent in the one direction.

9. The semiconductor device according to claim 1,
wherein the plurality of IGBT regions are formed to quadrilateral shapes in plan view, and
the plurality of diode regions are formed to quadrilateral shapes in plan view.

10. The semiconductor device according to claim 1, further comprising:
a drift region of a first conductivity type that is formed inside the semiconductor layer; and
wherein the plurality of IGBT regions each include an FET structure including a body region of a second conductivity type formed in the first main surface, an emitter region of the first conductivity type formed in a surface layer portion of the body region, and a gate electrode layer opposing the body region and the emitter region via a gate insulating layer and a collector region of the second conductivity type formed in a surface layer portion of the second main surface, and
the plurality of diode regions each include a first impurity region of the second conductivity type formed in a surface layer portion of the first main surface and a second impurity region of the first conductivity type formed in a surface layer portion of the second main surface.

11. The semiconductor device according to claim 10,
wherein the first impurity region has a second conductivity type impurity concentration less than a second conductivity type impurity concentration of the body region.

12. The semiconductor device according to claim 10, further comprising:
a first main surface electrode formed on the first main surface and electrically connected to the emitter regions and the first impurity regions.

13. The semiconductor device according to claim 12, further comprising:
an insulating layer that covers the plurality of IGBT regions respectively on the first main surface and has a plurality of diode openings respectively exposing the plurality of diode regions; and
wherein the first main surface electrode is electrically connected to the first impurity regions inside the plurality of diode openings.

14. The semiconductor device according to claim 13, further comprising:
a plug electrode that is embedded in the insulating layer and is electrically connected to the emitter region; and
wherein the first main surface electrode is electrically connected to the emitter region via the plug electrode on the insulating layer.

15. The semiconductor device according to claim 13,
wherein an angle that an inner wall of each of the diode openings forms with the first main surface inside the insulating layer is not less than 45° and not more than 90°.

16. The semiconductor device according to claim 12,
wherein the first main surface electrode is directly connected to the first impurity regions.

17. The semiconductor device according to claim 10, further comprising:
a second main surface electrode that is formed on the second main surface and is electrically connected to the collector regions and the second impurity regions.

18. The semiconductor device according to claim 10,
wherein each IGBT region includes a floating region of the second conductivity type that is adjacent to the FET structure in a surface layer portion of the first main surface and is formed to an electrically floated state.

19. The semiconductor device according to claim 18,
wherein each IGBT region includes a plurality of the FET structures that are formed at intervals from each other and the floating region that is formed in a region of the surface layer portion of the first main surface between the plurality of the FET structures that are mutually adjacent.

20. The semiconductor device according to claim 18,
wherein each IGBT region includes a region separating structure that demarcates the floating region from the FET structure in the first main surface.

* * * * *